United States Patent
Hsu et al.

(10) Patent No.: US 10,957,648 B2
(45) Date of Patent: Mar. 23, 2021

(54) THREE-DIMENSIONAL MEMORY DEVICE CONTAINING CONTACT VIA STRUCTURE EXTENDING THROUGH SOURCE CONTACT LAYER AND DIELECTRIC SPACER ASSEMBLY

(71) Applicant: SANDISK TECHNOLOGIES LLC, Addison, TX (US)

(72) Inventors: Yu-Hsien Hsu, Yokkaichi (JP); Satoshi Shimizu, Yokkaichi (JP); Shunsuke Akimoto, Yokkaichi (JP)

(73) Assignee: SANDISK TECHNOLOGIES LLC, San Jose, CA (US)

( * ) Notice: Subject to any disclaimer, the term of this patent is extended or adjusted under 35 U.S.C. 154(b) by 37 days.

(21) Appl. No.: 16/432,415

(22) Filed: Jun. 5, 2019

(65) Prior Publication Data

US 2020/0027835 A1 Jan. 23, 2020

Related U.S. Application Data

(60) Provisional application No. 62/701,074, filed on Jul. 20, 2018.

(51) Int. Cl.
*H01L 27/11529* (2017.01)
*H01L 23/535* (2006.01)
*H01L 27/11582* (2017.01)
*H01L 27/11556* (2017.01)
*H01L 29/40* (2006.01)

(Continued)

(52) U.S. Cl.
CPC ........ *H01L 23/535* (2013.01); *H01L 27/1157* (2013.01); *H01L 27/11524* (2013.01); *H01L 27/11556* (2013.01); *H01L 27/11582* (2013.01); *H01L 29/0653* (2013.01); *H01L 29/401* (2013.01)

(58) Field of Classification Search
CPC ......... H01L 27/11524; H01L 27/11529; H01L 27/11556; H01L 27/11568; H01L 27/1157; H01L 27/11582
See application file for complete search history.

(56) References Cited

U.S. PATENT DOCUMENTS 7,682,942 B2  3/2010  Chen et al.
7,713,878 B2  5/2010  Chan
(Continued)

OTHER PUBLICATIONS

Endoh, T. et al., "Novel Ultra High Density Memory with a Stacked-Surrounding Gate Transistor (SSGT) Structured Cell," IEDM Proc., (2001), 33-36.

*Primary Examiner* — Hoai V Pham
(74) *Attorney, Agent, or Firm* — The Marbury Law Group PLLC

(57) ABSTRACT

A dielectric spacer assembly including an annular dielectric isolation structure is formed through in-process source-level material layers. An alternating stack of insulating layers and spacer material layers is formed over the in-process source-level material layers. A contact via cavity is formed through the dielectric spacer assembly, and is filled within a dielectric spacer and a sacrificial via fill structure. The dielectric spacer assembly protects the dielectric spacer during replacement of a source-level sacrificial layer with a source contact layer. The sacrificial via fill structure is subsequently replaced with a through-memory-level contact via structure.

14 Claims, 50 Drawing Sheets

(51) Int. Cl.
*H01L 27/11524* (2017.01)
*H01L 29/06* (2006.01)
*H01L 27/1157* (2017.01)

(56) References Cited

U.S. PATENT DOCUMENTS

| | | |
|---|---|---|
| 7,732,235 B2 | 6/2010 | Scheuerlein et al. |
| 7,759,201 B2 | 7/2010 | Petti et al. |
| 7,786,015 B2 | 8/2010 | Chen et al. |
| 7,981,592 B2 | 7/2011 | Chan |
| 8,076,056 B2 | 12/2011 | Wang et al. |
| 8,080,443 B2 | 12/2011 | Chen et al. |
| 9,093,480 B2 | 7/2015 | Makala et al. |
| 9,331,094 B2 | 5/2016 | Hada |
| 9,524,976 B2 | 12/2016 | Pachamuthu et al. |
| 9,570,460 B2 | 2/2017 | Kanakamedala et al. |
| 9,991,280 B2 | 6/2018 | Nakamura et al. |
| 2017/0271358 A1* | 9/2017 | Mori ................... H01L 27/1157 |

* cited by examiner

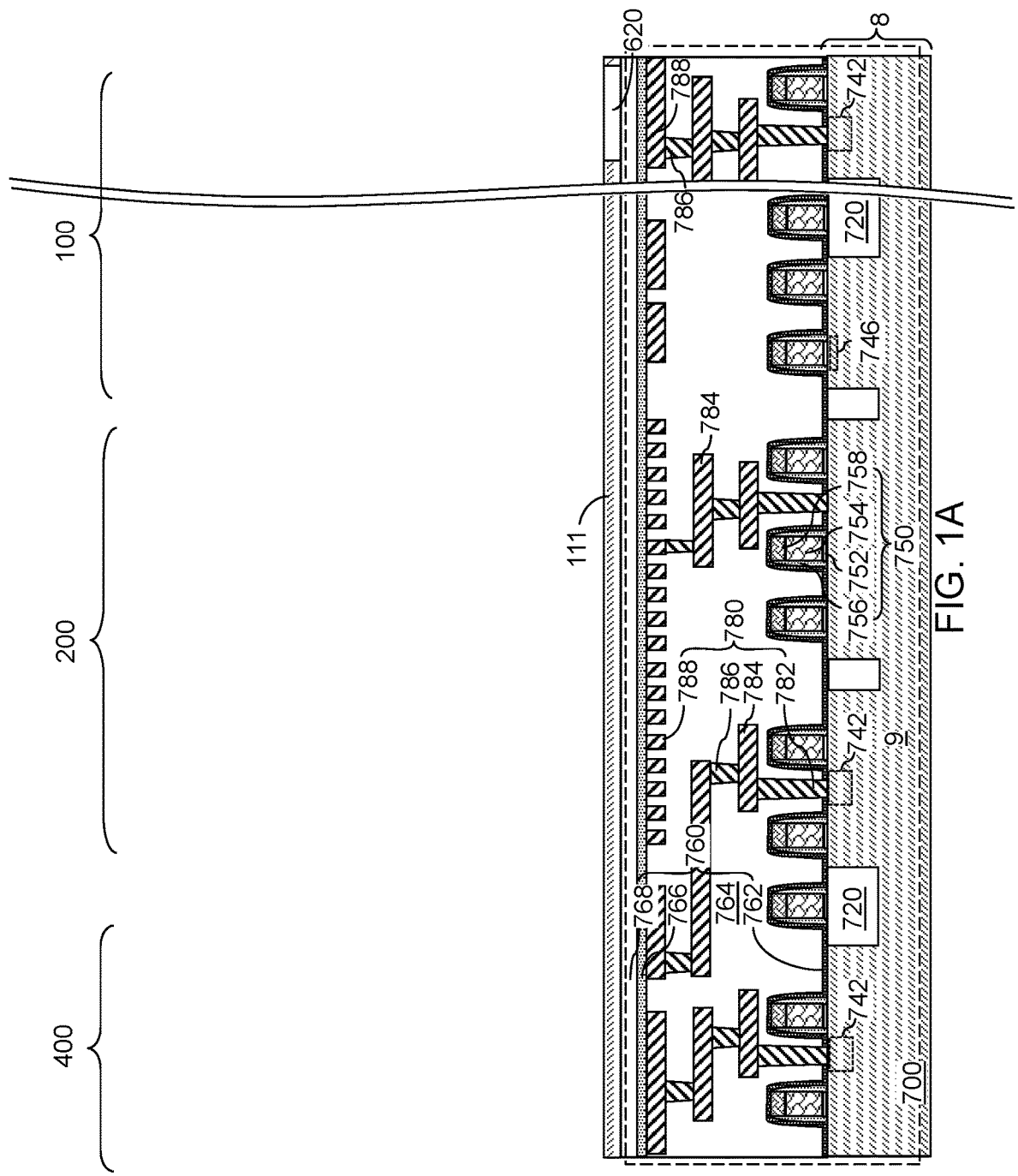

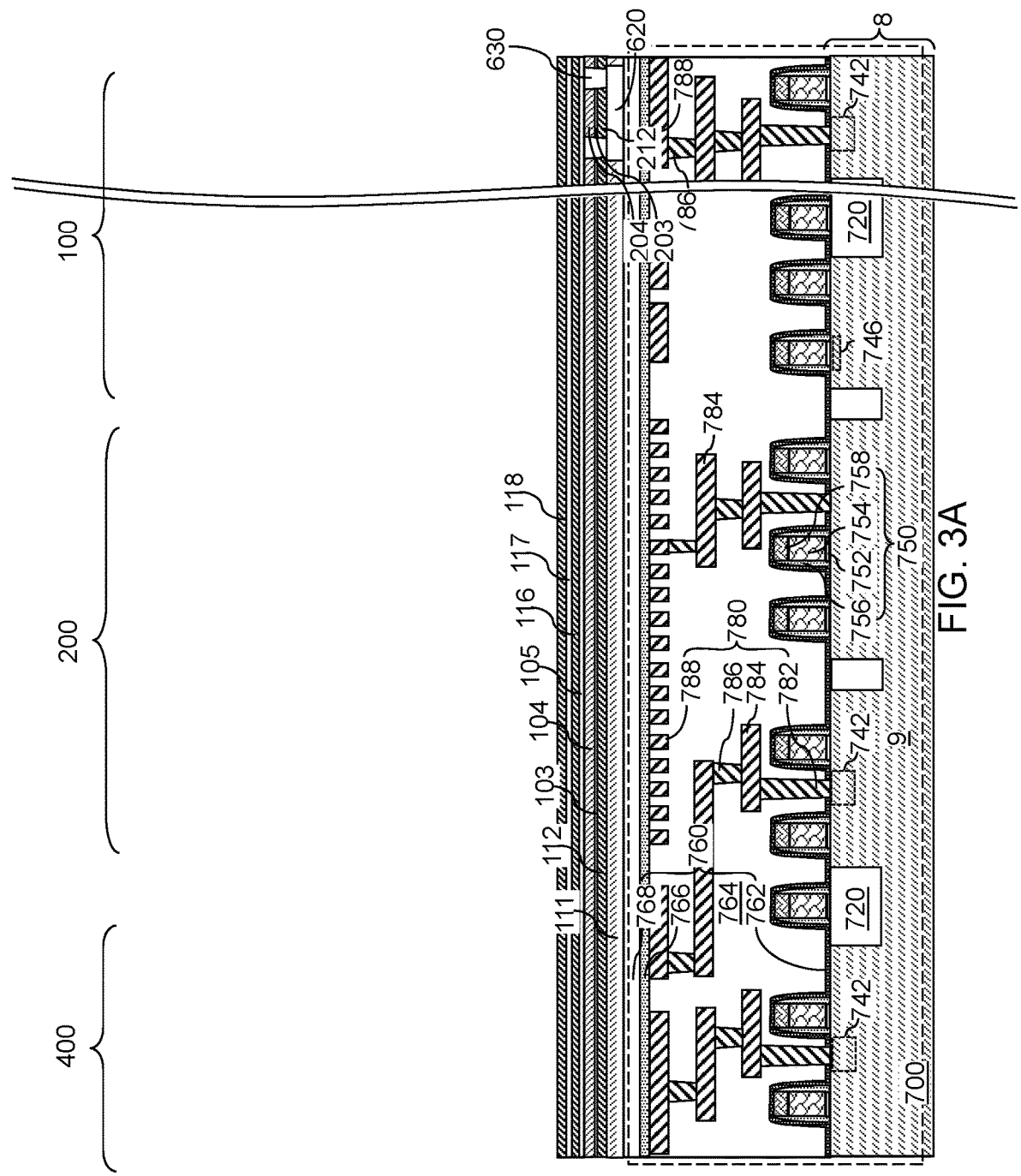

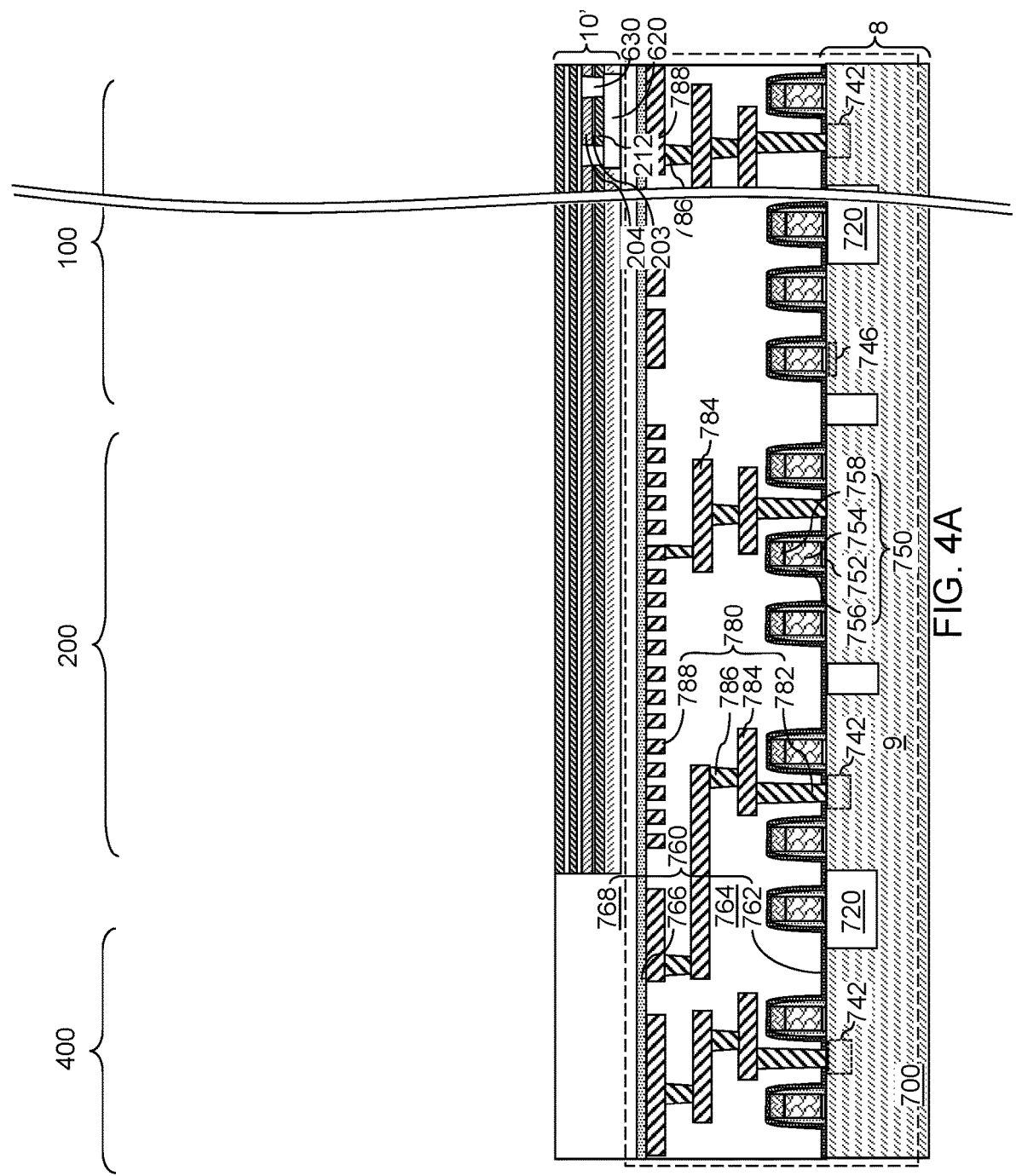

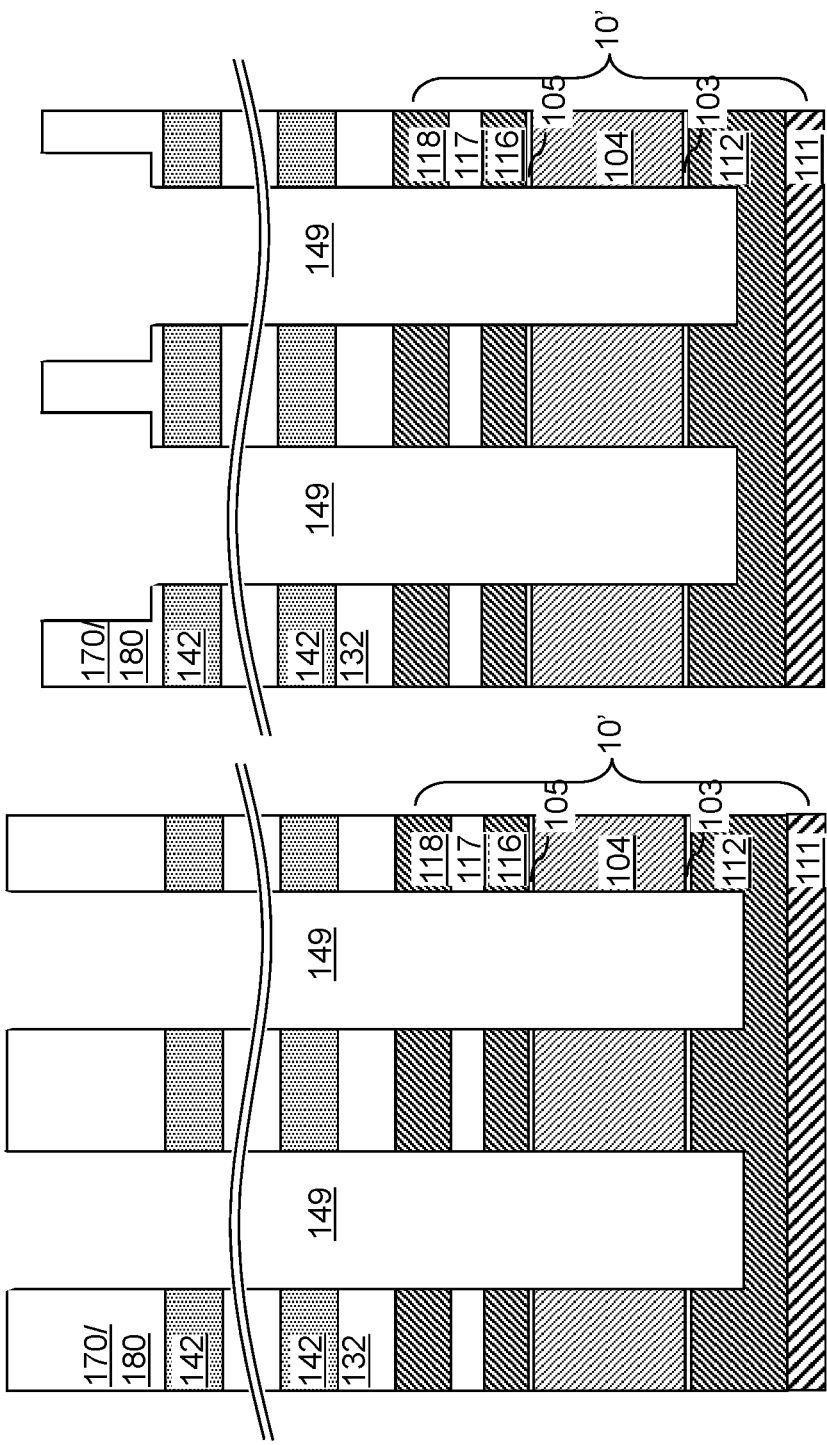

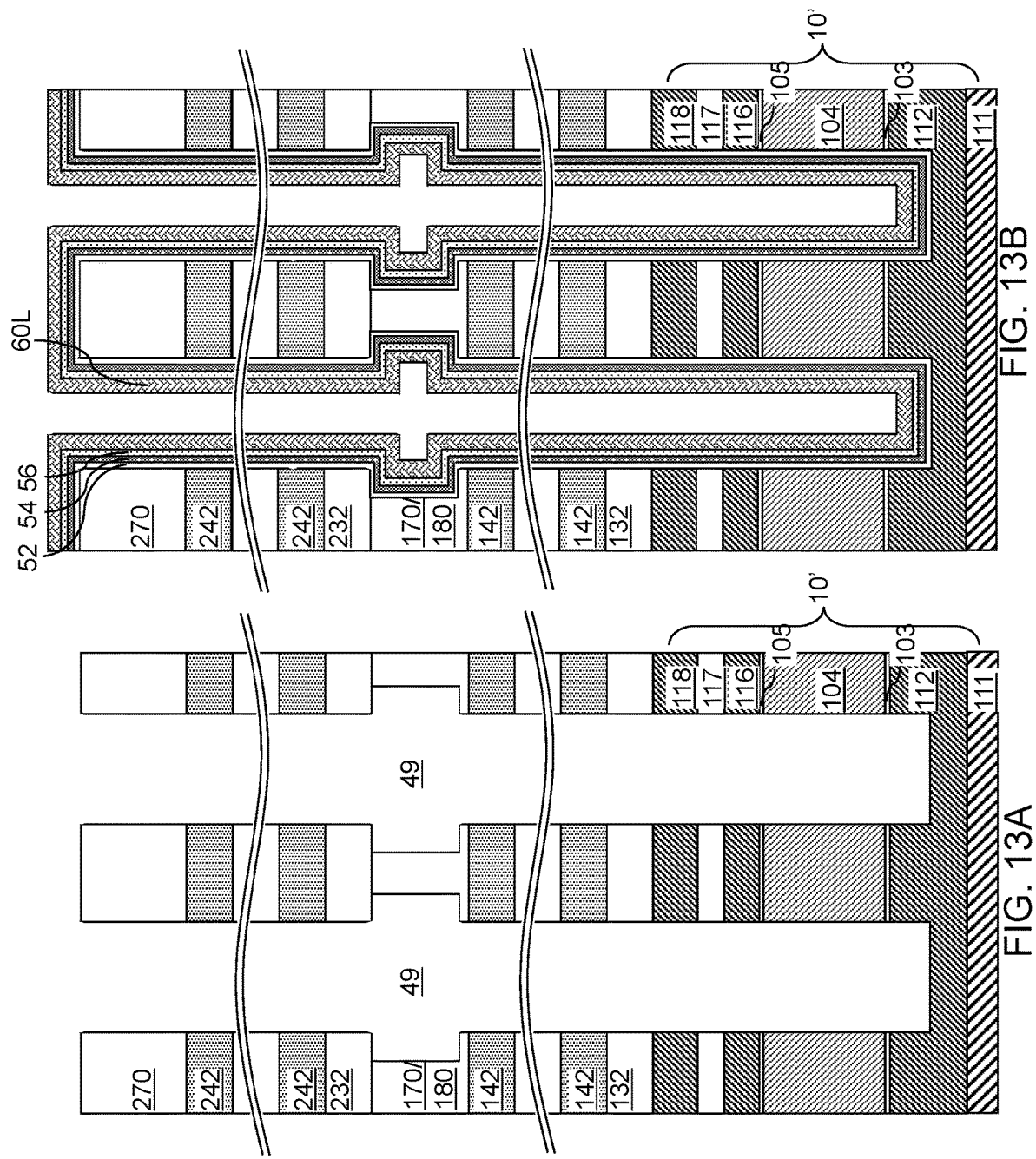

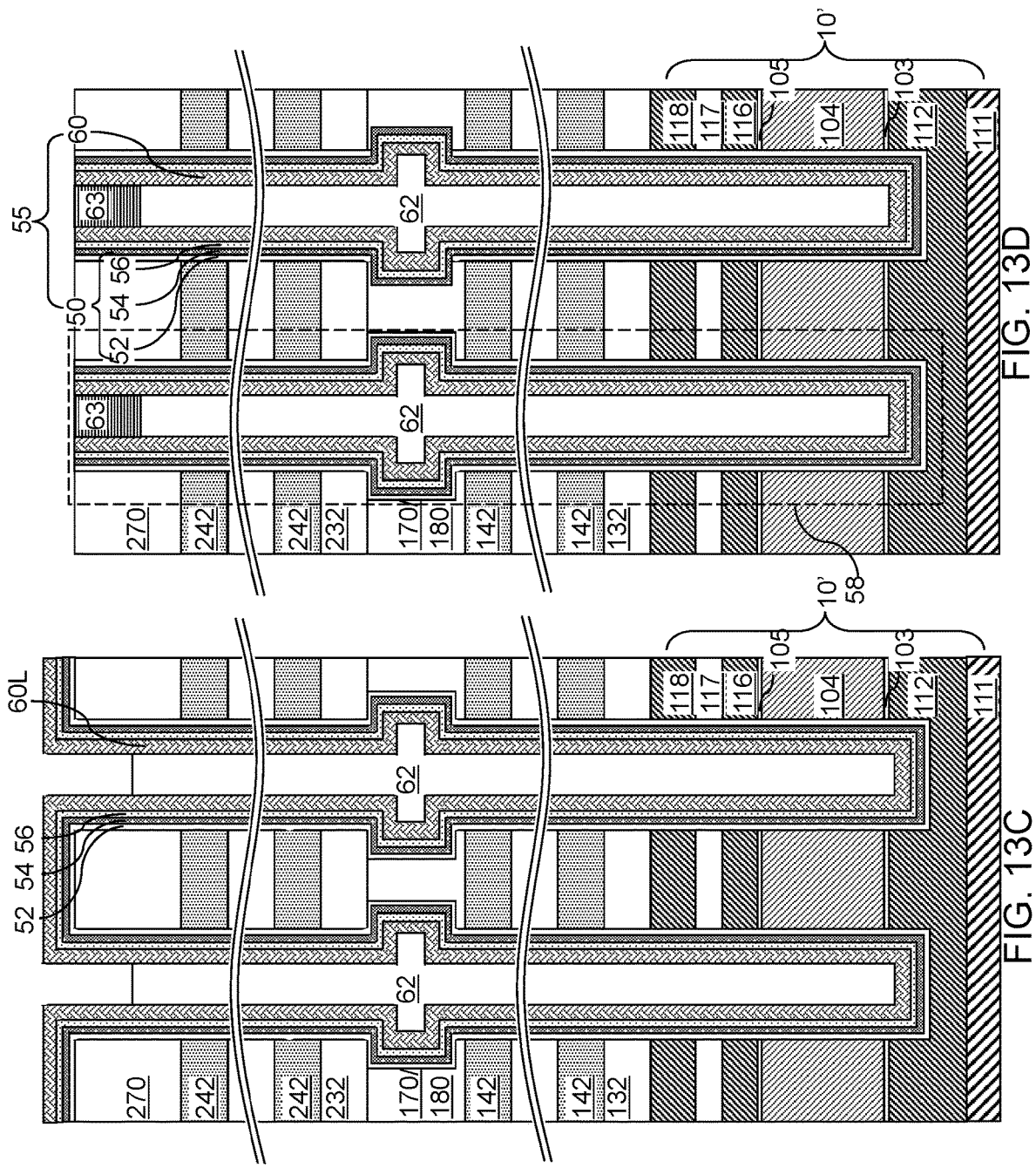

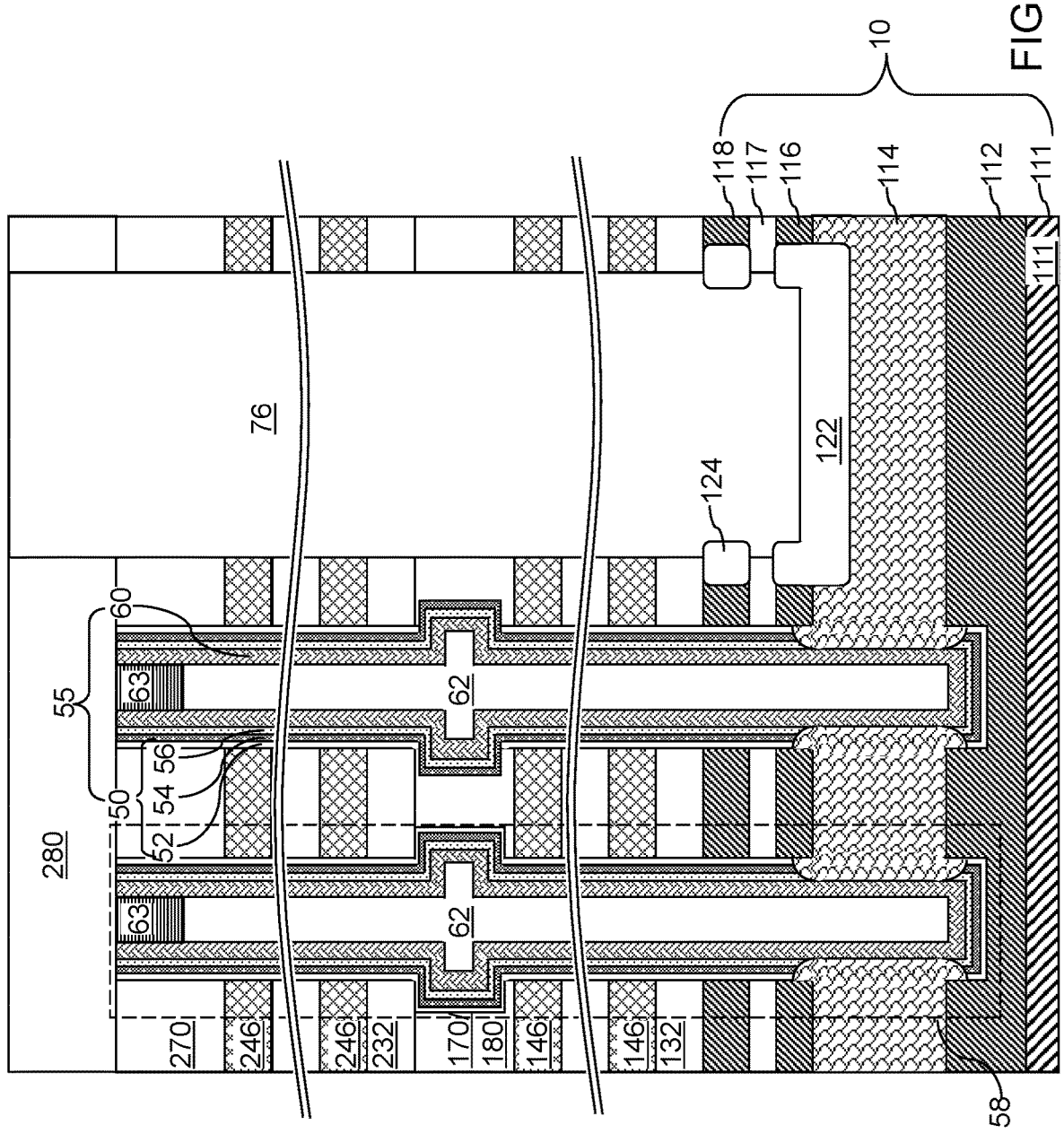

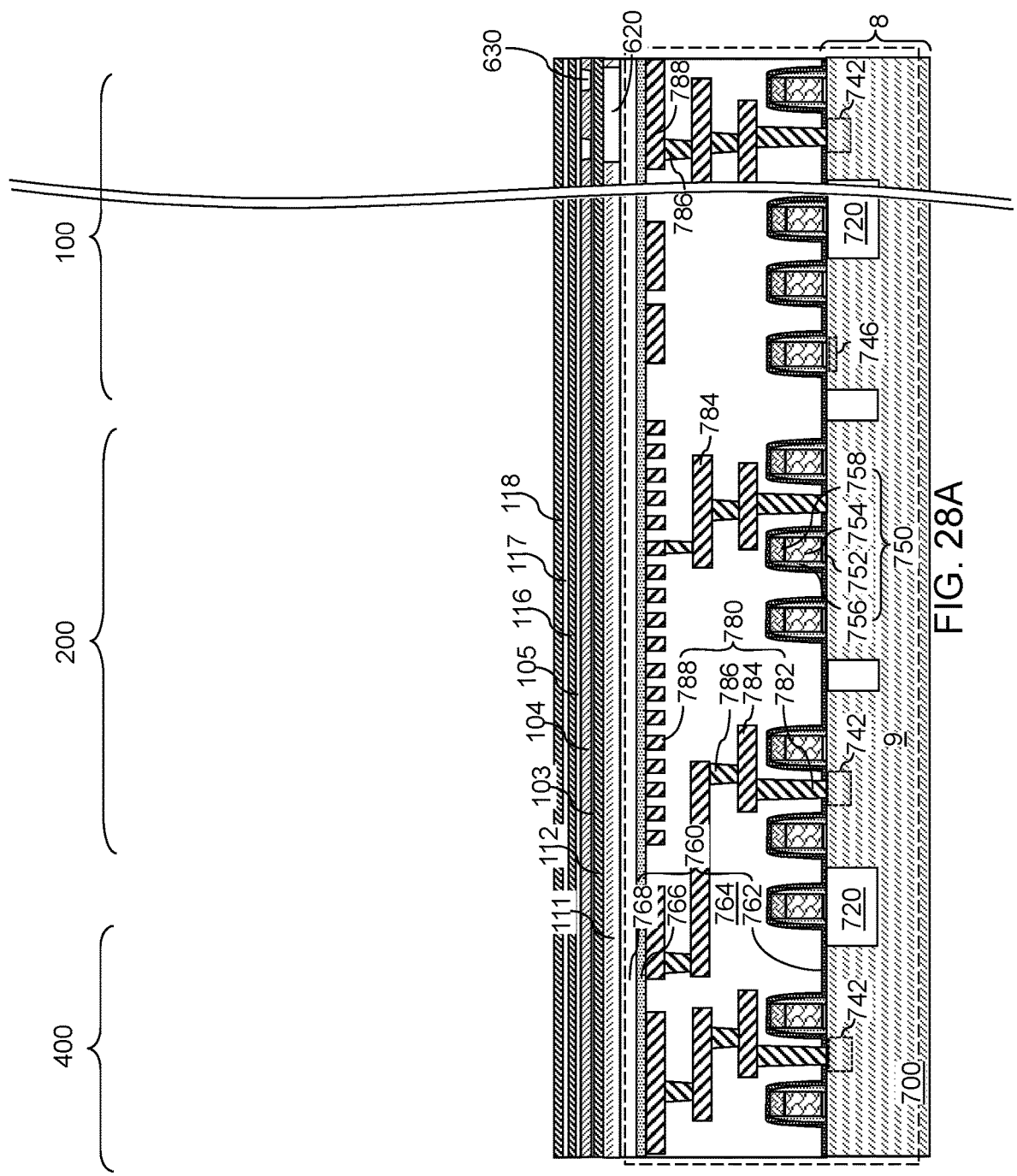

THREE-DIMENSIONAL MEMORY DEVICE CONTAINING CONTACT VIA STRUCTURE EXTENDING THROUGH SOURCE CONTACT LAYER AND DIELECTRIC SPACER ASSEMBLY

The instant application claims the benefit of priority of provisional U.S. Application Ser. No. 62/701,074 filed on Jul. 20, 2018, the entire contents of which are incorporated herein by reference.

FIELD

The present disclosure relates generally to the field of semiconductor devices, and particular to a three-dimensional memory device including a contact via structure extending through a source contact layer and a dielectric spacer assembly and methods of manufacturing the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an embodiment of the present disclosure, a three-dimensional memory device is provided, which comprises: source-level material layers located over a substrate and comprising a lower source-level material layer, an upper source-level material layer and a source contact layer located therebetween; an alternating stack of insulating layers and electrically conductive layers located over the source-level material layers; a memory stack structure extending through the alternating stack and comprising a memory film and a vertical semiconductor channel, wherein a sidewall of the vertical semiconductor channel contacts the source contact layer; and a through-memory-level contact via structure vertically extending through the alternating stack and the source-level material layers and is laterally surrounded by a dielectric spacer; wherein the upper source-level material layer contacts the dielectric spacer, and the source contact layer is laterally spaced apart from, and does not contact, the dielectric spacer.

According to another embodiment of the present disclosure, a method of forming a three-dimensional memory device is provided, which comprises: forming in-process source-level material layers comprising a lower source-level material layer, a lower dielectric liner layer, and a source-level sacrificial layer over a substrate; forming an annular dielectric isolation structure through at least the source-level sacrificial layer; forming an upper dielectric liner layer and an upper source-level material layer over the annular dielectric isolation structure; forming an alternating stack of insulating layers and spacer material layers over the in-process source-level material layers, wherein the spacer material layers are formed as, or are subsequently replaced with, electrically conductive layers; forming a memory stack structure through the alternating stack, the upper source-level material layer, the upper dielectric liner layer, and the source-level sacrificial layer, wherein the memory stack structure comprises a memory film and a vertical semiconductor channel; forming a source cavity by removing portions of the source-level sacrificial layer outside the annular dielectric isolation structure and by removing portions of the upper and lower dielectric liner layers; etching a portion of the memory film exposed in the source cavity to physically expose a sidewall of the vertical semiconductor channel; forming a source contact layer in the source cavity and in contact with the sidewall of the vertical semiconductor channel; and forming a through-memory-level contact via structure through the alternating stack, the upper source-level material layer, an opening inside the annular dielectric isolation structure, and the lower source-level material layer.

BRIEF DESCRIPTION OF THE DRAWINGS

FIG. 1A is a vertical cross-sectional view of an exemplary structure after formation of semiconductor devices, lower level dielectric layers, lower metal interconnect structures, a doped semiconductor material underlayer, and dielectric material blocks according to a first embodiment of the present disclosure.

FIG. 3A is a vertical cross-sectional view of the first exemplary structure after formation an upper dielectric liner layer, an upper source-level material layer, a source-level insulating layer, and an optional source-select-level conductive layer according to the first embodiment of the present disclosure.

FIG. 4A is a vertical cross-sectional view of the first exemplary structure after patterning the in-process source-level material layers according to the first embodiment of the present disclosure.

FIGS. 8A and 8B illustrate sequential vertical cross-sectional views of first-tier memory openings during expansion of upper regions of the first-tier memory openings according to the first embodiment of the present disclosure.

FIGS. 13A-13D are sequential vertical cross-sectional views of a pair of inter-tier memory openings during formation of a pair of memory opening fill structures according to the first embodiment of the present disclosure.

FIG. 23D is a vertical cross-sectional view of a region of the first exemplary structure along the vertical plane D-D' of FIG. 23B.

FIG. 28A is a vertical cross-sectional view of the second exemplary structure after formation an upper dielectric liner layer, an upper source-level material layer, a source-level insulating layer, and an optional source-select-level conductive layer according to the second embodiment of the present disclosure.

DETAILED DESCRIPTION

Figure 1B:
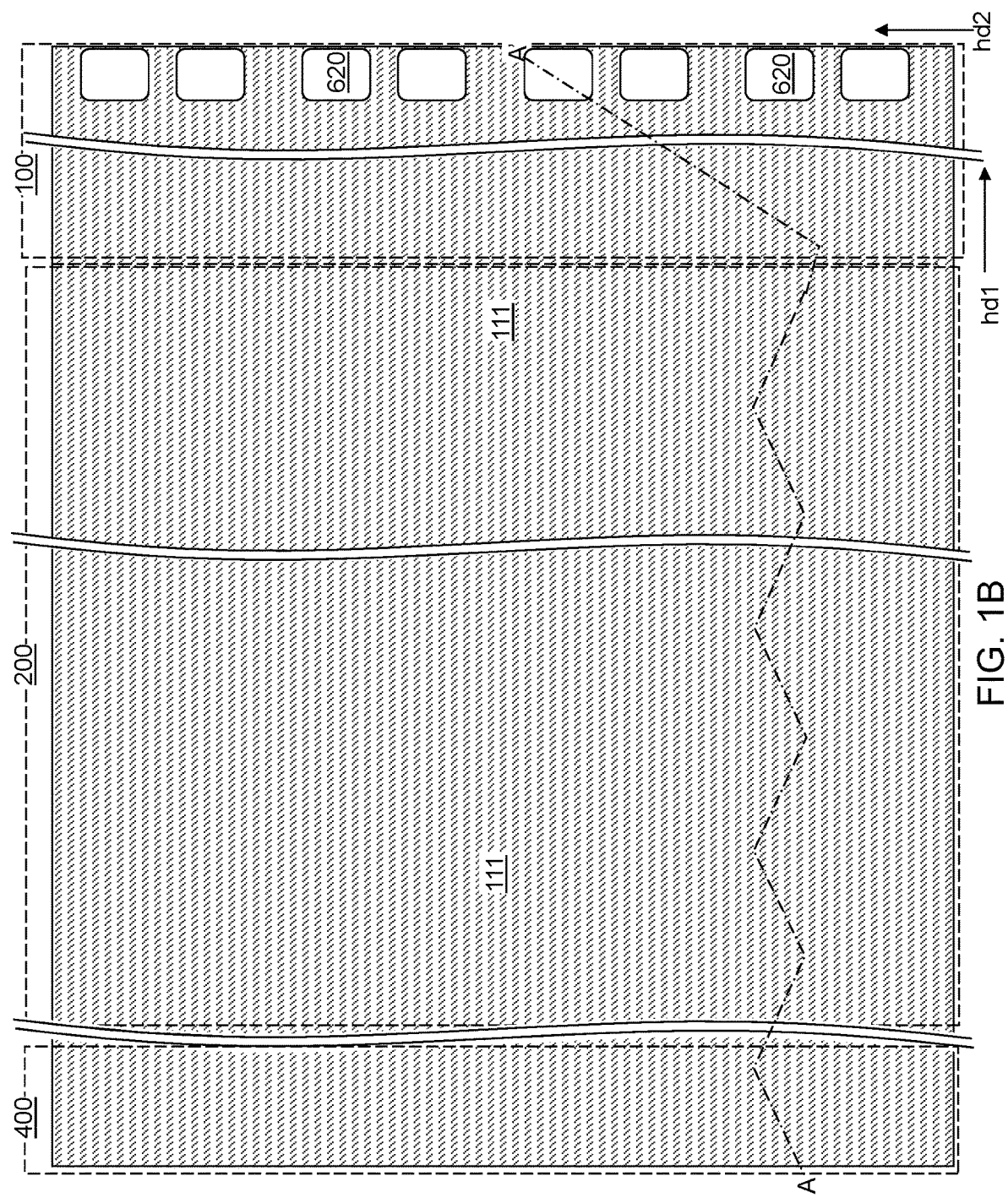
FIG. 1B is a top-down view of the first exemplary structure of FIG. 1A. The zig-zag vertical plane A-A' is the plane of the vertical cross-sectional view of FIG. 1A.

The embodiments described herein the present disclosure are directed to a three-dimensional memory device including contact via structure extending through a source contact layer and a dielectric spacer assembly and methods of manufacturing the same.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are used merely to identify similar elements, and different ordinals may be used across the specification and the claims of the instant disclosure. The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. As used herein, a first element located "on" a second element may be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

As used herein, a "memory level" or a "memory array level" refers to the level corresponding to a general region between a first horizontal plane (i.e., a plane parallel to the top surface of the substrate) including topmost surfaces of an array of memory elements and a second horizontal plane including bottommost surfaces of the array of memory elements. As used herein, a "through-stack" element refers to an element that vertically extends through a memory level.

As used herein, a "semiconducting material" refers to a material having electrical conductivity in the range from $1.0 \times 10^{-5}$ S/m to $1.0 \times 10^{5}$ S/m. As used herein, a "semiconductor material" refers to a material having electrical conductivity in the range from $1.0 \times 10^{-5}$ S/m to 1.0 S/m in the absence of electrical dopants therein, and is capable of producing a doped material having electrical conductivity in a range from 1.0 S/m to $1.0 \times 10^{7}$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/m. As used herein, an "insulator material" or a "dielectric material" refers to a material having electrical conductivity less than $1.0 \times 10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to provide electrical conductivity greater than $1.0 \times 10^{5}$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-5}$ S/m to $1.0 \times 10^{7}$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material may be semiconducting or conductive depending on the atomic concentration of electrical dopants therein. As used herein, a "metallic material" refers to a conductive material including at least one metallic element therein. All measurements for electrical conductivities are made at the standard condition.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The substrate may include integrated circuits fabricated thereon, such as driver circuits for a memory device.

The various three-dimensional memory devices of the present disclosure include a monolithic three-dimensional NAND string memory device, and may be fabricated using the various embodiments described herein. The monolithic three-dimensional NAND string is located in a monolithic, three-dimensional array of NAND strings located over the substrate. At least one memory cell in the first device level of the three-dimensional array of NAND strings is located over another memory cell in the second device level of the three-dimensional array of NAND strings.

Generally, a semiconductor package (or a "package") refers to a unit semiconductor device that may be attached to a circuit board through a set of pins or solder balls. A semiconductor package may include a semiconductor chip (or a "chip") or a plurality of semiconductor chips that are bonded throughout, for example, by flip-chip bonding or another chip-to-chip bonding. A package or a chip may include a single semiconductor die (or a "die") or a plurality of semiconductor dies. A die is the smallest unit that may independently execute external commands or report status. Typically, a package or a chip with multiple dies is capable of simultaneously executing as many external commands as the total number of dies therein. Each die includes one or more planes. Identical concurrent operations may be executed in each plane within a same die, although there may be some restrictions. In case a die is a memory die, i.e., a die including memory elements, concurrent read operations, concurrent write operations, or concurrent erase operations may be performed in each plane within a same memory die. In a memory die, each plane contains a number of memory blocks (or "blocks"), which are the smallest unit that may be erased by in a single erase operation. Each memory block contains a number of pages, which are the smallest units that may be selected for programming. A page is also the smallest unit that may be selected to a read operation.

Referring to FIGS. 1A and 1B, a first exemplary structure according to a first embodiment of the present disclosure is illustrated. The first exemplary structure may include a semiconductor substrate 8 and a complementary metal oxide semiconductor (CMOS) circuitry 700 formed thereupon. The first exemplary structure includes a memory array region 100 in which a three-dimensional memory array is to be subsequently formed, a staircase region 200 in which stepped surfaces of electrically conductive layers and contact via structures are to be subsequently formed, and a peripheral region 400 in which peripheral contact via structures are to be subsequently formed.

The semiconductor substrate 8 includes a substrate semiconductor layer 9 at least at an upper portion thereof. Various doped wells may be formed in upper portions of the substrate semiconductor layer 9. Shallow trench isolation structures 720 may be formed in an upper portion of the substrate semiconductor layer 9 to provide electrical isolation between adjacent semiconductor devices. The CMOS circuitry 700 includes field effect transistors including respective transistor active regions 742 (i.e., source regions and drain regions), channel regions 746, and gate structures 750. The field effect transistors may be arranged in a CMOS configuration. Each gate structure 750 may include, for example, a gate dielectric 752, a gate electrode 754, a dielectric gate spacer 756 and a gate cap dielectric 758.

The CMOS circuitry 700 may include additional semiconductor devices in addition to p-type field effect transistors and n-type field effect transistors, which may be used to support operation of a memory structure to be subsequently formed. The CMOS circuitry 700 may include a driver circuitry, which is also referred to as a peripheral circuitry. As used herein, a peripheral circuitry refers to any, each, or all, of word line decoder circuitry, word line switching circuitry, bit line decoder circuitry, bit line sensing and/or switching circuitry, power supply/distribution circuitry, data buffer and/or latch, or any other semiconductor circuitry that may be implemented outside a memory array structure for a memory device. For example, the semiconductor devices may include word line switching devices for electrically biasing word lines of three-dimensional memory structures to be subsequently formed.

Dielectric material layers may be formed over the semiconductor devices, which are herein referred to as lower-level dielectric material layers 760. The lower-level dielectric material layers 760 may include, for example, a dielectric liner 762 (such as a silicon nitride liner that blocks diffusion of mobile ions and/or apply appropriate stress to underlying structures), first dielectric material layers 764 that may overlie the dielectric liner 762, a silicon nitride layer (e.g., hydrogen diffusion barrier) 766 that may overlie the first dielectric material layers 764, and at least one second dielectric layer 768.

A dielectric layer stack including the lower-level dielectric material layers 760 may function as a matrix for lower-level metal interconnect structures 780 that may provide electrical wiring to and from the various nodes of the semiconductor devices and landing pads for through-memory-level contact via structures to be subsequently formed. The lower-level metal interconnect structures 780 may be formed within the dielectric layer stack of the lower-level dielectric material layers 760, and comprise a lower-level metal line structure located under and optionally contacting a bottom surface of the silicon nitride layer 766.

For example, the lower-level metal interconnect structures 780 may be formed within the first dielectric material layers 764. The first dielectric material layers 764 may be a plurality of dielectric material layers in which various elements of the lower-level metal interconnect structures 780 may be sequentially formed. Each dielectric material layer forming the first dielectric material layers 764 may include any of doped silicate glass, undoped silicate glass, organosilicate glass, silicon nitride, silicon oxynitride, and dielectric metal oxides (such as aluminum oxide). In one embodiment, the first dielectric material layers 764 may comprise, or consist essentially of, dielectric material layers having dielectric constants that do not exceed the dielectric constant of undoped silicate glass (silicon oxide) of 3.9. The lower-level metal interconnect structures 780 may include various device contact via structures 782 (e.g., source and drain electrodes which contact the respective source and drain nodes of the device or gate electrode contacts), intermediate lower-level metal line structures 784, lower-level metal via structures 786, and landing-pad-level metal line structures 788 that may be configured to function as landing pads for through-memory-level contact via structures that are to be subsequently formed.

The landing-pad-level metal line structures 788 may be formed within a topmost dielectric material layer of the first dielectric material layers 764 (which may be a plurality of dielectric material layers). The landing-pad-level metal line structures 788 may be used as landing pads for metal via structures that are to be subsequently formed thereabove. Each of the lower-level metal interconnect structures 780 may include a metallic nitride liner and a metal fill structure. Top surfaces of the landing-pad-level metal line structures 788 and the topmost surface of the first dielectric material layers 764 may be planarized by a planarization process, such as chemical mechanical planarization. The silicon nitride layer 766 may be formed directly on the top surfaces of the landing-pad-level metal line structures 788 and the topmost surface of the first dielectric material layers 764.

The at least one second dielectric material layer 768 may include a single dielectric material layer or a plurality of dielectric material layers. Each dielectric material layer forming the at least one second dielectric material layer 768 may include any of doped silicate glass, undoped silicate glass, and organosilicate glass. In one embodiment, the at least one second dielectric material layer 768 may comprise, or consist essentially of, dielectric material layers having dielectric constants that do not exceed the dielectric constant of undoped silicate glass (silicon oxide) of 3.9.

The CMOS circuitry 700 may include peripheral circuitry devices for the memory-level assembly to be subsequently formed. The lower-level metal interconnect structures 780 may be formed in the lower-level dielectric layers 760. The combination of the lower-level dielectric layers 760 and the lower-level metal interconnect structures 780 overlie the CMOS circuitry 700.

The lower-level metal interconnect structures 780 may be electrically connected to active nodes (e.g., transistor active regions 742 or gate electrodes 754) of the CMOS circuitry 700 (e.g., CMOS devices), and may be located at the level of the lower-level dielectric layers 760. Through-memory-level contact via structures may be subsequently formed directly on the lower-level metal interconnect structures 780 to provide electrical connection to memory devices that are to be subsequently formed. In one embodiment, the pattern of the lower-level metal interconnect structures 780 may be selected such that the landing-pad-level metal line structures 788 (which are a subset of the lower-level metal interconnect structures 780 located at the topmost portion of the lower-level metal interconnect structures 780) may provide landing pad structures for the through-memory-level contact via structures to be subsequently formed. A top layer included in the at least one second dielectric material layer 768 covers the lower-level metal interconnect structures 780 including the landing-pad-level metal line structures 788.

A doped semiconductor material underlayer 111 may be deposited over the top surface of the at least one second dielectric material layer 768. The doped semiconductor material underlayer 111 may include a heavily doped semiconductor material layer. For example, the doped semiconductor material underlayer 111 may include doped polysilicon, and may have a thickness in a range from 30 nm to 300 nm, although lesser and greater thicknesses may also be used.

Discrete cavities may be formed through the doped semiconductor material underlayer 111 in the memory array region 100 in areas in which through-memory-level contact via structures are to be subsequently formed. For example, a photoresist layer (not shown) may be applied over the doped semiconductor material underlayer 111, and may be lithographically patterned to form discrete openings. The shape of an outer periphery of each discrete opening in the photoresist layer may be polygonal, circular, elliptical, oval, or of a generally curvilinear two-dimensional shape. An anisotropic etch process may be performed to transfer the pattern of the openings in the photoresist layer through the doped semiconductor material underlayer 111. The discrete cavities may be formed within the doped semiconductor material underlayer 111 underneath the openings in the photoresist layer. Each discrete cavity may extend through the doped semiconductor material underlayer 111, and a top surface of the at least one second dielectric material layer 768 may be physically exposed at the bottom of each discrete cavity. The photoresist layer may be subsequently removed, for example, by ashing.

A dielectric material layer such as silicate glass may be deposited in the discrete cavities by a conformal or non-conformal deposition process. Optionally, a thin dielectric liner such as a silicon nitride liner may be used before deposition of the dielectric material layer. Excess portions of the dielectric material layer may be removed from above the horizontal plane including the top surface of the doped semiconductor material underlayer 111 by a planarization process. The planarization process may use a recess etch process and/or a chemical mechanical planarization (CMP) process. Each remaining portion of the dielectric material layer that fills a respective one of the discrete cavities constitutes a dielectric material block 620. The dielectric material blocks 620 vertically extend through the doped semiconductor material underlayer 111, and overlies a respective one of the landing-pad-level metal line structures 788. Each of the dielectric material blocks 620 may be formed within an area in which a through-memory-level contact via structures is to be subsequently formed.

Figure 2A:
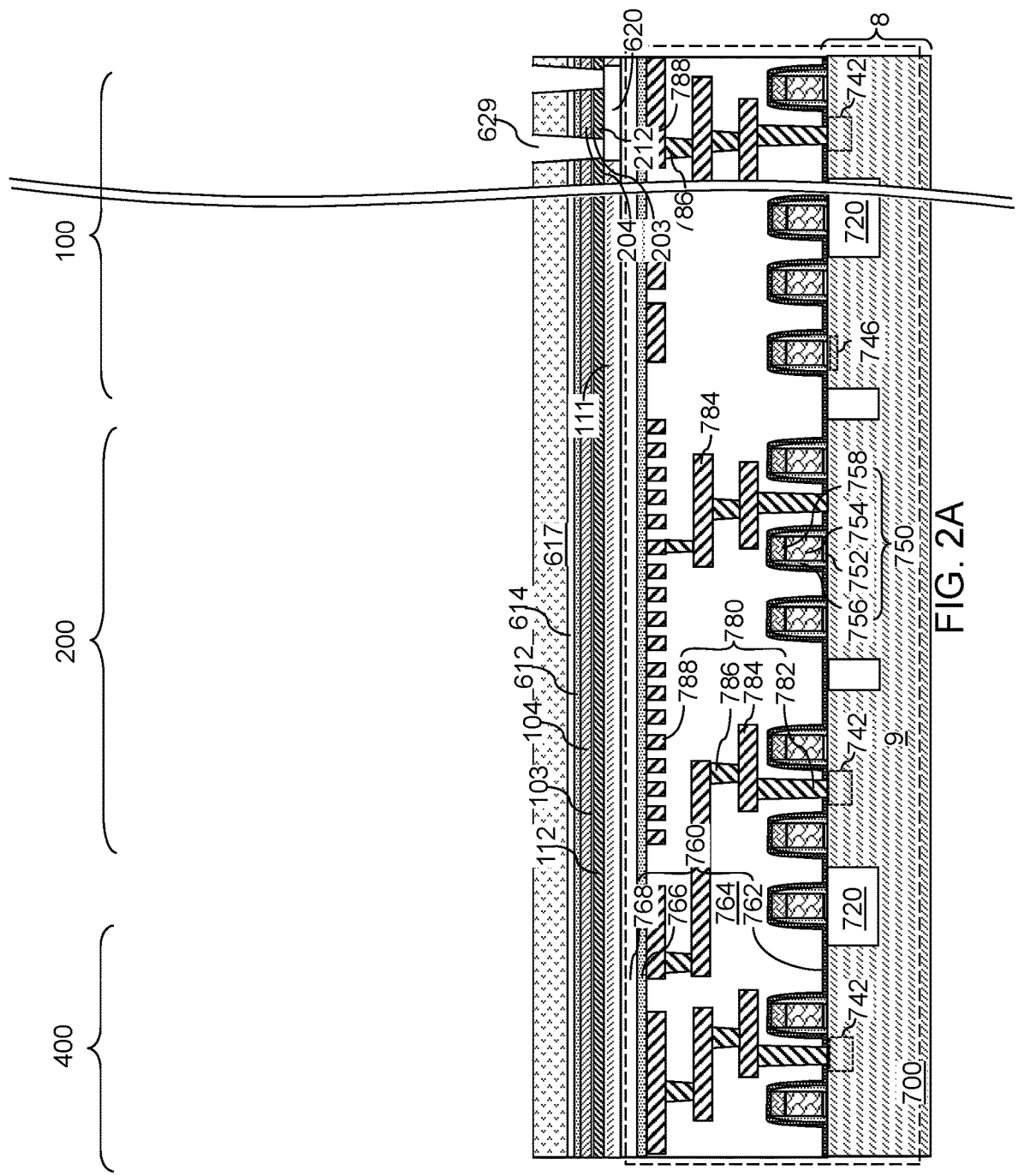
FIG. 2A is a vertical cross-sectional view of the first exemplary structure after formation of a lower source-level material layer, a lower dielectric liner layer 103, a source-level sacrificial layer, a first hard mask layer, a second hard mask layer, a photoresist layer, and annular trenches according to the first embodiment of the present disclosure.
Figure 2B:
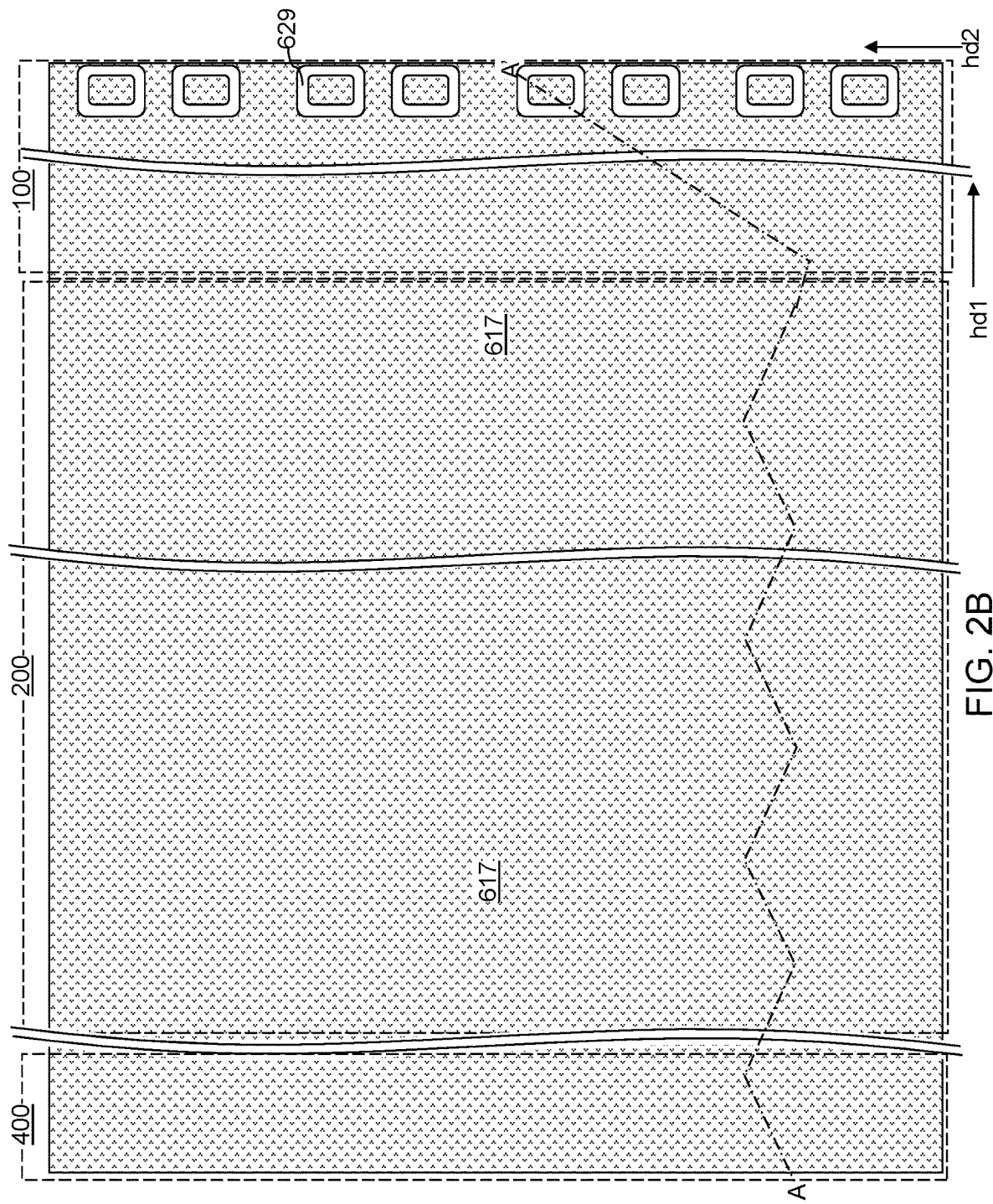
FIG. 2B is a top-down view of the first exemplary structure of FIG. 2A. The zig-zag vertical plane A-A' is the plane of the vertical cross-sectional view of FIG. 2A.

Referring to FIGS. 2A and 2B, a lower source-level material layer 112, a lower dielectric liner layer 103, a source-level sacrificial layer 104, a first hard mask layer 612, a second hard mask layer 614 may be sequentially deposited over the top surface of the doped semiconductor material underlayer 111.

The lower source-level material layer 112 may include a doped semiconductor material such as doped polysilicon or doped amorphous silicon. The conductivity type of the lower source-level material layer 112 and the doped semiconductor material underlayer 111 may be the opposite of the conductivity of vertical semiconductor channels to be subsequently formed. For example, if the vertical semiconductor channels to be subsequently formed have a doping of a first conductivity type, the lower source-level material layer 112 and the doped semiconductor material underlayer 111 have a doping of a second conductivity type that is the opposite of the first conductivity type. The thickness of each of the lower source-level material layer 112 may be in a range from 10 nm to 300 nm, such as from 20 nm to 150 nm, although lesser and greater thicknesses may also be used.

The lower dielectric liner layer 103 includes a material that may function as an etch stop material during removal of the source-level sacrificial layer 104. For example, the lower dielectric liner layer 103 may include silicon oxide, silicon nitride, and/or a dielectric metal oxide. In one embodiment, the lower dielectric liner layer 103 may include a silicon oxide layer having a thickness in a range from 2 nm to 30 nm, although lesser and greater thicknesses may also be used.

The source-level sacrificial layer 104 includes a sacrificial material that may be removed selective to the lower dielectric liner layer 103. In one embodiment, the source-level sacrificial layer 104 may include a semiconductor material such as undoped amorphous silicon or a silicon-germanium alloy with an atomic concentration of germanium greater than 20%. The thickness of the source-level sacrificial layer 104 may be in a range from 30 nm to 400 nm, such as from 60 nm to 200 nm, although lesser and greater thicknesses may also be used.

At least one hard mask layer may be formed over the source-level sacrificial layer 104. The source-level sacrificial layer 104 may include a first hard mask layer 612 and a second hard mask layer 614. The first hard mask layer 612 includes a material that may be used as a planarization stopper layer during a subsequent planarization process. For example, the first hard mask layer 612 may include a silicon nitride layer having a thickness in a range from 30 nm to 100 nm, although lesser and greater thicknesses may also be used. The second hard mask layer 614 may be optionally formed over the first hard mask layer 612. The second hard mask layer 614 may include a dielectric material different from the material of the first hard mask layer 612. For example, the second hard mask layer 614 may include a silicon oxide layer having a thickness in a range from 30 nm to 100 nm, although lesser and greater thicknesses may also be used.

A photoresist layer 617 may be applied over the at least one hard mask layer (612, 614), and may be lithographically patterned to form annular openings. As used herein, an "annular" element refers to an element having a horizontal cross-sectional shape defined by a closed inner periphery and a closed outer periphery that does not touch the closed inner periphery. The shape of each of the closed inner periphery and the closed outer periphery may be polygonal, circular, elliptical, oval, or of a generally curvilinear two-dimensional shape. The lateral distance between the closed inner periphery and the closed outer periphery may be uniform or non-uniform. In one embodiment, the closed inner periphery and the closed outer periphery of each annular opening may have a rectangular shape, an elliptical shape, or a shape of a rounded rectangle. Each of the annular openings in the photoresist layer 617 may be located entirely within the area of an underlying one of the dielectric material blocks 620.

An anisotropic etch process may be performed to etch through the physically exposed portions of the layer stack including the at least one hard mask layer (612, 614), the source-level sacrificial layer 104, the lower dielectric liner layer 103, and the lower source-level material layer 112. The anisotropic etch process may include a sequence of etch steps having different etch chemistries to etch through the various material layers overlying the dielectric material blocks 620. The dielectric material blocks 620 may function as etch stop structures for the last step of the anisotropic etch process that etches through the material of the lower source-level material layer 112. Annular trenches 629 may be formed in the memory array region 100. Each annular trench 629 may vertically extend through the layer stack of the source-level sacrificial layer 104, the lower dielectric liner layer 103, and the lower source-level material layer 112. An annular top surface of a dielectric material block 620 is physically exposed at the bottom of each annular trench 629.

A portion of the lower source-level material layer 112 may be patterned into a doped semiconductor plate 212 within each annular trench 629. A portion of the lower dielectric liner layer 103 may be patterned into a lower dielectric liner 203 within each annular trench 629. A portion of the source-level sacrificial layer 104 may be patterned into a source-level semiconductor plate 204, which may include an undoped semiconductor material. The photoresist layer 617 may be subsequently removed, for example, by ashing.

Figure 3B:
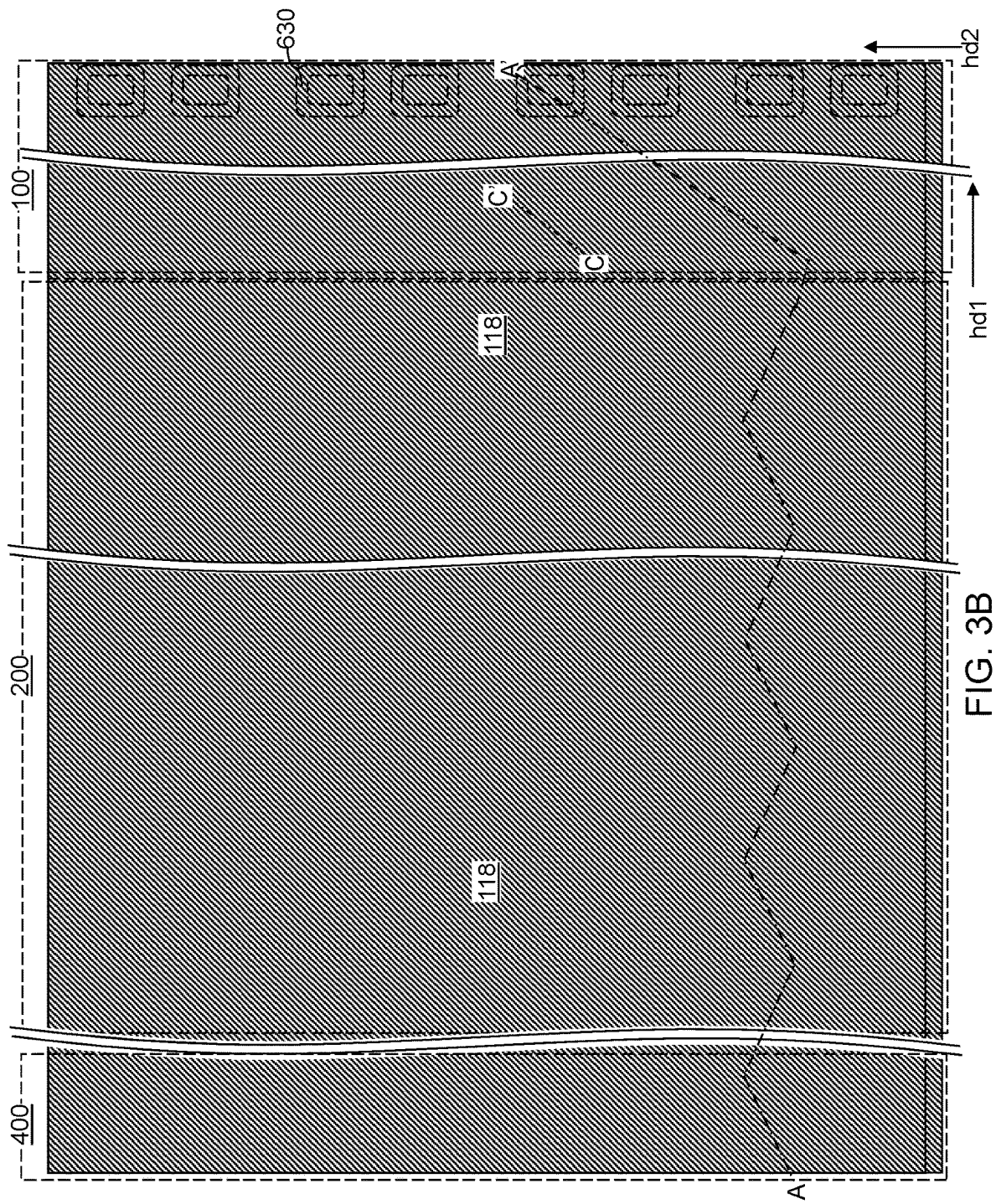
FIG. 3B is a top-down view of the first exemplary structure of FIG. 3A. The zig-zag vertical plane A-A' is the plane of the vertical cross-sectional view of FIG. 3A.
Figure 3C:
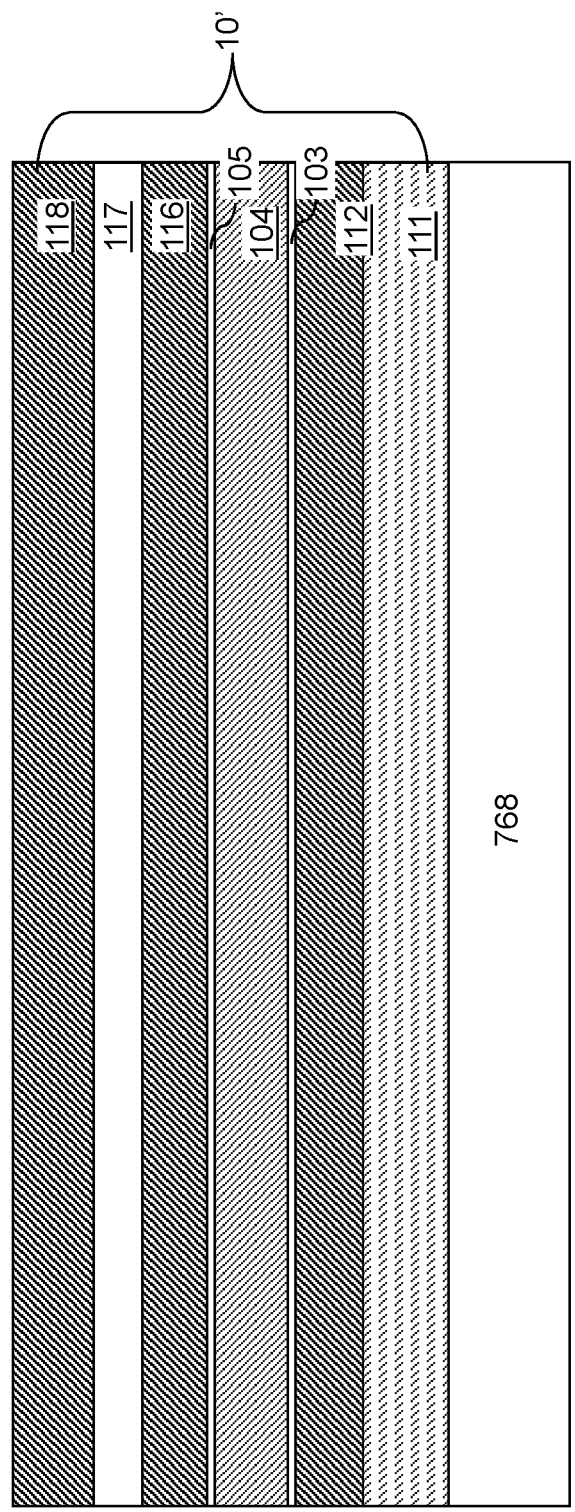
FIG. 3C is a vertical cross-sectional view of in-process source-level material layers along the vertical plane C-C' of FIG. 3B.

Referring to FIGS. 3A-3C, a dielectric material layer such as silicate glass may be deposited in the annular trenches 629 by a conformal or non-conformal deposition process. Optionally, a thin dielectric liner such as a silicon nitride liner may be used before deposition of the dielectric material layer. Excess portion of the dielectric material layer may be removed from above the horizontal plane including the top surface of the first hard mask layer 612 by a planarization process. The planarization process may use a recess etch process and/or a chemical mechanical planarization (CMP) process. The second hard mask layer 614 may be collaterally removed during the planarization process. Remaining portions of the dielectric material layer in the annular trenches 629 may be vertically recessed by a dry etch process (such as a reactive ion etch process) or by a wet etch process such that remaining portions of the dielectric material layer in the annular trenches 629 have top surfaces that are substantially coplanar with the top surface of the source-level sacrificial layer 104. Each remaining portion of the dielectric material layer that is located within a respective one of the annular trenches 629 constitutes an annular dielectric isolation structure 630. Each annular dielectric isolation structure 630 may be topologically homeomorphic to a torus, i.e., has a shape that may be continuously stretched to the shape of a torus without creating a new hole or destroying an existing hole. The annular dielectric isolation structure 630 vertically extend through the layer stack of the source-level sacrificial layer 104, the lower dielectric liner layer 103, and the lower source-level material layer 112, and contacts a top surface of a respective one of the dielectric material blocks 620.

A layer stack including an upper dielectric liner layer 105, an upper source-level material layer 116, a source-level insulating layer 117, and an optional source-select-level conductive layer 118 may be sequentially deposited.

The upper dielectric liner layer 105 include materials that may function as an etch stop material during removal of the source-level sacrificial layer 104. For example, the upper dielectric liner layer 105 may include silicon oxide, silicon nitride, and/or a dielectric metal oxide. In one embodiment, the upper dielectric liner layer 105 may include a silicon oxide layer having a thickness in a range from 2 nm to 30 nm, although lesser and greater thicknesses may also be used.

The upper source-level material layer 116 may include a doped semiconductor material such as doped polysilicon or doped amorphous silicon. The conductivity type of the upper source-level material layer 116 may be the opposite of the conductivity of vertical semiconductor channels to be subsequently formed. In other words, the upper source-level material layer 116 may have a doping of the second conductivity type. The thickness of the upper source-level material layer 116 may be in a range from 10 nm to 300 nm, such as from 20 nm to 150 nm, although lesser and greater thicknesses may also be used.

The source-level insulating layer 117 includes a dielectric material such as silicon oxide. The thickness of the source-level insulating layer 117 may be in a range from 20 nm to 400 nm, such as from 40 nm to 200 nm, although lesser and greater thicknesses may also be used.

The optional source-select-level conductive layer 118 may include a conductive material that may be used as a source-select-level gate electrode. For example, the optional source-select-level conductive layer 118 may include a doped semiconductor material such as doped polysilicon or doped amorphous silicon that may be subsequently converted into doped polysilicon by an anneal process. The thickness of the optional source-select-level conductive layer 118 may be in a range from 30 nm to 200 nm, such as from 60 nm to 100 nm, although lesser and greater thicknesses may also be used.

The layer stack including the doped semiconductor material underlayer 111, the lower source-level material layer 112, the lower dielectric liner layer 103, the source-level sacrificial layer 104, the upper dielectric liner layer 105, the upper source-level material layer 116, the source-level insulating layer 117, and the optional source-select-level conductive layer 118 constitutes an in-process source-level material layers 10', which is subsequently modified to form source-level material layers.

Generally, each annular dielectric isolation structure 630 may be formed over a respective one of the dielectric material block 620 such that the entire area of the annular dielectric isolation structure 630 is located within the periphery of the top surface of the underlying dielectric material block 620. In one embodiment, each annular dielectric isolation structure 630 may be formed directly on a top surface of an underlying dielectric material block 620.

Figure 4B:
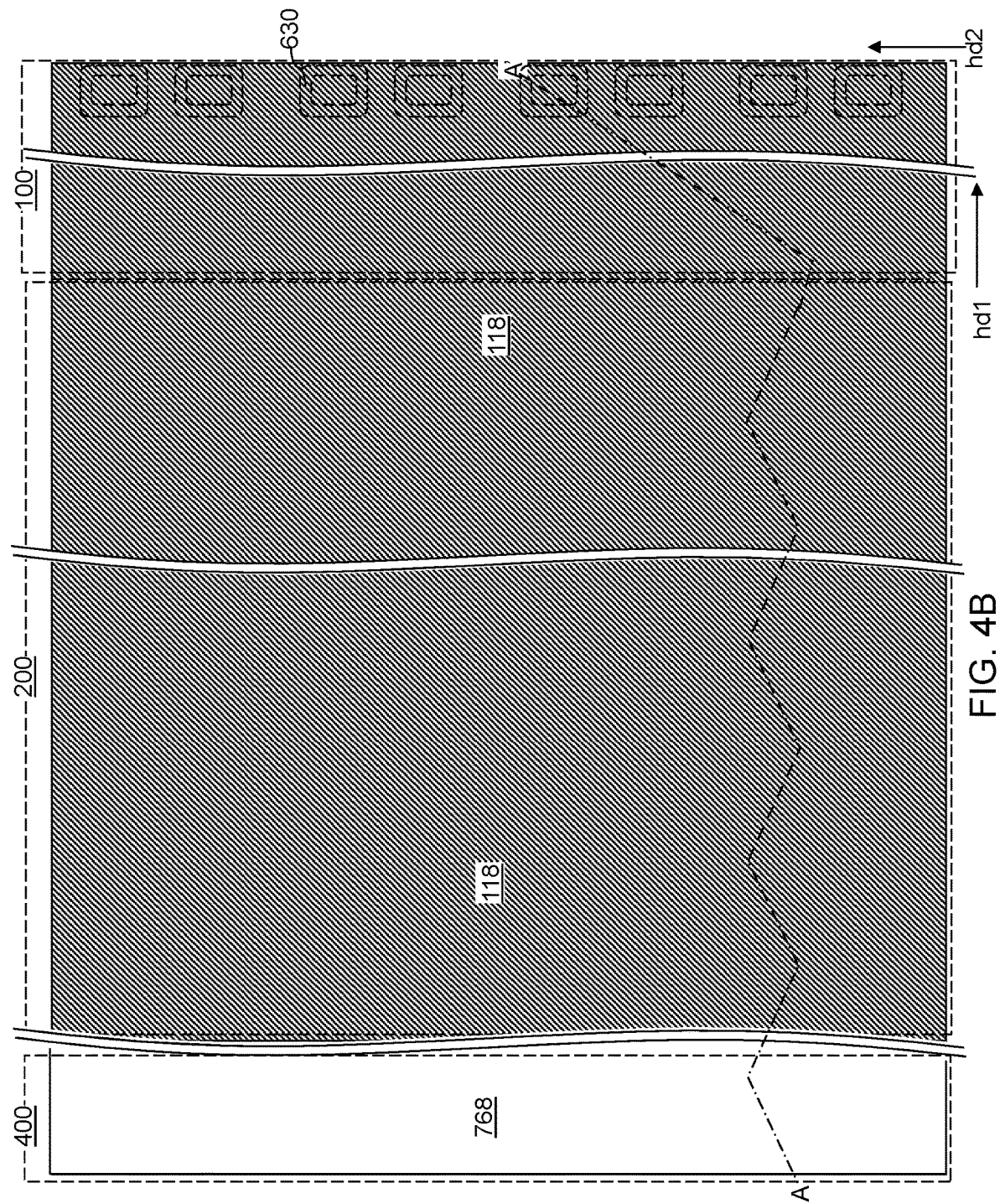
FIG. 4B is a top-down view of the first exemplary structure of FIG. 4A. The zig-zag vertical plane A-A' is the plane of the vertical cross-sectional view of FIG. 4A.

Referring to FIGS. 4A and 4B, the an in-process source-level material layers 10' may be patterned, and regions in which the an in-process source-level material layers 10' may be removed may be subsequently filled with an additional dielectric material such as silicon oxide. The additional dielectric material may be incorporated into the at least one second dielectric material layer 768. For example, portions of the an in-process source-level material layers 10' within the peripheral region 400 may be replaced with the additional material portions of the at least one second dielectric material layer 768.

Figure 5:
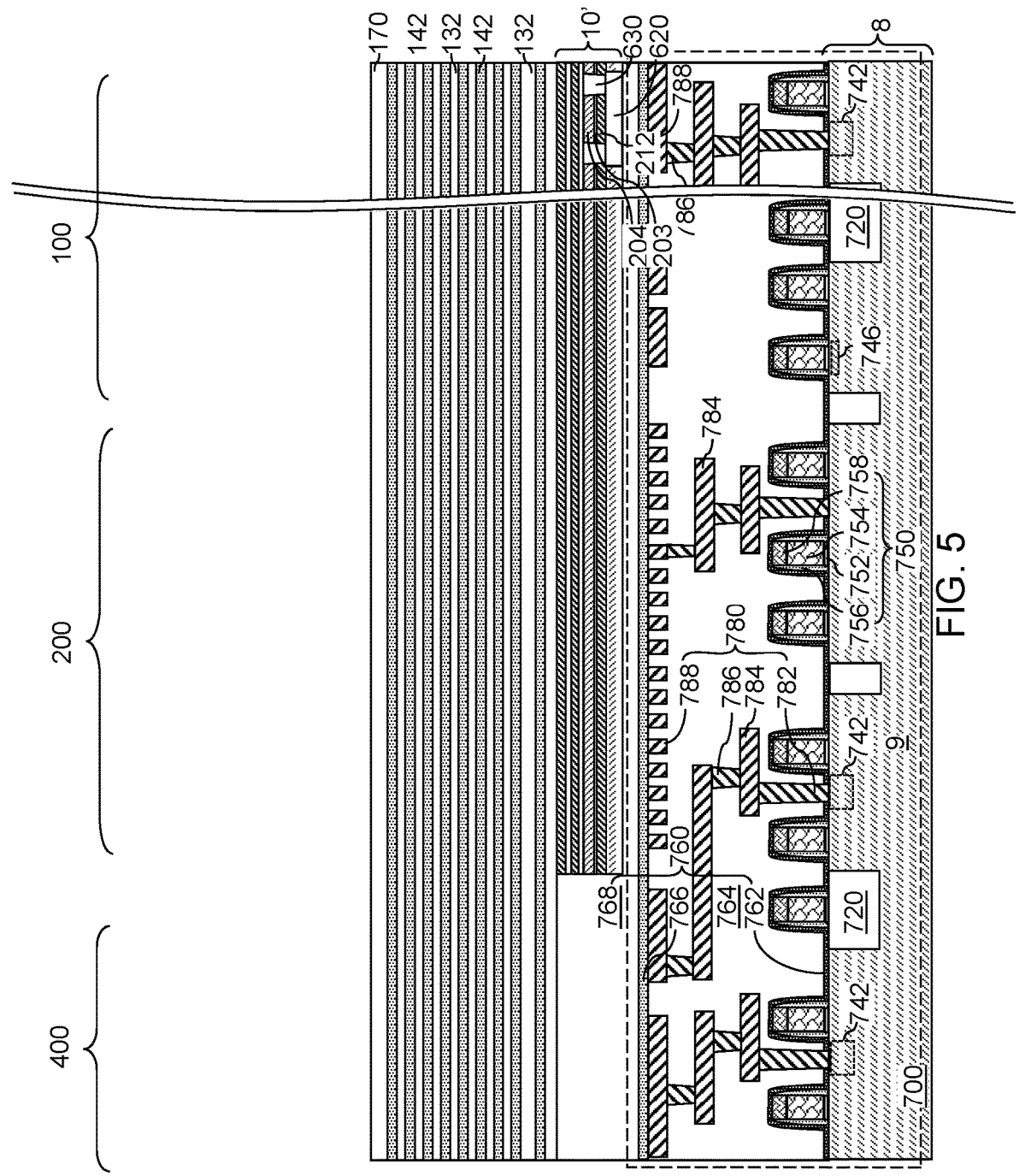
FIG. 5 is a vertical cross-sectional view of the first exemplary structure after formation of a first-tier alternating stack of first insulating layers and first spacer material layers according to the first embodiment of the present disclosure.

Referring to FIG. 5, an alternating stack of first material layers and second material layers may be subsequently formed. Each first material layer may include a first material, and each second material layer may include a second material that is different from the first material. In case at least another alternating stack of material layers is subsequently formed over the alternating stack of the first material layers and the second material layers, the alternating stack is herein referred to as a first-tier alternating stack. The level of the first-tier alternating stack is herein referred to as a first-tier level, and the level of the alternating stack to be subsequently formed immediately above the first-tier level is herein referred to as a second-tier level, etc.

The first-tier alternating stack may include first insulating layers 132 as the first material layers, and first spacer material layers as the second material layers. In one embodiment, the first spacer material layers may be sacrificial material layers that are subsequently replaced with electrically conductive layers. In another embodiment, the first spacer material layers may be electrically conductive layers that are not subsequently replaced with other layers. While the present disclosure is described using embodiments in which sacrificial material layers are replaced with electrically conductive layers, embodiments in which the spacer material layers are formed as electrically conductive layers (thereby obviating the need to perform replacement processes) are expressly contemplated herein.

In one embodiment, the first material layers and the second material layers may be first insulating layers 132 and first sacrificial material layers 142, respectively. In one embodiment, each first insulating layer 132 may include a first insulating material, and each first sacrificial material layer 142 may include a first sacrificial material. An alternating plurality of first insulating layers 132 and first sacrificial material layers 142 is formed over the in-process source-level material layers. As used herein, a "sacrificial material" refers to a material that is removed during a subsequent processing step.

As used herein, an alternating stack of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness throughout, or may have different thicknesses. The second elements may have the same thickness throughout, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

The first-tier alternating stack (132, 142) may include first insulating layers 132 composed of the first material, and first sacrificial material layers 142 composed of the second material, which is different from the first material. The first material of the first insulating layers 132 may be at least one insulating material. Insulating materials that may be used for the first insulating layers 132 include, but are not limited to silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the first insulating layers 132 may be silicon oxide.

The second material of the first sacrificial material layers 142 may be a sacrificial material that may be removed selective to the first material of the first insulating layers 132. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The first sacrificial material layers 142 may comprise an insulating material, a semiconductor material, or a conductive material. The second material of the first sacrificial material layers 142 may be subsequently replaced with electrically conductive electrodes which may function, for example, as control gate electrodes of a vertical NAND device. In one embodiment, the first sacrificial material layers 142 may be material layers that comprise silicon nitride.

In one embodiment, the first insulating layers 132 may include silicon oxide, and sacrificial material layers may include silicon nitride sacrificial material layers. The first material of the first insulating layers 132 may be deposited, for example, by chemical vapor deposition (CVD). For example, if silicon oxide is used for the first insulating layers 132, tetraethylorthosilicate (TEOS) may be used as the precursor material for the CVD process. The second material of the first sacrificial material layers 142 may be formed, for example, CVD or atomic layer deposition (ALD).

The thicknesses of the first insulating layers 132 and the first sacrificial material layers 142 may be in a range from 20 nm to 50 nm, although lesser and greater thicknesses may be used for each first insulating layer 132 and for each first sacrificial material layer 142. The number of repetitions of the pairs of a first insulating layer 132 and a first sacrificial material layer 142 may be in a range from 2 to 1,024, and typically from 8 to 256, although a greater number of repetitions may also be used. In one embodiment, each first sacrificial material layer 142 in the first-tier alternating stack (132, 142) may have a uniform thickness that is substantially invariant within each respective first sacrificial material layer 142.

A first insulating cap layer 170 may be subsequently formed over the alternating stack (132, 142). The first insulating cap layer 170 includes a dielectric material, which may be any dielectric material that may be used for the first insulating layers 132. In one embodiment, the first insulating cap layer 170 includes the same dielectric material as the first insulating layers 132. The thickness of the first insulating cap layer 170 may be in a range from 20 nm to 300 nm, although lesser and greater thicknesses may also be used.

Figure 6:
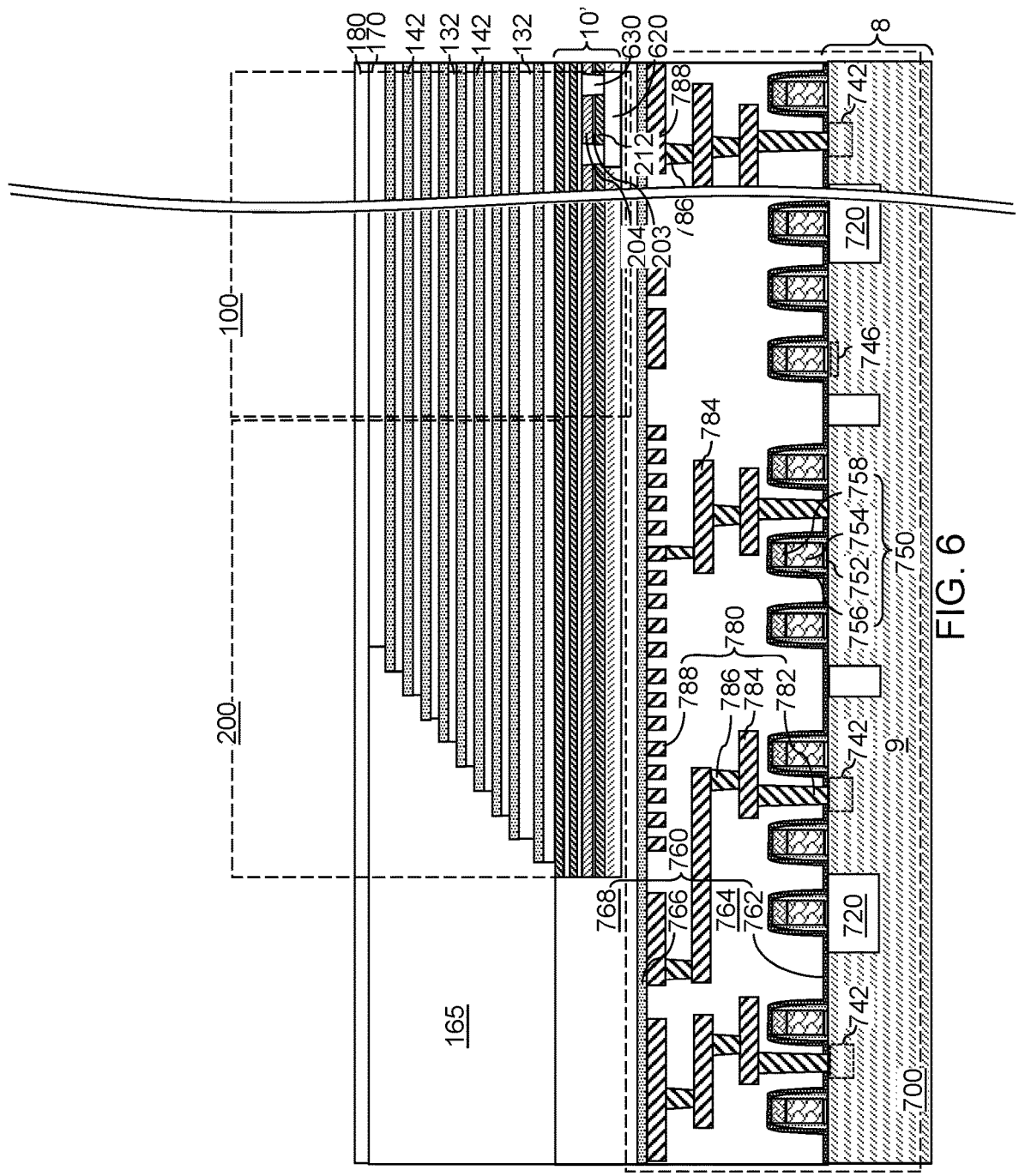
FIG. 6 is a vertical cross-sectional view of the first exemplary structure after patterning a first-tier staircase region, a first retro-stepped dielectric material portion, and an inter-tier dielectric layer according to the first embodiment of the present disclosure.

Referring to FIG. 6, the first insulating cap layer 170 and the first-tier alternating stack (132, 142) may be patterned to form first stepped surfaces in the staircase region 200. The staircase region 200 may include a respective first stepped area in which the first stepped surfaces are formed, and a second stepped area in which additional stepped surfaces are to be subsequently formed in a second-tier structure (to be subsequently formed over a first-tier structure) and/or additional tier structures. The first stepped surfaces may be formed, for example, by forming a mask layer with an opening therein, etching a cavity within the levels of the first insulating cap layer 170, and iteratively expanding the etched area and vertically recessing the cavity by etching each pair of a first insulating layer 132 and a first sacrificial material layer 142 located directly underneath the bottom surface of the etched cavity within the etched area. In one embodiment, top surfaces of the first sacrificial material layers 142 may be physically exposed at the first stepped surfaces. The cavity overlying the first stepped surfaces is herein referred to as a first stepped cavity.

A dielectric fill material (such as undoped silicate glass or doped silicate glass) may be deposited to fill the first stepped cavity. Excess portions of the dielectric fill material may be removed from above the horizontal plane including the top surface of the first insulating cap layer 170. A remaining portion of the dielectric fill material that fills the region overlying the first stepped surfaces constitute a first retro-stepped dielectric material portion 165. As used herein, a "retro-stepped" element refers to an element that has stepped surfaces and a horizontal cross-sectional area that increases monotonically as a function of a vertical distance from a top surface of a substrate on which the element is present. The first-tier alternating stack (132, 142) and the first retro-stepped dielectric material portion 165 collectively constitute a first-tier structure, which is an in-process structure that is subsequently modified.

An inter-tier dielectric layer 180 may be optionally deposited over the first-tier structure (132, 142, 170, 165). The inter-tier dielectric layer 180 includes a dielectric material such as silicon oxide. In one embodiment, the inter-tier dielectric layer 180 may include a doped silicate glass having a greater etch rate than the material of the first insulating layers 132 (which may include an undoped silicate glass). For example, the inter-tier dielectric layer 180 may include phosphosilicate glass. The thickness of the inter-tier dielectric layer 180 may be in a range from 30 nm to 300 nm, although lesser and greater thicknesses may also be used.

Figure 7A:
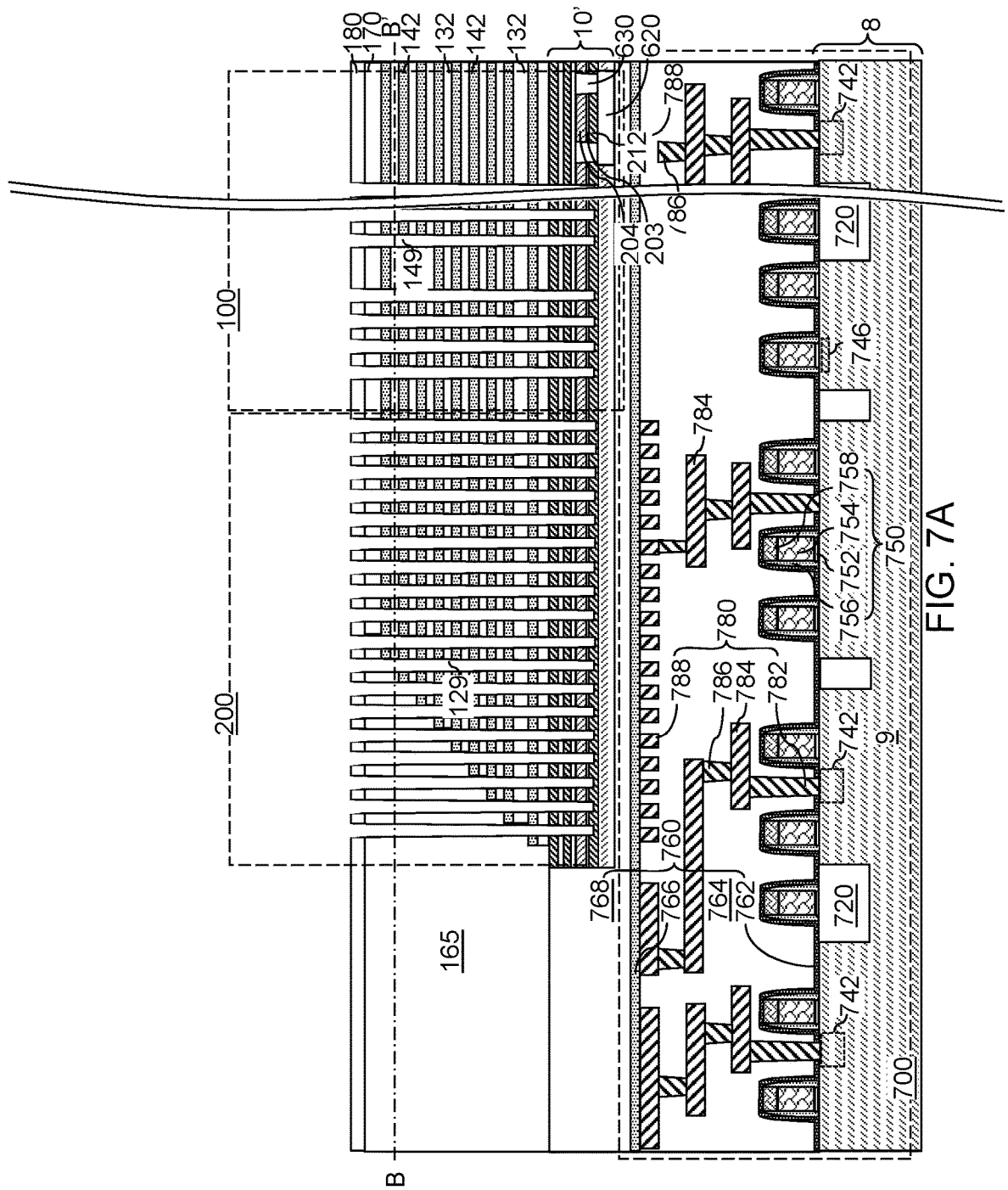
FIG. 7A is a vertical cross-sectional view of the first exemplary structure after formation of first-tier memory openings and first-tier support openings according to the first embodiment of the present disclosure.
Figure 7B:
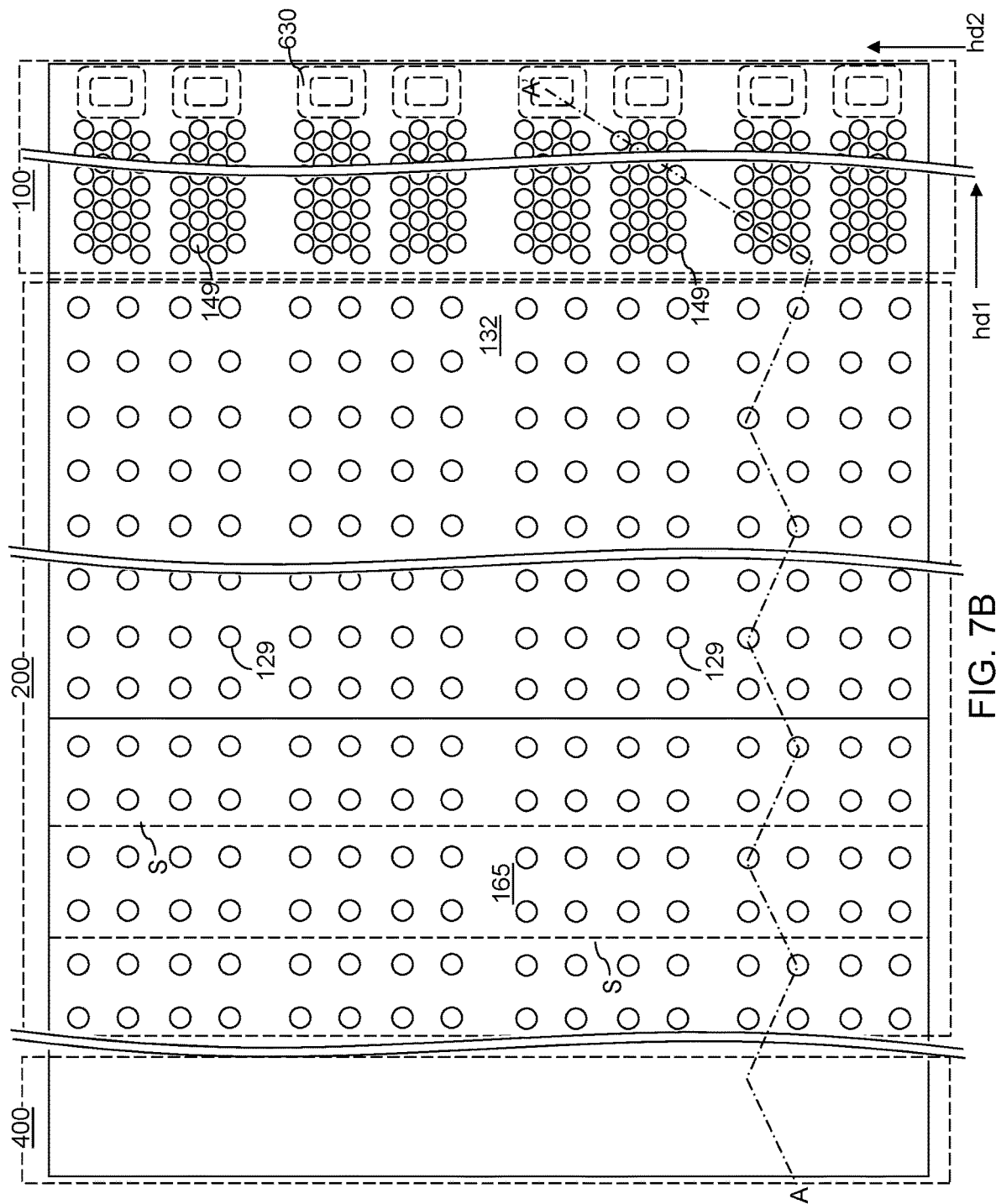
FIG. 7B is a top-down view of the first exemplary structure of FIG. 7A. The zig-zag vertical plane A-A' corresponds to the plane of the vertical cross-sectional view of FIG. 7A.

Referring to FIGS. 7A, 7B, and 8A, first-tier openings (149, 129) may be formed through the inter-tier dielectric layer 180 and the first-tier structure (132, 142, 170, 165) and partly through the in-process source-level material layers 10'. For example, a photoresist layer (not shown) may be applied over the inter-tier dielectric layer 180, and may be lithographically patterned to form various openings therethrough. The pattern of openings in the photoresist layer may be transferred through the inter-tier dielectric layer 180 and the first-tier structure (132, 142, 170, 165) and partly through the in-process source-level material layers 10' by a first anisotropic etch process to form the first-tier openings (149, 129) concurrently, i.e., during the first anisotropic etch process.

The first-tier openings (149, 129) may include first-tier memory openings 149 and first-tier support openings 129. The first-tier memory openings 149 are openings that are formed in the memory array region 100 through each layer within the first alternating stack (132, 142) and are subsequently used to form memory stack structures therein. The bottom surfaces of the first-tier openings (149, 129) may be a recessed surface of the source-level sacrificial layer 104. Thus, each first-tier opening (149, 129) may have a bottom surface between a horizontal plane including the bottom surface of the source-level sacrificial layer 104 and a horizontal plane including the top surface of the source-level sacrificial layer 104.

The first-tier support openings 129 may be openings that are formed in the staircase region 200 and are subsequently used to form support structures that are used to provide structural support to the second exemplary structure during replacement of sacrificial material layers with electrically conductive layers. In embodiments in which the first spacer materials are formed as first electrically conductive layers, the first-tier support openings 129 may be omitted. A subset of the first-tier support openings 129 may be formed through horizontal surfaces of the first stepped surfaces of the first alternating stack (132, 142).

In one embodiment, the first-tier memory openings 149 may be formed as clusters that are laterally spaced from one another along the second horizontal direction hd2. Each cluster of first-tier memory openings 149 may include a respective two-dimensional array of first-tier memory openings 149 having a first pitch along one horizontal direction and a second pitch along another horizontal direction. In one embodiment, the direction of the first memory structure pitch may be the first horizontal direction (e.g., word line direction) hd1 and the direction of the second memory structure pitch may be the second horizontal direction (e.g., bit line direction) hd2, or vice versa.

The inter-tier dielectric layer 180 may comprise a dielectric material (such as borosilicate glass) having a greater etch rate than the first insulating layers 132 (that may include undoped silicate glass). In one embodiment, the bottom surface of each first-tier memory opening 149 may be formed between the top surface and the bottom surface of the source-level sacrificial layer 104. In this case, surfaces of the source-level sacrificial layer 104 may be exposed at a bottom portion of each first-tier memory opening 149.

Referring to FIG. 8B, an isotropic etch (such as a wet etch using HF) may be used to expand the lateral dimensions of the first-tier memory openings 149 at the level of the inter-tier dielectric layer 180. The portions of the first-tier memory openings 149 located at the level of the inter-tier dielectric layer 180 may be optionally widened to provide a larger landing pad for second-tier memory openings to be subsequently formed through a second-tier alternating stack (to be subsequently formed prior to formation of the second-tier memory openings).

Figure 9:
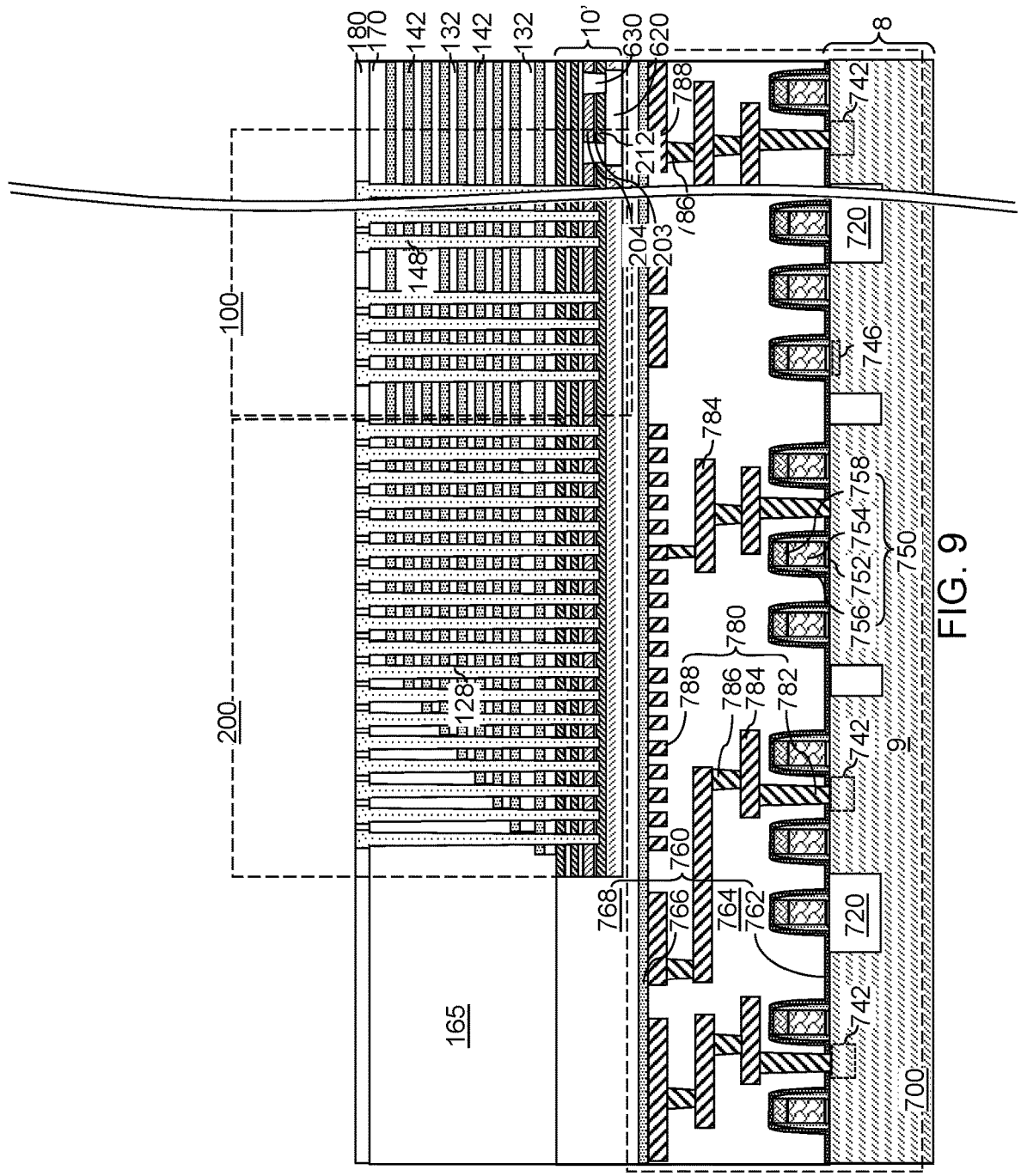
FIG. 9 is a vertical cross-sectional view of the first exemplary structure after formation of sacrificial memory opening fill portions and first-tier support opening fill portions according to the first embodiment of the present disclosure.

Referring to FIG. 9, sacrificial first-tier opening fill portions (148, 128) may be formed in the first-tier openings (149, 129). For example, a sacrificial fill material may be deposited concurrently in each of the first-tier openings (149, 129). The sacrificial fill material includes a material that may be subsequently removed selective to the materials of the first insulating layers 132 and the first sacrificial material layers 142.

In one embodiment, the sacrificial fill material may include a semiconductor material such as silicon (e.g., a-Si or polysilicon), a silicon-germanium alloy, germanium, a III-V compound semiconductor material, or a combination thereof. Optionally, a thin etch stop layer (such as a silicon oxide layer or a silicon nitride layer having a thickness in a range from 1 nm to 3 nm) may be used prior to depositing the sacrificial first-tier fill material. The sacrificial fill material may be formed by a non-conformal deposition or a conformal deposition method.

In another embodiment, the sacrificial fill material may include a silicon oxide material having a higher etch rate than the materials of the first insulating layers 132, the first insulating cap layer 170, and the inter-tier insulating layer 180. For example, the sacrificial fill material may include borosilicate glass or porous or non-porous organosilicate glass having an etch rate that is at least 100 times higher than the etch rate of densified TEOS oxide (i.e., a silicon oxide material formed by decomposition of tetraethylorthosilicate glass in a chemical vapor deposition process and subsequently densified in an anneal process) in a 100:1 dilute hydrofluoric acid. In this case, a thin etch stop layer (such as a silicon nitride layer having a thickness in a range from 1 nm to 3 nm) may be used prior to depositing the sacrificial first-tier fill material. The sacrificial fill material may be formed by a non-conformal deposition or a conformal deposition method.

In yet another embodiment, the sacrificial fill material may include a carbon-containing material (such as amorphous carbon or diamond-like carbon) that may be subsequently removed by ashing, or a silicon-based polymer that may be subsequently removed selective to the materials of the first alternating stack (132, 142).

Portions of the deposited sacrificial fill material may be removed from above the topmost layer of the first-tier alternating stack (132, 142), such as from above the inter-tier dielectric layer 180. For example, the sacrificial fill material may be recessed to a top surface of the inter-tier dielectric layer 180 using a planarization process. The planarization process may include a recess etch, chemical mechanical planarization (CMP), or a combination thereof. The top surface of the inter-tier dielectric layer 180 may be used as an etch stop layer or a planarization stop layer.

Remaining portions of the sacrificial fill material comprise sacrificial first-tier opening fill portions (148, 128). Specifically, each remaining portion of the sacrificial material in a first-tier memory opening 149 constitutes a sacrificial first-tier memory opening fill portion 148. Each remaining portion of the sacrificial material in a first-tier support opening 129 constitutes a sacrificial first-tier support opening fill portion 128. The top surfaces of the sacrificial first-tier opening fill portions (148, 128) may be coplanar with the top surface of the inter-tier dielectric layer 180. Each of the sacrificial first-tier opening fill portions (148, 128) may, or may not, include cavities therein.

Figure 10:
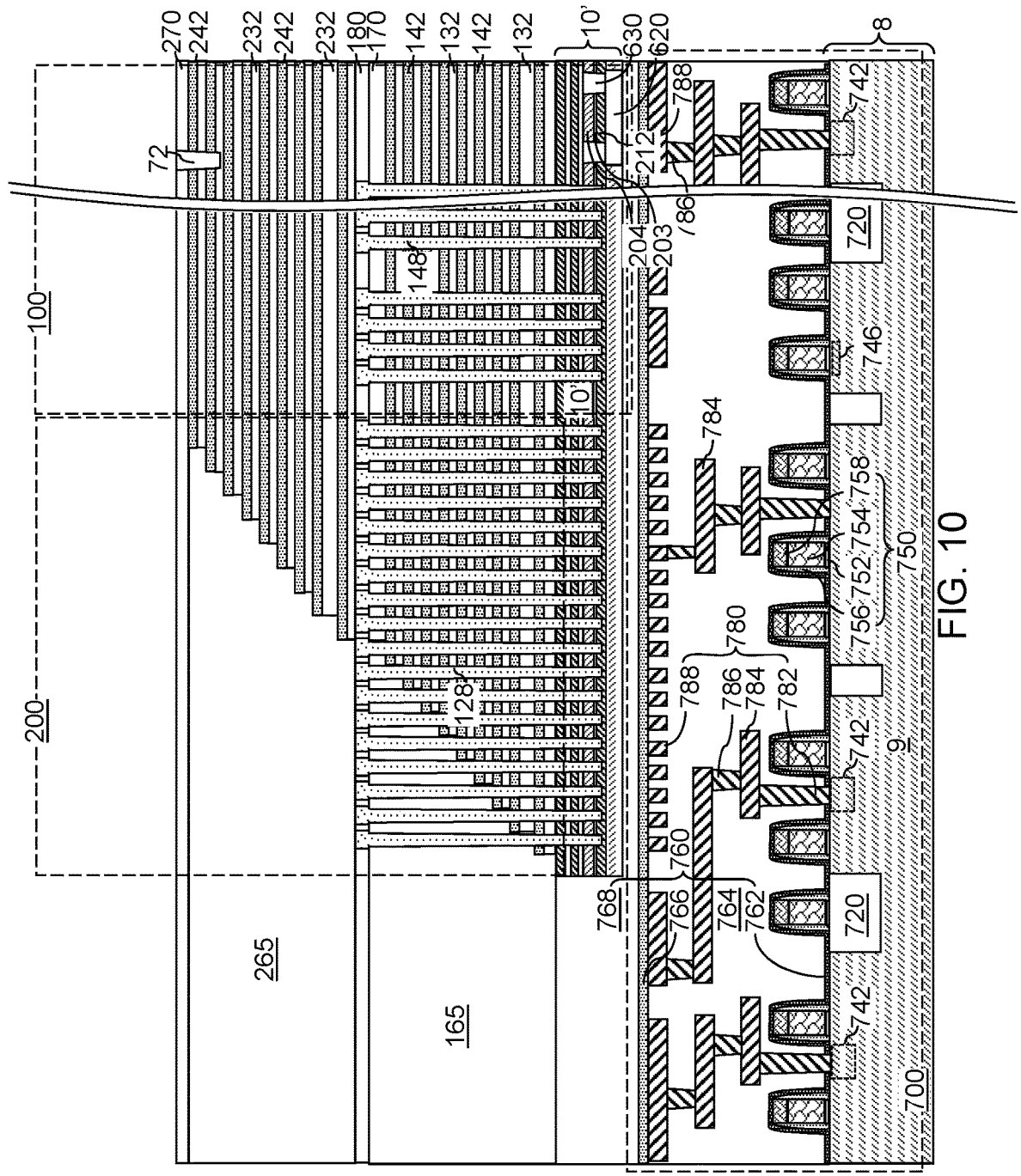
FIG. 10 is a vertical cross-sectional view of the first exemplary structure after formation of a second-tier alternating stack of second insulating layers and second spacer material layers, second stepped surfaces, a second retro-stepped dielectric material portion, and drain-select-level isolation structures according to the first embodiment of the present disclosure.

Referring to FIG. 10, a second-tier structure may be formed over the first-tier structure (132, 142, 170, 165, 148, 128). The second-tier structure may include an additional alternating stack of insulating layers and spacer material layers, which may be sacrificial material layers. For example, a second alternating stack (232, 242) of material layers may be subsequently formed on the top surface of the first alternating stack (132, 142). The second stack (232, 242) includes an alternating plurality of third material layers and fourth material layers. Each third material layer may include a third material, and each fourth material layer may include a fourth material that is different from the third material. In one embodiment, the third material may be the same as the first material of the first insulating layer 132, and the fourth material may be the same as the second material of the first sacrificial material layers 142.

In one embodiment, the third material layers may be second insulating layers 232 and the fourth material layers may be second spacer material layers that provide vertical spacing between each vertically neighboring pair of the second insulating layers 232. In one embodiment, the third material layers and the fourth material layers may be second insulating layers 232 and second sacrificial material layers 242, respectively. The third material of the second insulating layers 232 may be at least one insulating material. The fourth material of the second sacrificial material layers 242 may be a sacrificial material that may be removed selective to the third material of the second insulating layers 232. The second sacrificial material layers 242 may comprise an insulating material, a semiconductor material, or a conductive material. The fourth material of the second sacrificial material layers 242 may be subsequently replaced with electrically conductive electrodes which may function, for example, as control gate electrodes of a vertical NAND device.

In one embodiment, each second insulating layer 232 may include a second insulating material, and each second sacrificial material layer 242 may include a second sacrificial material. In this case, the second stack (232, 242) may include an alternating plurality of second insulating layers 232 and second sacrificial material layers 242. The third material of the second insulating layers 232 may be deposited, for example, by chemical vapor deposition (CVD). The fourth material of the second sacrificial material layers 242 may be formed, for example, CVD or atomic layer deposition (ALD).

The third material of the second insulating layers 232 may be at least one insulating material. Insulating materials that may be used for the second insulating layers 232 may be any material that may be used for the first insulating layers 132. The fourth material of the second sacrificial material layers 242 is a sacrificial material that may be removed selective to the third material of the second insulating layers 232. Sacrificial materials that may be used for the second sacrificial material layers 242 may be any material that may be used for the first sacrificial material layers 142. In one embodiment, the second insulating material may be the same as the first insulating material, and the second sacrificial material may be the same as the first sacrificial material.

The thicknesses of the second insulating layers 232 and the second sacrificial material layers 242 may be in a range from 20 nm to 50 nm, although lesser and greater thicknesses may be used for each second insulating layer 232 and for each second sacrificial material layer 242. The number of repetitions of the pairs of a second insulating layer 232 and a second sacrificial material layer 242 may be in a range from 2 to 1,024, and typically from 8 to 256, although a greater number of repetitions may also be used. In one embodiment, each second sacrificial material layer 242 in the second stack (232, 242) may have a uniform thickness that is substantially invariant within each respective second sacrificial material layer 242.

Second stepped surfaces may be formed in the second stepped area of the staircase region 200 using a same set of processing steps as the processing steps used to form the first stepped surfaces in the first stepped area with suitable adjustment to the pattern of at least one masking layer. A second retro-stepped dielectric material portion 265 may be formed over the second stepped surfaces in the staircase region 200.

A second insulating cap layer 270 may be subsequently formed over the second alternating stack (232, 242) and the second retro-stepped dielectric material portion 265. The second insulating cap layer 270 includes a dielectric material that is different from the material of the second sacrificial material layers 242. In one embodiment, the second insulating cap layer 270 may include silicon oxide. In one embodiment, the first and second sacrificial material layers (142, 242) may comprise silicon nitride.

Optionally, drain-select-level isolation structures 72 may be formed through the second insulating cap layer 270 and through a subset of layers in an upper portion of the second-tier alternating stack (232, 242). The second sacrificial material layers 242 that are cut by the select-drain-level shallow trench isolation structures 72 correspond to the levels in which drain-select-level electrically conductive layers are subsequently formed. The drain-select-level isolation structures 72 include a dielectric material such as silicon oxide. The drain-select-level isolation structures 72 may laterally extend along a first horizontal direction hd1, and may be laterally spaced apart along a second horizontal direction hd2 that is perpendicular to the first horizontal direction hd1.

Generally speaking, at least one alternating stack of insulating layers (132, 232) and spacer material layers (such as sacrificial material layers (142, 242)) may be formed over the in-process source-level material layers 10', and at least one retro-stepped dielectric material portion (165, 265) may be formed over the staircase regions on the at least one alternating stack (132, 142, 232, 242).

Figure 11A:
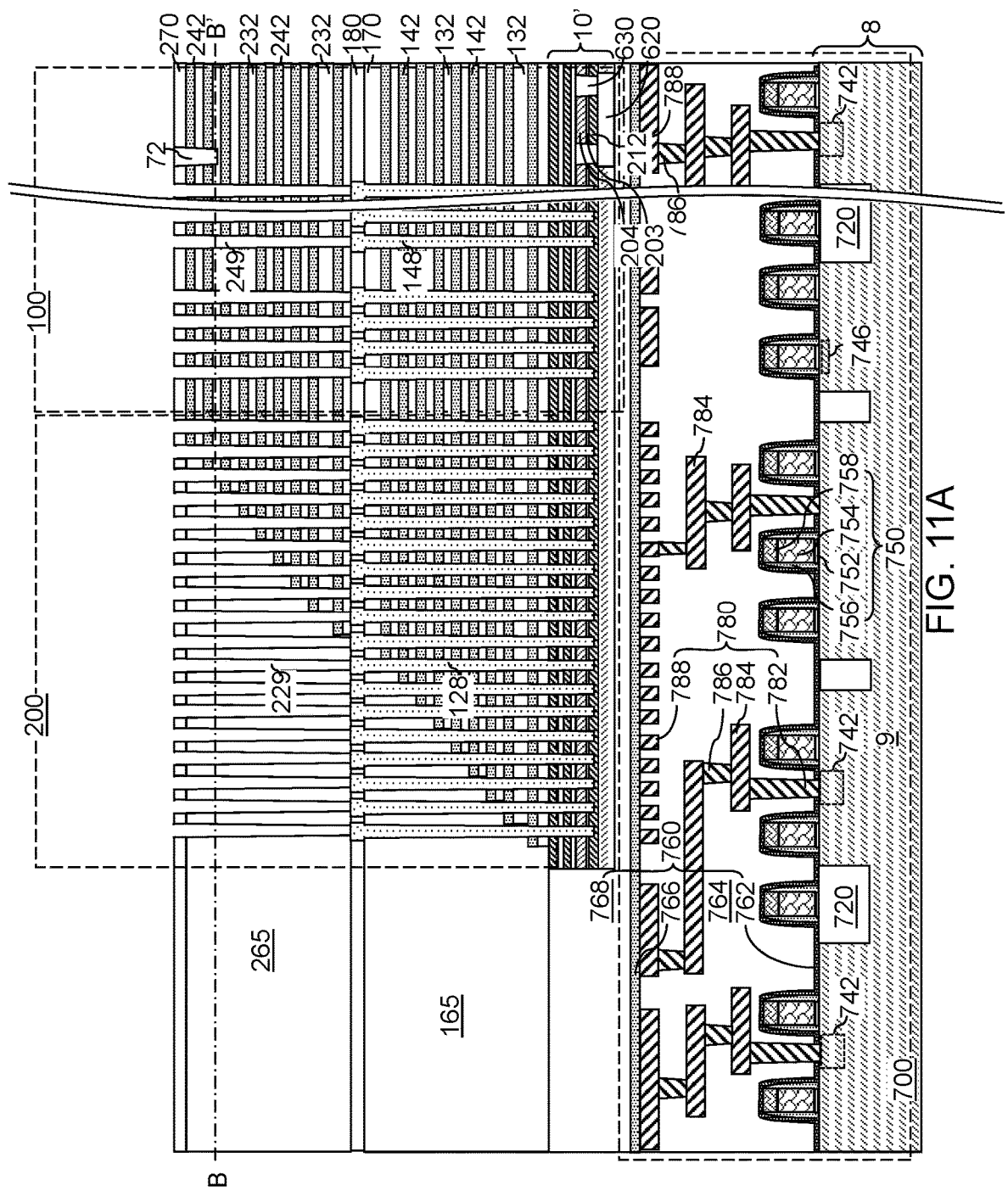
FIG. 11A is a vertical cross-sectional view of the first exemplary structure after formation of second-tier memory openings and second-tier support openings according to the first embodiment of the present disclosure.
Figure 11B:
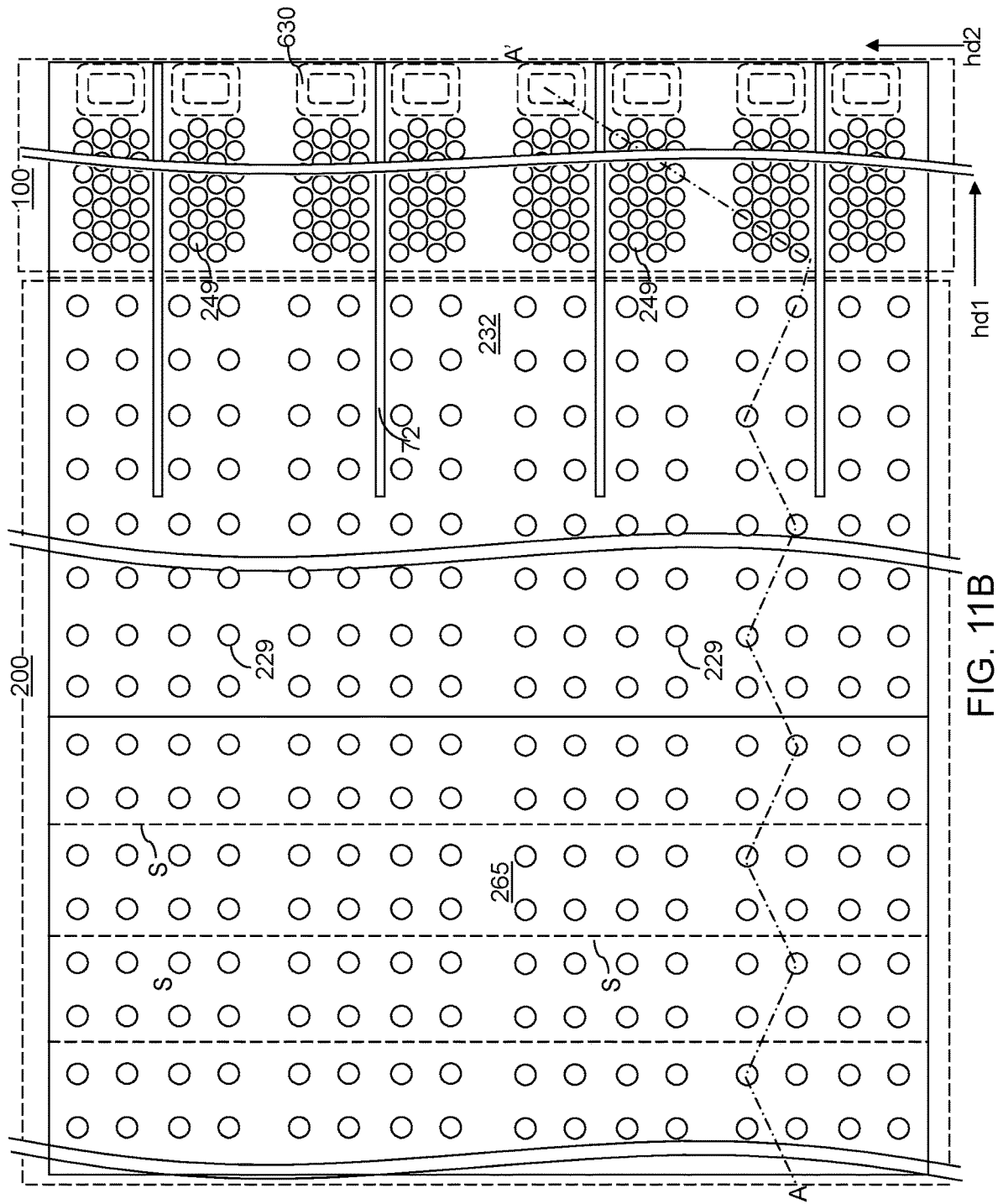
FIG. 11B is a horizontal cross-sectional of the first exemplary structure along the horizontal plane B-B' of FIG. 11A. The zig-zag vertical plane A-A' corresponds to the plane of the vertical cross-sectional view of FIG. 11A.

Referring to FIGS. 11A and 11B, second-tier openings (249, 229) may be formed through the second-tier structure (232, 242, 265, 270, 72). A photoresist layer (not shown) may be applied over the second insulating cap layer 270, and may be lithographically patterned to form various openings therethrough. The pattern of the openings may be the same as the pattern of the various first-tier openings (149, 129), which is the same as the sacrificial first-tier opening fill portions (148, 128). Thus, the lithographic mask used to pattern the first-tier openings (149, 129) may be used to pattern the photoresist layer.

The pattern of openings in the photoresist layer may be transferred through the second-tier structure (232, 242, 265, 270, 72) by a second anisotropic etch process to form second-tier openings (249, 229) concurrently, i.e., during the second anisotropic etch process. The second-tier openings (249, 229) may include second-tier memory openings 249 and second-tier support openings.

The second-tier memory openings 249 may be formed directly on a top surface of a respective one of the sacrificial first-tier memory opening fill portions 148. The second-tier support openings 229 may be formed directly on a top surface of a respective one of the sacrificial first-tier support opening fill portions 128. Locations of steps S in the first-tier alternating stack (132, 142) and the second-tier alternating stack (232, 242) are illustrated as dotted lines in FIG. 8B.

Figure 12:
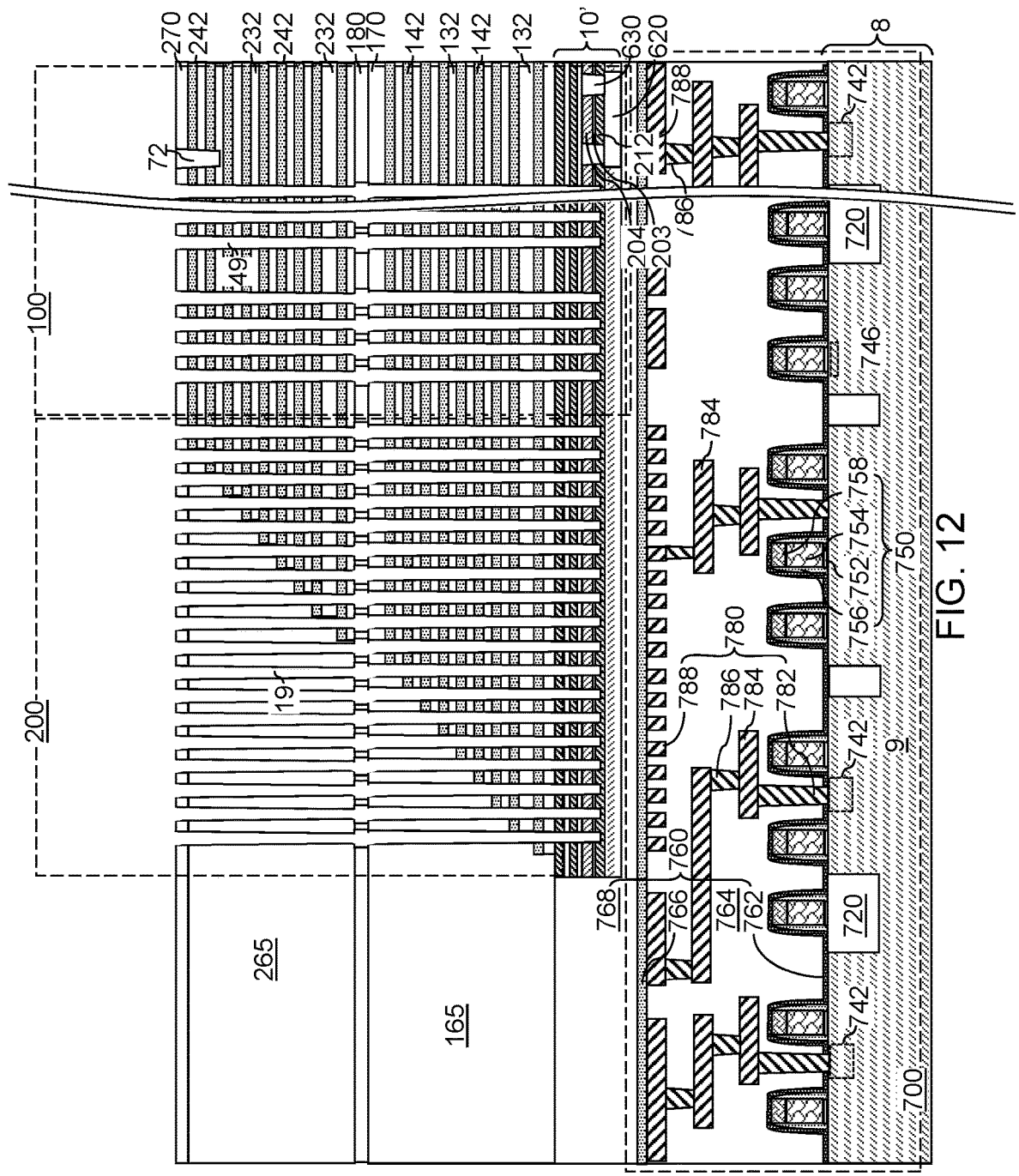
FIG. 12 is a vertical cross-sectional view of the first exemplary structure after formation of inter-tier memory openings and inter-tier support openings according to the first embodiment of the present disclosure.

Referring to FIG. 12, the sacrificial fill material may be removed from underneath the second-tier memory openings 249 and the second-tier support openings 229 using an etch process that etches the sacrificial fill material selective to the materials of the first and second insulating layers (132, 232), the first and second sacrificial material layers (142, 242), the first and second insulating cap layers (170, 270), and the inter-tier dielectric layer 180. A memory opening 49, which is also referred to as an inter-tier memory opening 49, may be formed in each volume from which a sacrificial first-tier memory opening fill portion 148 is removed. A support opening 19, which is also referred to as an inter-tier support opening 19, may be formed in each volume from which a sacrificial first-tier support opening fill portion 128 is removed.

Referring to FIG. 13A, a memory opening 49 in the first exemplary device structure of FIG. 9 is illustrated. The memory opening 49 extends through the first-tier structure and the second-tier structure.

Referring to FIG. 13B, a stack of layers including a blocking dielectric layer 52, a charge storage layer 54, a tunneling dielectric layer 56, and a semiconductor channel material layer 60L may be sequentially deposited in the memory openings 49. The blocking dielectric layer 52 may include a single dielectric material layer or a stack of a plurality of dielectric material layers. In one embodiment, the blocking dielectric layer may include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 may include a dielectric metal oxide having a dielectric constant greater than 7.9, i.e., having a dielectric constant greater than the dielectric constant of silicon nitride. The thickness of the dielectric metal oxide layer may be in a range from 1 nm to 20 nm, although lesser and greater thicknesses may also be used. The dielectric metal oxide layer may subsequently function as a dielectric material portion that blocks leakage of stored electrical charges to control gate electrodes. In one embodiment, the blocking dielectric layer 52 includes aluminum oxide. Alternatively, or additionally, the blocking dielectric layer 52 may include a dielectric semiconductor compound such as silicon oxide, silicon oxynitride, silicon nitride, or a combination thereof.

Subsequently, the charge storage layer 54 may be formed. In one embodiment, the charge storage layer 54 may be a continuous layer or patterned discrete portions of a charge trapping material including a dielectric charge trapping material, which may be, for example, silicon nitride. Alternatively, the charge storage layer 54 may include a continuous layer or patterned discrete portions of a conductive material such as doped polysilicon or a metallic material that is patterned into multiple electrically isolated portions (e.g., floating gates), for example, by being formed within lateral recesses into sacrificial material layers (142, 242). In one embodiment, the charge storage layer 54 includes a silicon nitride layer. In one embodiment, the sacrificial material layers (142, 242) and the insulating layers (132, 232) may have vertically coincident sidewalls, and the charge storage layer 54 may be formed as a single continuous layer. As used herein, a first surface and a second surface are "vertically coincident" if there exists the second surface that overlies or underlies the first surface and if there exists a vertical plane that intersects both the first surface and the second surface. Alternatively, the sacrificial material layers (142, 242) may be laterally recessed with respect to the sidewalls of the insulating layers (132, 232), and a combination of a deposition process and an anisotropic etch process may be used to form the charge storage layer 54 as a plurality of memory material portions that are vertically spaced apart. The thickness of the charge storage layer 54 may be in a range from 2 nm to 20 nm, although lesser and greater thicknesses may also be used.

The tunneling dielectric layer 56 includes a dielectric material through which charge tunneling may be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 may include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 may include a stack of a first silicon oxide layer, a silicon oxynitride layer, and a second silicon oxide layer, which is commonly known as an ONO stack. In one embodiment, the tunneling dielectric layer 56 may include a silicon oxide layer that is substantially free of carbon or a silicon oxynitride layer that is substantially free of carbon. The thickness of the tunneling dielectric layer 56 may be in a range from 2 nm to 20 nm, although lesser and greater thicknesses may also be used. The stack of the blocking dielectric layer 52, the charge storage layer 54, and the tunneling dielectric layer 56 constitutes a memory film 50 that stores memory bits.

The semiconductor channel material layer 60L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the semiconductor channel material layer 60L includes amorphous silicon or polysilicon. The semiconductor channel material layer 60L may be formed by a conformal deposition method such as low pressure chemical vapor deposition (LPCVD). The thickness of the semiconductor channel material layer 60L may be in a range from 2 nm to 10 nm, although lesser and greater thicknesses may also be used. A cavity 49 is formed in the volume of each memory opening 49 that is not filled with the deposited material layers (52, 54, 56, 60L).

Referring to FIG. 13C, in embodiments in which the cavity 49 in each memory opening is not completely filled by the semiconductor channel material layer 60L, a dielectric core layer may be deposited in the cavity 49 to fill any remaining portion of the cavity 49 within each memory opening. The dielectric core layer includes a dielectric material such as silicon oxide or organosilicate glass. The dielectric core layer may be deposited by a conformal deposition method such as low pressure chemical vapor deposition (LPCVD), or by a self-planarizing deposition process such as spin coating. The horizontal portion of the dielectric core layer overlying the second insulating cap layer 270 may be removed, for example, by a recess etch. The recess etch continues until top surfaces of the remaining portions of the dielectric core layer are recessed to a height between the top surface of the second insulating cap layer 270 and the bottom surface of the second insulating cap layer 270. Each remaining portion of the dielectric core layer constitutes a dielectric core 62.

Referring to FIG. 13D, a doped semiconductor material may be deposited in cavities overlying the dielectric cores 62. The doped semiconductor material has a doping of the opposite conductivity type of the doping of the semiconductor channel material layer 60L. Thus, the doped semiconductor material has a doping of the second conductivity type. Portions of the deposited doped semiconductor material, the semiconductor channel material layer 60L, the tunneling dielectric layer 56, the charge storage layer 54, and the blocking dielectric layer 52 that overlie the horizontal plane including the top surface of the second insulating cap layer 270 may be removed by a planarization process such as a chemical mechanical planarization (CMP) process.

Each remaining portion of the doped semiconductor material having a doping of the second conductivity type constitutes a drain region 63. The drain regions 63 may have a doping of a second conductivity type that is the opposite of the first conductivity type. For example, if the first conductivity type is p-type, the second conductivity type is n-type, and vice versa. The dopant concentration in the drain regions 63 may be in a range from $5.0 \times 10^{19}/cm^3$ to $2.0 \times 10^{21}/cm^3$, although lesser and greater dopant concentrations may also be used. The doped semiconductor material may be, for example, doped polysilicon.

Each remaining portion of the semiconductor channel material layer 60L constitutes a vertical semiconductor channel 60 through which electrical current may flow when a vertical NAND device including the vertical semiconductor channel 60 is turned on. A tunneling dielectric layer 56 is surrounded by a charge storage layer 54, and laterally surrounds a vertical semiconductor channel 60. Each adjoining set of a blocking dielectric layer 52, a charge storage layer 54, and a tunneling dielectric layer 56 collectively constitute a memory film 50, which may store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Each combination of a memory film 50 and a vertical semiconductor channel 60 within a memory opening 49 constitutes a memory stack structure 55. The memory stack structure 55 is a combination of a vertical semiconductor channel 60, a tunneling dielectric layer 56, a plurality of memory elements comprises portions of the charge storage layer 54, and an optional blocking dielectric layer 52. Each combination of a memory stack structure 55, a dielectric core 62, and a drain region 63 within a memory opening 49 constitutes a memory opening fill structure 58. The in-process source-level material layers 10', the first-tier structure (132, 142, 170, 165), the second-tier structure (232, 242, 270, 265, 72), the inter-tier dielectric layer 180, and the memory opening fill structures 58 collectively constitute a memory-level assembly.

Figure 14:
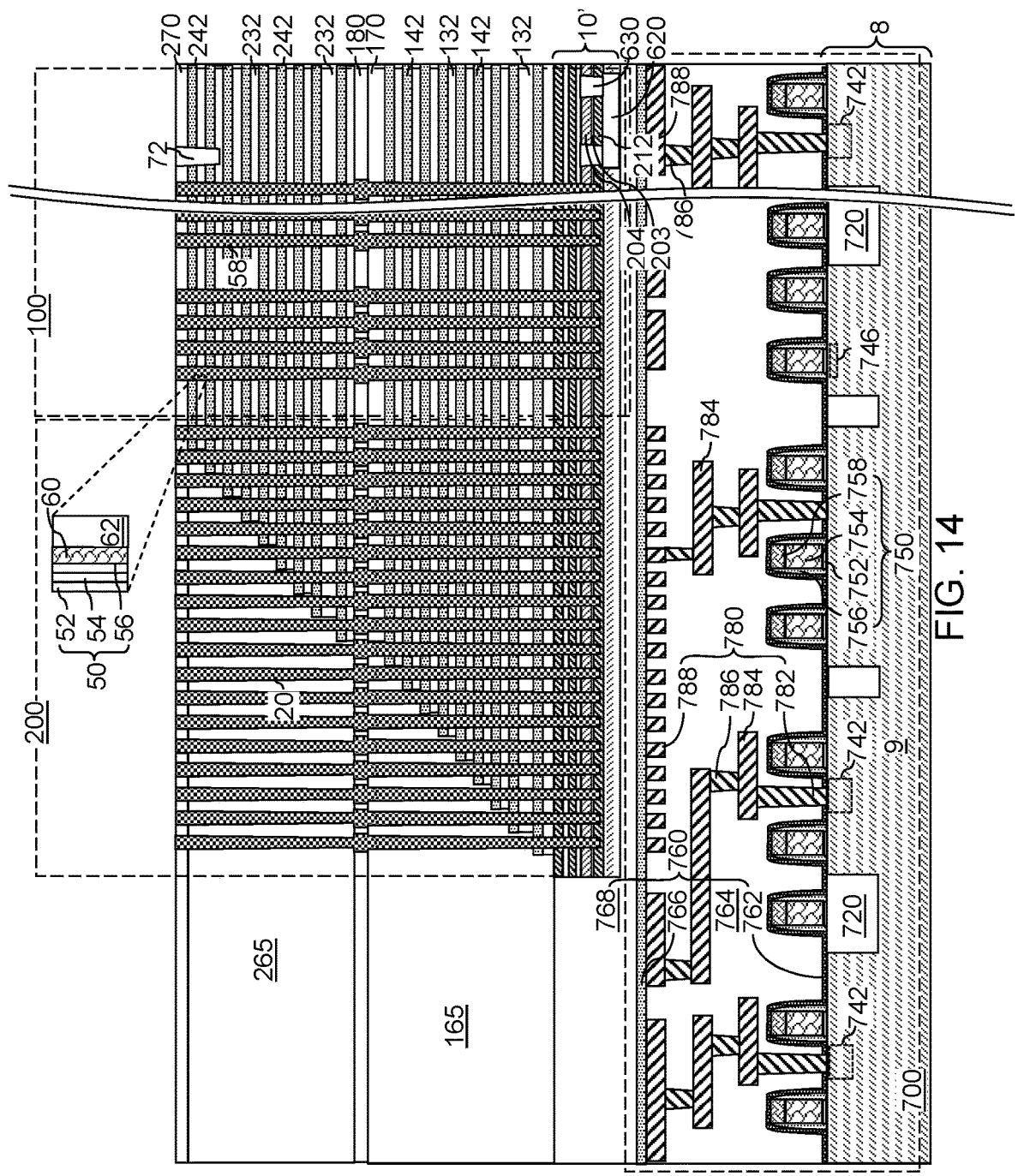
FIG. 14 is a vertical cross-sectional view of the first exemplary structure after formation of memory opening fill structures and support pillar structures according to the first embodiment of the present disclosure.

Referring to FIG. 14, the first exemplary structure is shown after formation of memory opening fill structures 58 in the memory openings 49 and support pillar structures 20 in the support openings 19. Each of the support openings 19 may be filled with a respective support pillar structure 20 concurrently with formation of the memory opening fill structures 58. Each support pillar structure 20 may have the same structural elements as a memory opening fill structure 58. Each support pillar structure 20 is a dummy structure, i.e., an electrically inactive structure, and as such, is not subsequently contacted by any contact via structure.

Figure 15:
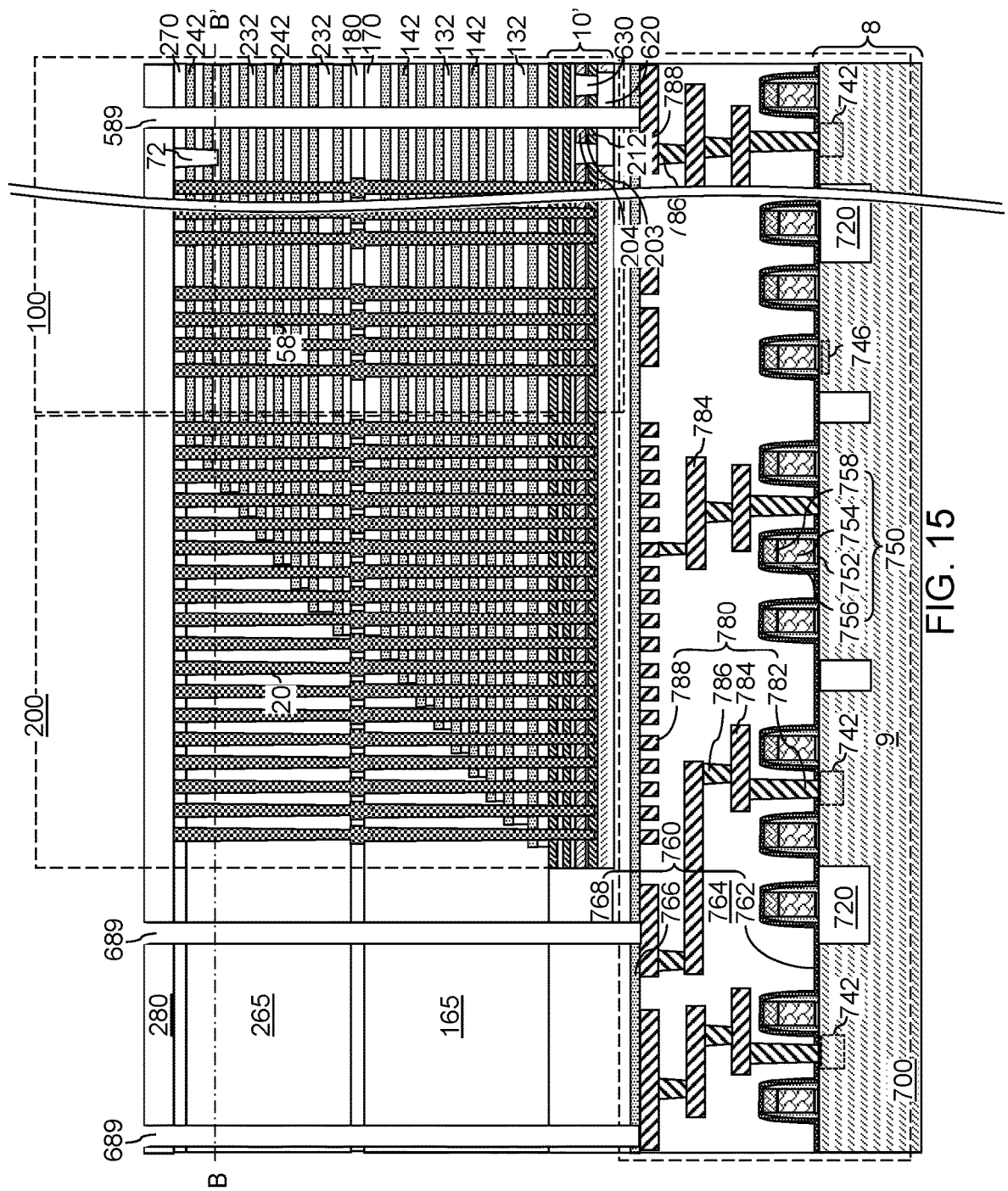
FIG. 15 is a vertical cross-sectional view of the first exemplary structure after formation of contact via cavities according to the first embodiment of the present disclosure.

Referring to FIG. 15, a contact level dielectric layer 280 may be formed over the second-tier structure (232, 242, 270, 265, 72). The contact level dielectric layer 280 includes a dielectric material such as silicon oxide, and may be formed by a conformal or non-conformal deposition process. For example, the contact level dielectric layer 280 may include undoped silicate glass and may have a thickness in a range from 100 nm to 600 nm, although lesser and greater thicknesses may also be used.

Contact via cavities (589, 689) may be formed through memory-level material portions located above the horizontal plane including the bottommost surface of the in-process source-level material layers 10'. For example, a photoresist layer (not shown) may be applied over the contact level dielectric layer 280, and may be lithographically patterned to form discrete openings within areas defined by the inner peripheries of the annular dielectric isolation structures 630 in the memory array region 100 and within the areas of the retro-stepped dielectric material portions (165, 265). An anisotropic etch process may be performed to transfer the pattern of the openings in the photoresist layer through the contact level dielectric layer 280, the alternating stacks {(132, 242), (232, 242)}, the in-process source-level material layers 10', and/or the retro-stepped dielectric material portions (165, 265), and through the at least one second dielectric material layer 768 and through the silicon nitride layer 766. The contact via cavities (589, 689) may include first contact via cavities 589 that extend through the in-process source-level material layers 10' within an area enclosed by an inner sidewall of a respective one of the annular dielectric isolation structure 630, and second contact via cavities 689 that extend through the retro-stepped dielectric material portions (165, 265). The sidewalls of the contact via cavities (589, 689) may be straight throughout, and may be vertical or substantially vertical.

The inner sidewall of each first contact via cavity 589 may be located within, and laterally spaced from, the inner sidewall of a respective one of the annular dielectric isolation structures 630. In one embodiment, each first contact via cavity 589 may vertically extend through a stack of a doped semiconductor plate 212, a lower dielectric liner 203, and a source-level semiconductor plate 204. In this case, the doped semiconductor plates 212 may become annular doped semiconductor plates, the lower dielectric liners 203 may become annular lower dielectric liners, and the source-level semiconductor plates 204 may become annular source-level semiconductor plates. Each first contact via cavity 589 may vertically extend through the alternating stacks {(132, 142), the upper source-level material layer 116, the upper dielectric liner layer 105, an opening inside an annular dielectric isolation structure 630 (as defined by the inner periphery of the annular dielectric isolation structure 630), a source-level semiconductor plate 204, a lower dielectric liner 203, a doped semiconductor plate 212, a dielectric material block 620, and an underlying portion of the at least one second dielectric material layer 768.

Figure 16A:
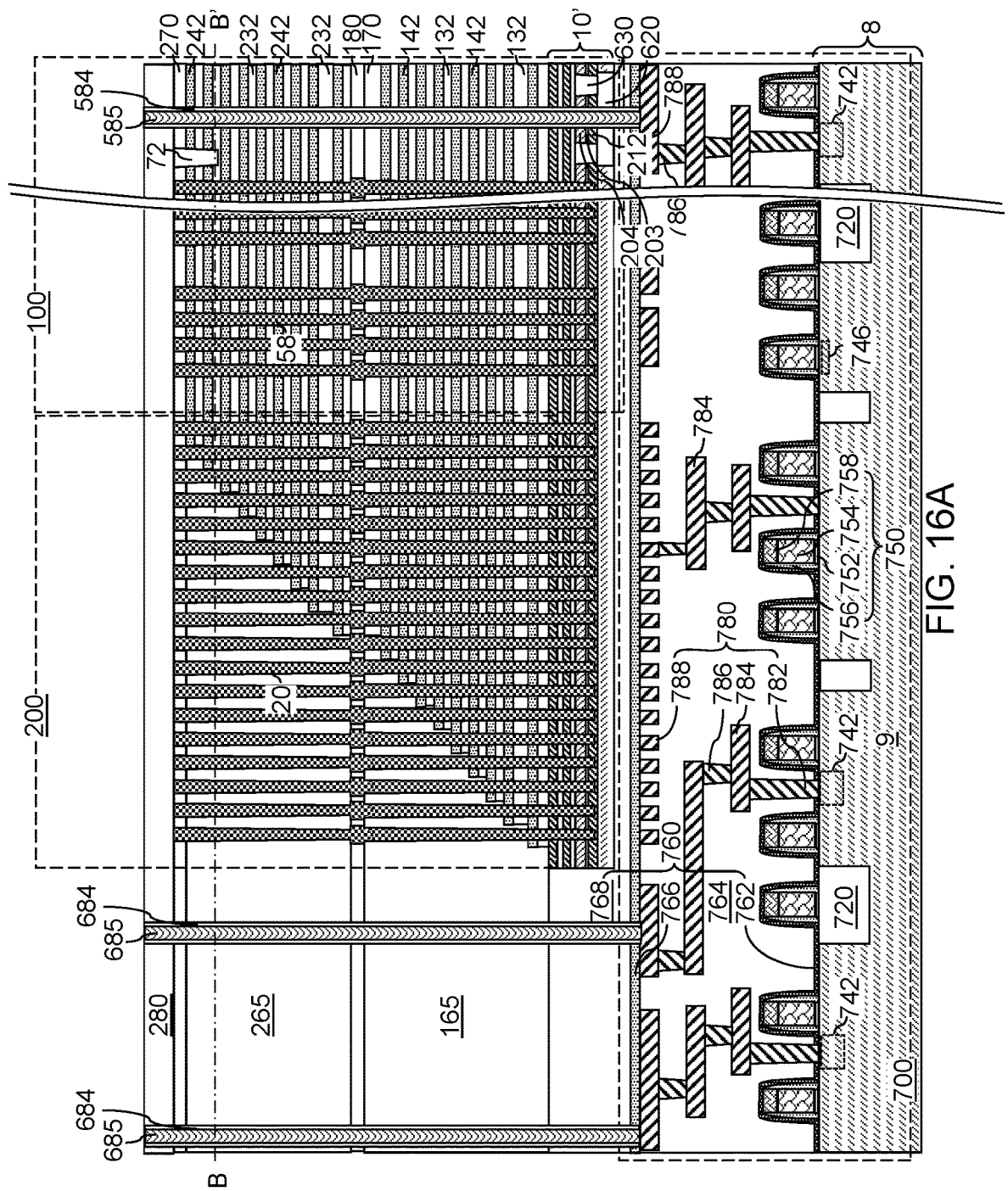
FIG. 16A is a vertical cross-sectional view of the first exemplary structure after formation of dielectric spacers and sacrificial via fill structures according to the first embodiment of the present disclosure.
Figure 16B:
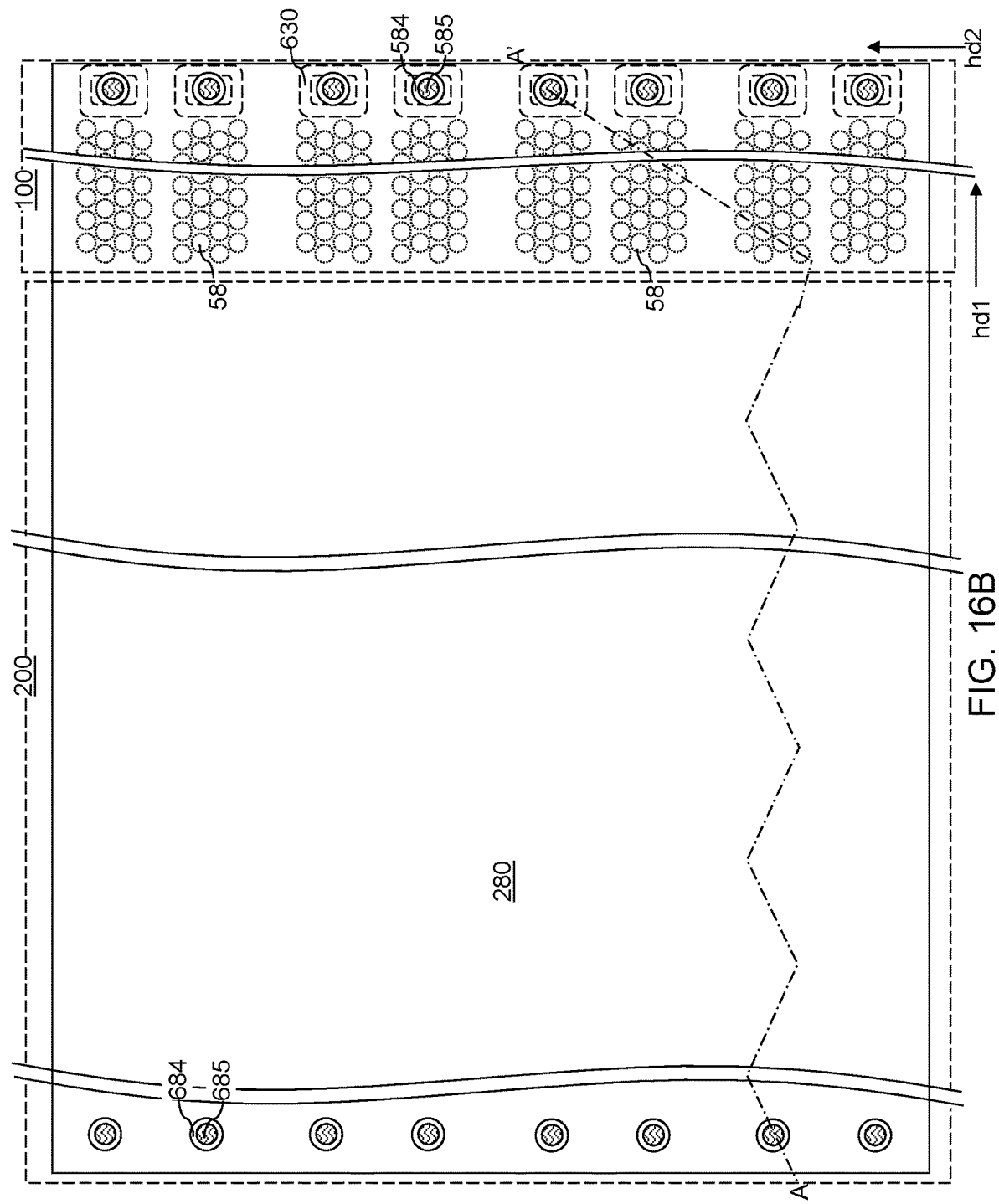
FIG. 16B is a horizontal cross-sectional of the first exemplary structure along the horizontal plane B-B' of FIG. 16A. The zig-zag vertical plane A-A' corresponds to the plane of the vertical cross-sectional view of FIG. 16A.

Referring to FIGS. 16A and 16B, a dielectric material layer may be conformally deposited at the periphery of each of the contact via cavities (589, 689) over the contact level dielectric layer 280. For example, low pressure chemical vapor deposition process may be performed to deposit a conformal silicon oxide layer as the dielectric material layer. Horizontal portions of the dielectric material layer may be removed by performing an anisotropic etch process that etches the material of the dielectric material layer. Each remaining vertically-extending tubular portion of the dielectric material constitutes a dielectric spacer (584, 684). The dielectric spacers (584, 684) include first dielectric spacers 584 that are formed in the first contact via cavities 589 and second dielectric spacers 684 that are formed in the second contact via cavities 689.

A sacrificial via fill material may be deposited in remaining voids within the dielectric spacers (584, 684). The sacrificial via fill material includes a material that may be removed selective to the materials of the contact level dielectric layer 20, the dielectric spacers (584, 684), and the landing-pad-level metal line structures 788. For example, the sacrificial via fill material may include amorphous silicon, polysilicon, a silicon-germanium alloy, organosilicate glass, or a polymer material. Excess portions of the sacrificial via fill material may be removed from above the horizontal plane including the top surface of the contact level dielectric layer 280. Each remaining portion of the sacrificial via fill material in the contact via cavities (589, 689) constitutes a sacrificial via fill structure (585, 685). The sacrificial via fill structures (585, 685) include first sacrificial via fill structures 585 laterally surrounded by, and contacting, a respective one of the first dielectric spacers 584 located in the memory array region 100, and second sacrificial via fill structures 685 laterally surrounded by, and contacting, a respective one of the second dielectric spacers 684.

In an alternative embodiment, the steps shown in FIGS. 15 and 16A-16B are performed prior to the steps shown in FIGS. 7A to 14. In other words, each first contact via cavity 589 may be formed through the first and second alternating stacks prior to forming the memory openings 49 through the first and second alternating stacks. In the alternative embodiment, each first contact via cavity 589 is formed through the first and second alternating stacks, followed by forming the first dielectric spacers 584 and the first sacrificial via fill structures 585 in the respective first contact via cavities 589. After forming the first dielectric spacers 584 and the first sacrificial via fill structures 585 in the respective first contact via cavities 589, the memory openings 49 are formed through the first and second alternating stacks, as shown in FIGS. 7A to 13A. The memory opening fill structures 58 are then formed in the memory openings as shown in FIGS. 13B to 14.

Figure 17A:
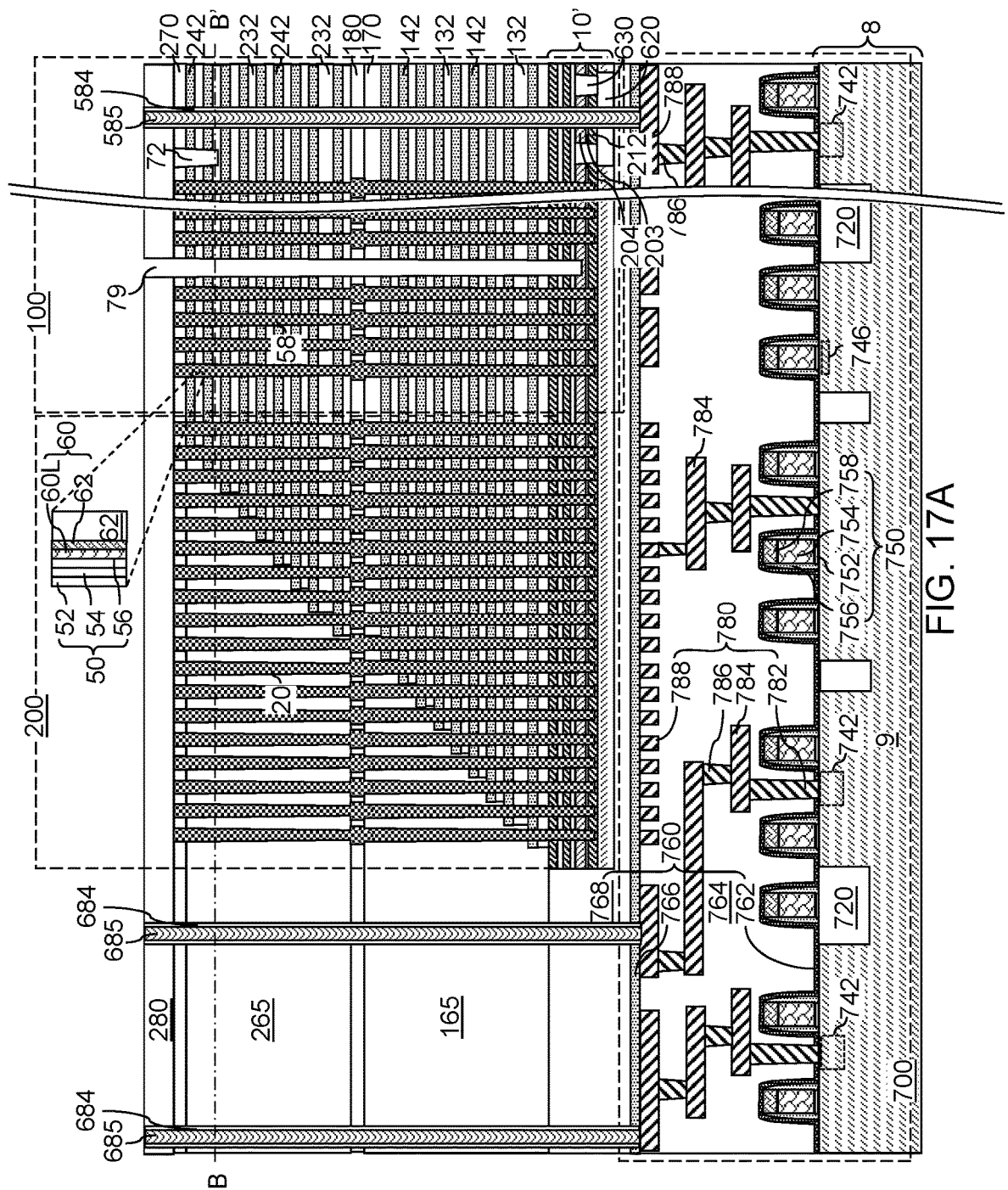
FIG. 17A is a vertical cross-sectional view of the first exemplary structure after formation of backside trenches according to the first embodiment of the present disclosure.
Figure 17B:
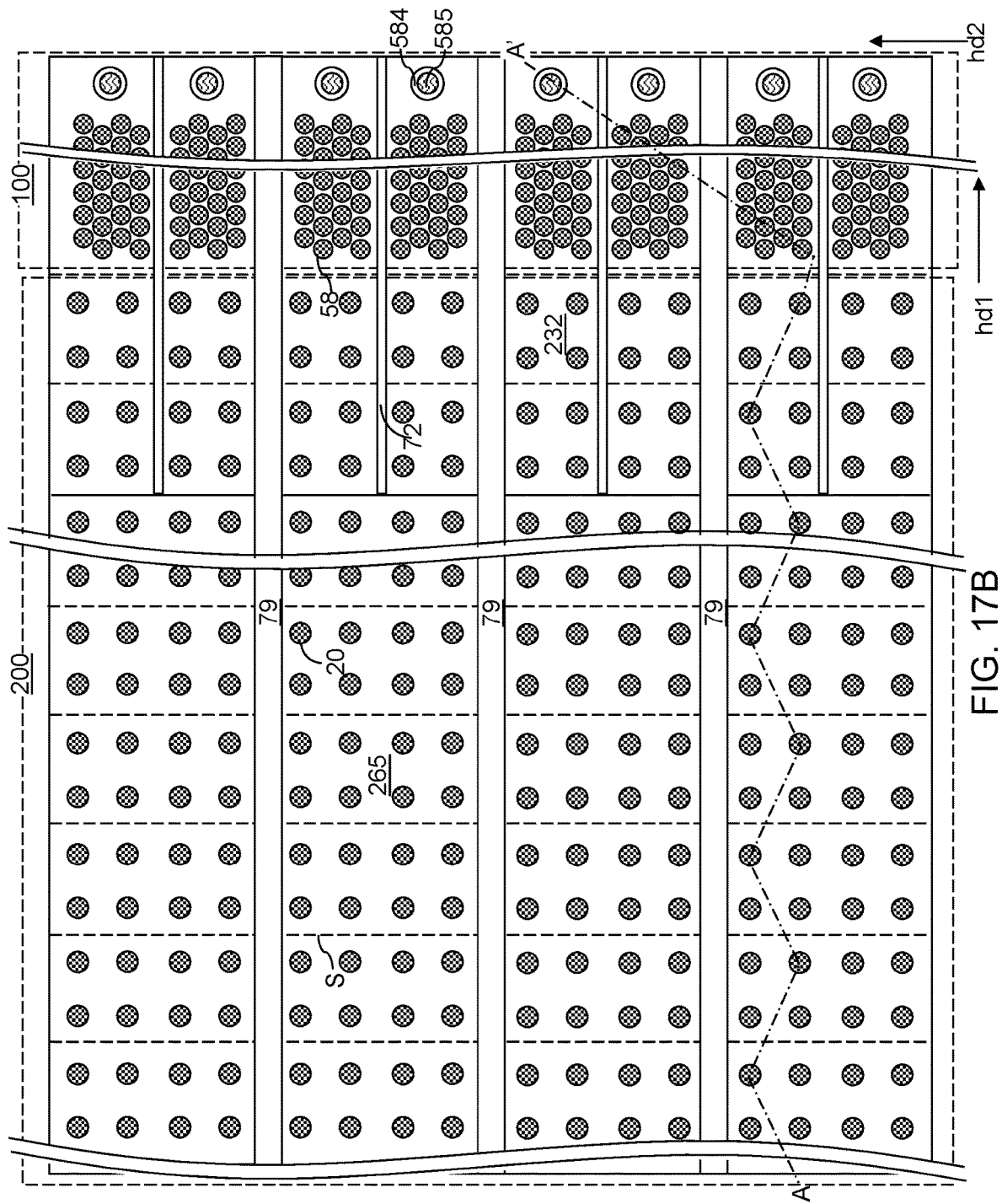
FIG. 17B is a top-down view of the first exemplary structure of FIG. 17A. The zig-zag vertical plane A-A' corresponds to the plane of the vertical cross-sectional view of FIG. 17A.

Referring to FIGS. 17A and 17B, a photoresist layer may be applied over the contact level dielectric layer 280 and may be lithographically patterned to form openings within areas extending across the memory array region 100 and the staircase region 200. The openings in the photoresist layer may laterally extend along the first horizontal direction hd1 between each neighboring cluster of memory stack structures 55. Backside trenches 79 may be formed by transferring the pattern in the photoresist layer through the contact level dielectric layer 280, the second alternating stack (232, 242, 270, 265, 72), the first alternating stack (132, 142, 170, 165), and the in-process source-level material layers 10'. Portions of the contact level dielectric layer 280, the second alternating stack (232, 242, 270, 265, 72), the first alternating stack (132, 142, 170, 165), and the in-process source-level material layers 10' that underlie the openings in the photoresist layer may be removed to form backside trenches 79. In one embodiment, the backside trenches 79 may be formed between clusters of memory stack structures 55. The clusters of the memory stack structures 55 may be laterally spaced apart along the second horizontal direction hd2 by the backside trenches 79.

Figure 18:
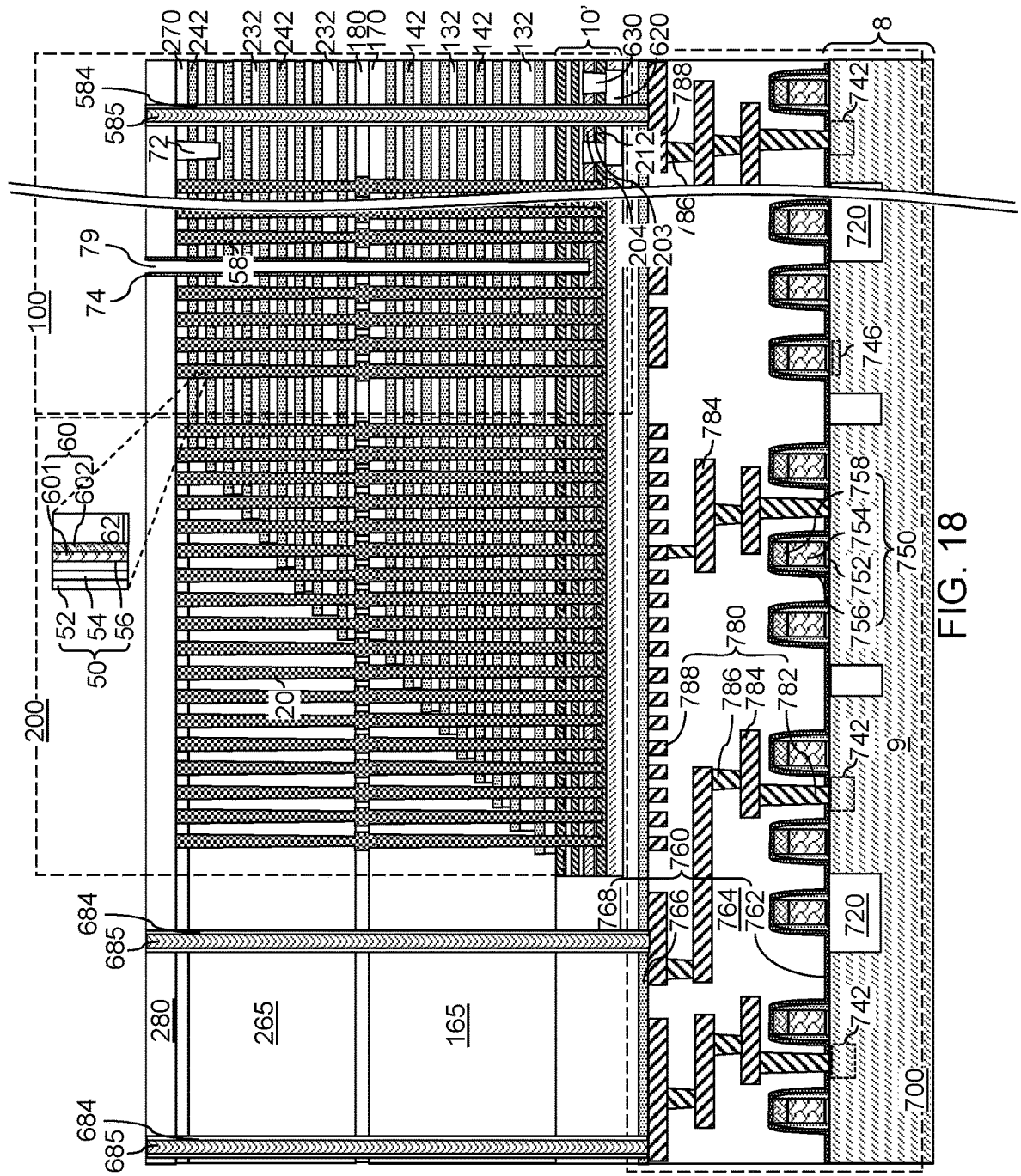
FIG. 18 is a vertical cross-sectional view of the first exemplary structure after formation of backside trench spacers in the backside trenches according to the first embodiment of the present disclosure.
Figure 19A:
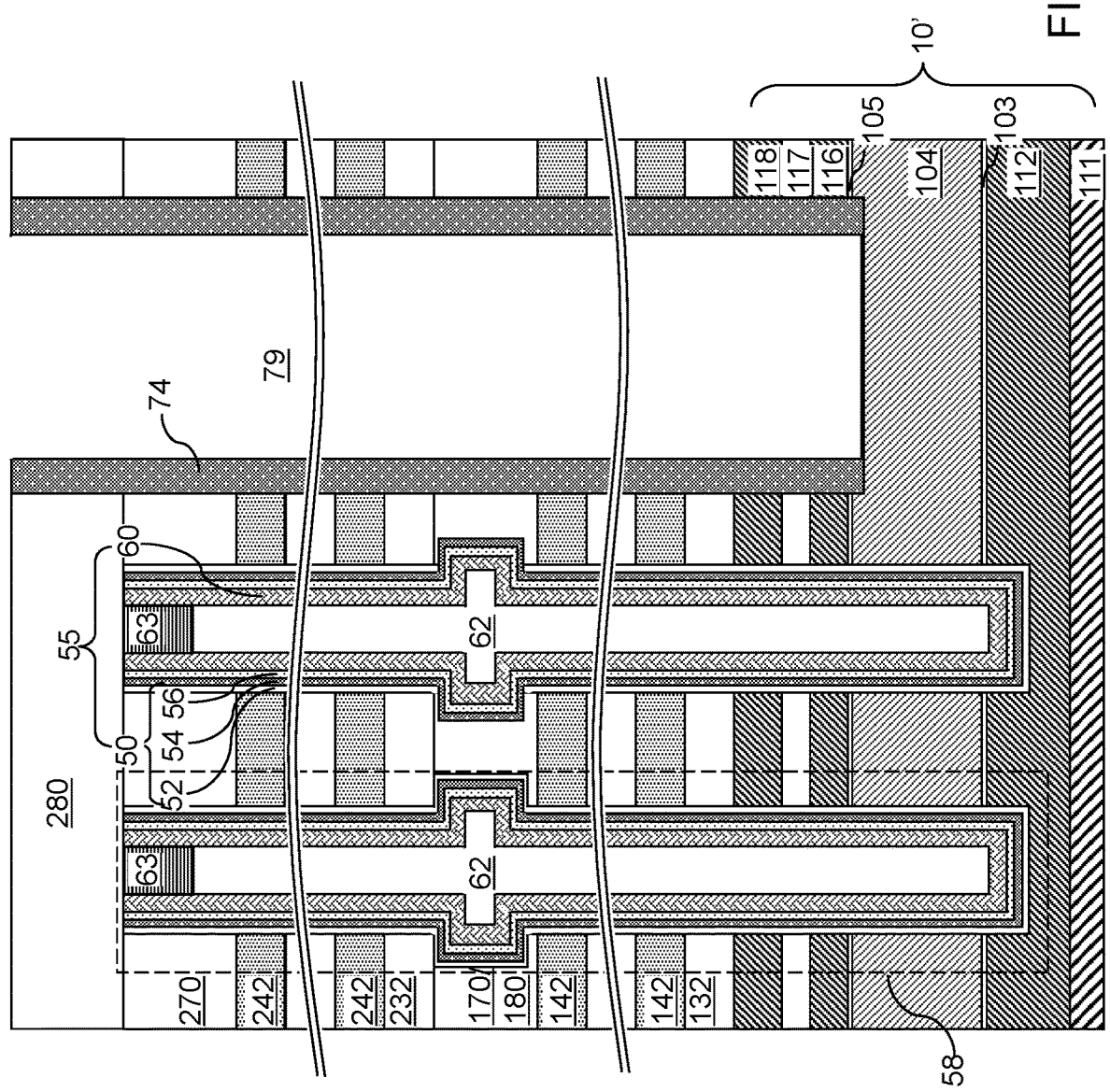
FIGS. 19A-19E illustrate sequential vertical cross-sectional views of a region of the first exemplary structure during formation of a source-level material layers according to the first embodiment of the present disclosure.

Referring to FIGS. 18 and 19A, a backside trench spacer 74 may be formed on sidewalls of each backside trench 79. For example, a conformal spacer material layer may be deposited in the backside trenches 79 and over the contact level dielectric layer 280, and may be anisotropically etched to form the backside trench spacers 74. The backside trench spacers 74 include a material that is different from the material of the source-level sacrificial layer 104. For example, the backside trench spacers 74 may include silicon nitride.

Figure 19B:
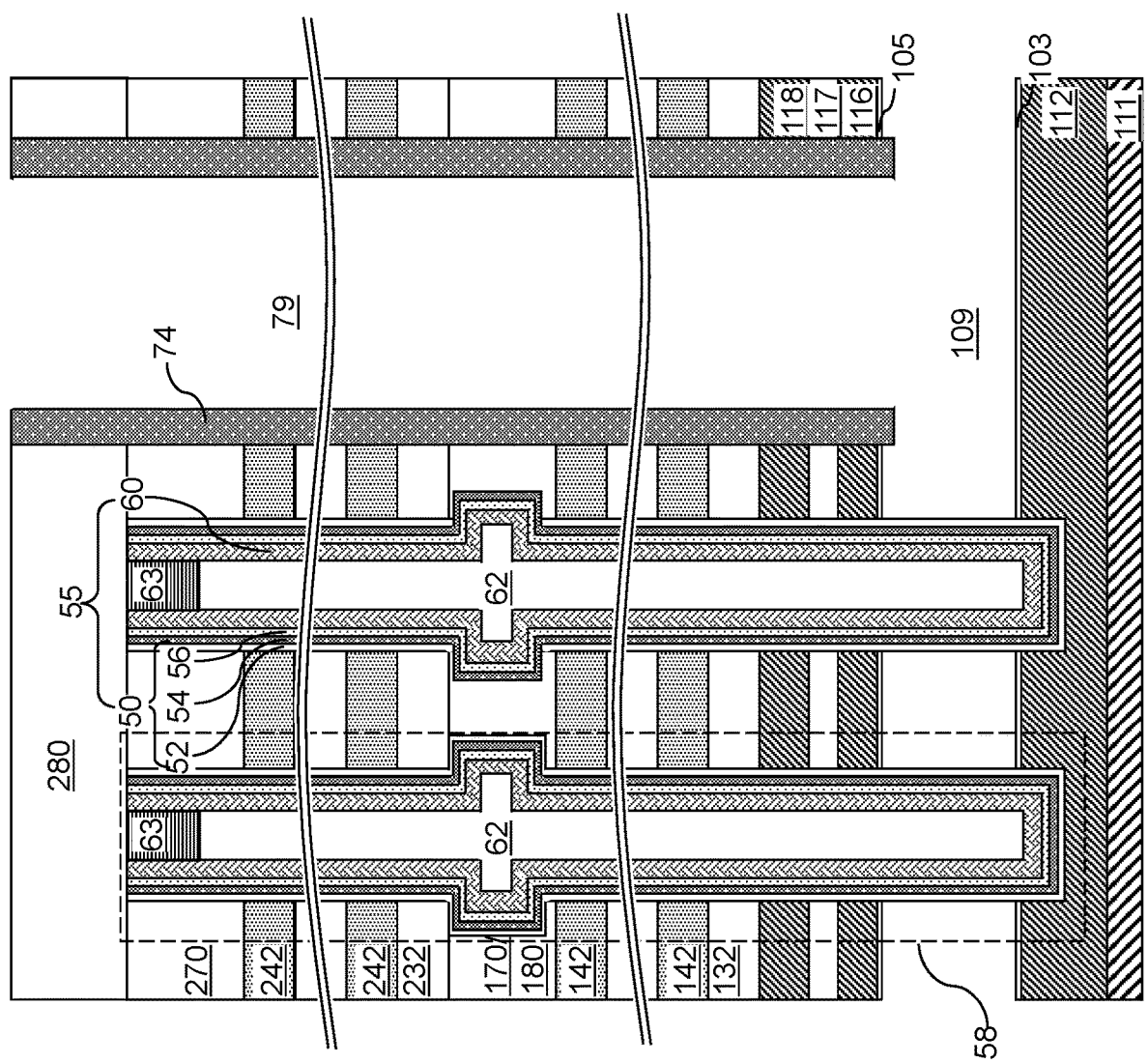

Referring to FIG. 19B, an etchant that etches the material of the source-level sacrificial layer 104 selective to the materials of the first alternating stack (132, 142), the second alternating stack (232, 242), the first and second insulating cap layers (170, 270), the upper dielectric liner layer 105, and the lower dielectric liner layer 103 may be introduced into the backside trenches 79 in an isotropic etch process. For example, if the source-level sacrificial layer 104 includes undoped amorphous silicon or an undoped amorphous silicon-germanium alloy, the backside trench spacers 74 include silicon nitride, and the upper and lower dielectric liner layers (105, 103) include silicon oxide, a wet etch process using hot trimethyl-2 hydroxyethyl ammonium hydroxide ("hot TMY") or tetramethyl ammonium hydroxide (TMAH) may be used to remove the source-level sacrificial layer 104 selective to the backside trench spacers 74 and the upper and lower dielectric liner layers (105, 103). A source cavity 109 may be formed in the volume from which the source-level sacrificial layer 104 is removed outside the outer sidewalls of the annular dielectric isolation structure 630. Sidewall surfaces of the memory opening fill structures 58 may be physically exposed to the source cavity 109. The annular dielectric isolation structures 630 limit the lateral extent of the source cavity 109.

Figure 19C:
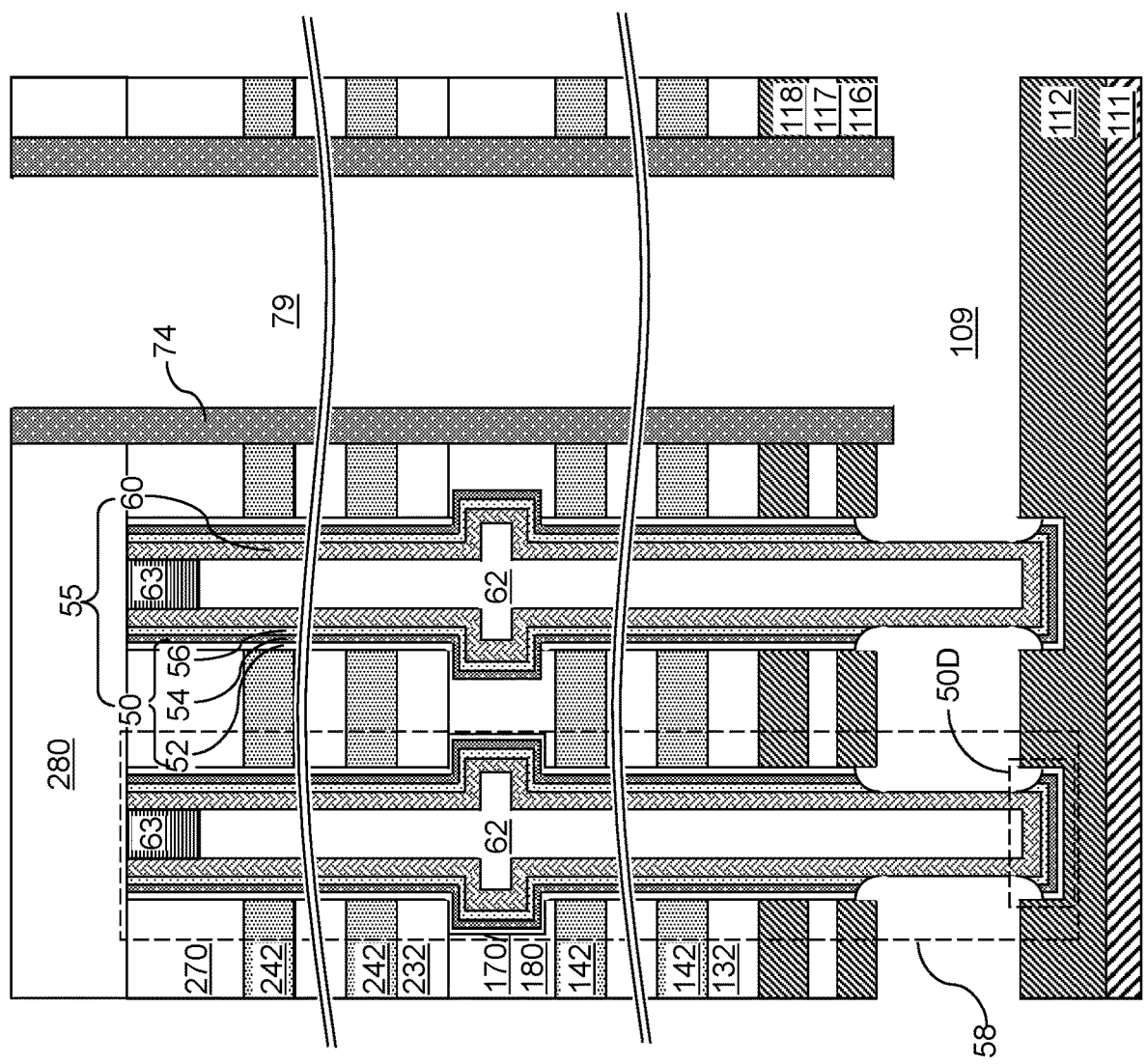

Referring to FIG. 19C, a sequence of isotropic etchants, such as wet etchants, may be applied through the backside trenches 79 and the source cavity 109 to the physically exposed portions of the memory films 50 to sequentially etch the various component layers of the memory films 50 from outside to inside, and to physically expose bottom surfaces and cylindrical side surfaces of the vertical semiconductor channels 60 at the level of the source cavity 109. The upper and lower dielectric liner layers (105, 103) may be collaterally etched during removal of the portions of the memory films 50 located at the level of the source cavity 109. The source cavity 109 may be expanded in volume by removal of the portions of the memory films 50 at the level of the source cavity 109 and the upper and lower dielectric liner layers (105, 103). A top surface of the lower source-level material layer 112 and a bottom surface of the upper source-level material layer 116 may be physically exposed to the source cavity 109. An outer sidewall of each vertical semiconductor channel 60 is physically exposed to the source cavity 109 after removing the physically exposed portions of the memory films 50. A dielectric material stack 50D may be formed underneath each physically exposed cylindrical surface of the vertical semiconductor channels 60. Each dielectric material stack 50D is a remaining portion of the memory films 50, and includes the same dielectric material stack as the memory films 50.

Each remaining portion of the upper dielectric liner layer 105 after formation of the source cavity constitutes an upper dielectric liner. Each upper dielectric liner contacts a top surface of the annular dielectric isolation structure 630. A lower dielectric liner 203 including a remaining portion of the lower dielectric liner layer 103 is present on an inner sidewall of a respective annular dielectric isolation structure 630 after formation of the source cavity 109.

Since the upper source-level material layer 116 is formed after forming the annular dielectric isolation structure 630, this upper source-level material layer 116 is continuous and uninterrupted over the annular dielectric isolation structure 630. Thus, the upper source-level material layer 116 may act as an etch stop during the selective etching of the memory film 50 through the source cavity 109 and may prevent lateral expansion of the source cavity 109. This prevents a short circuit between the source-select-level conductive layer 118 and a source contact layer that is subsequently formed in the source cavity 109 during a subsequent step.

Figure 19D:
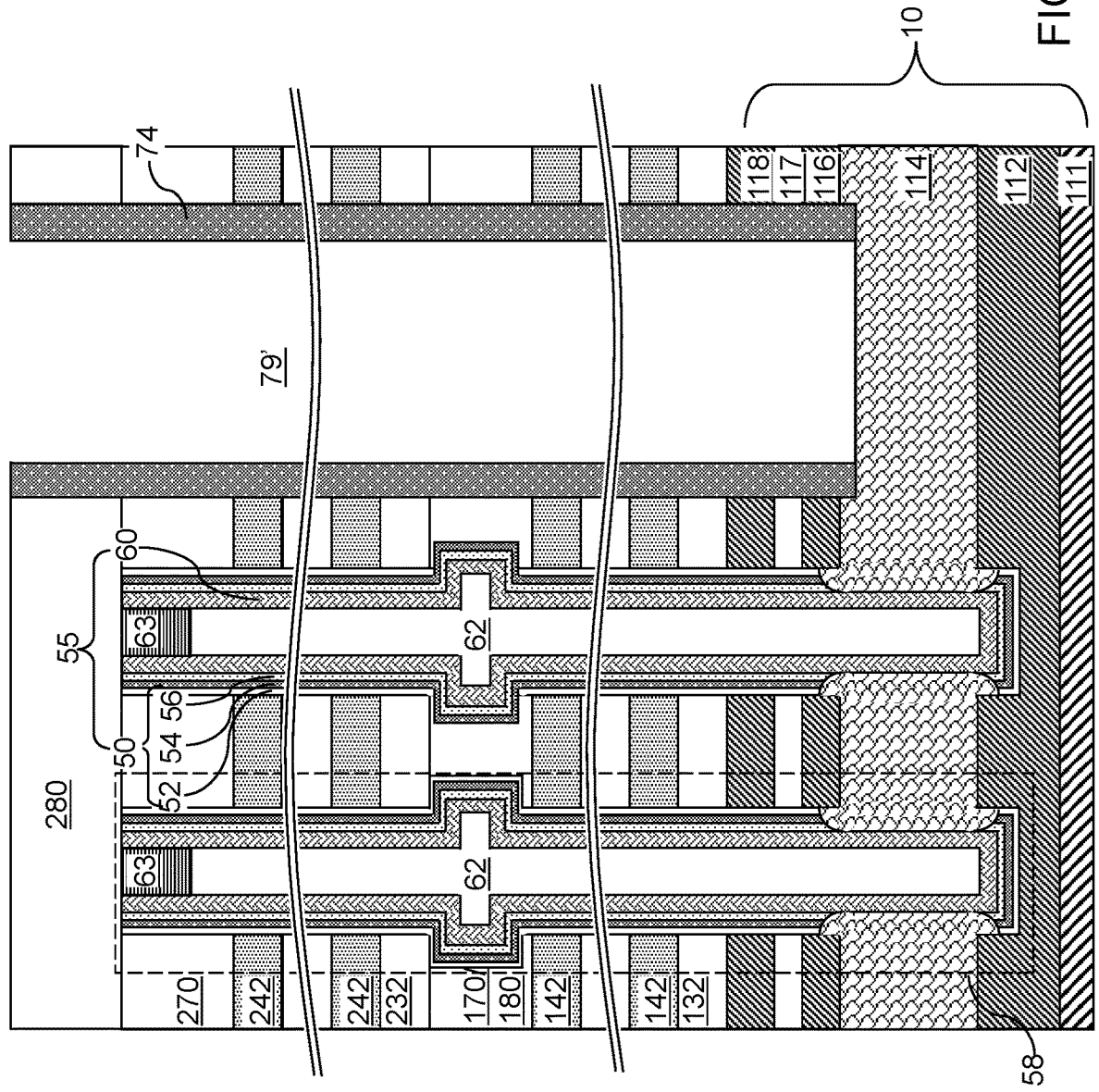

Referring to FIG. 19D, a source contact layer 114 may be formed by a selective deposition process that deposits a doped semiconductor material having a doping of the second conductivity type. The doped semiconductor material may include amorphous silicon, polysilicon, or a silicon-germanium alloy. The doped semiconductor material of the source contact layer 114 may grow from physically exposed semiconductor surfaces around the source cavity 109. The average atomic concentration of dopants of the second conductivity type in the source contact layer 114 may be in a range from $5.0 \times 10^{19}/cm^3$ to $2.0 \times 10^{21}/cm^3$, although lesser and greater dopant concentrations may also be used.

The in-process source-level material layers 10' are replaced with source-level material layers 10. The source-level material layers 10 include a layer stack including, from bottom to top, the doped semiconductor material underlayer 111, the lower source-level material layer 112, the source contact layer 114, the upper source-level material layer 116, the source-level insulating layer 117, and the optional source-select-level conductive layer 118.

Figure 19E:
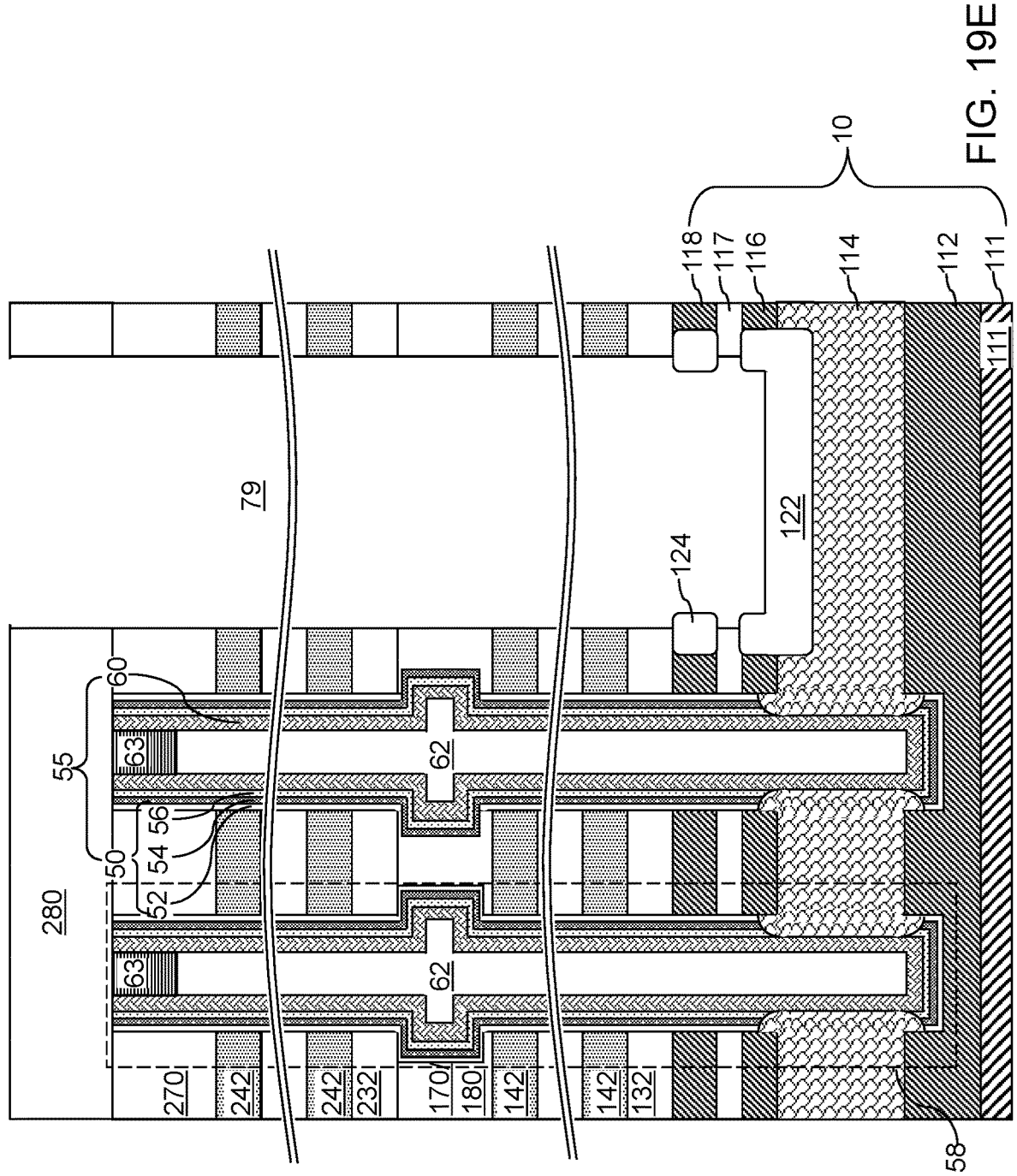
Figure 20:
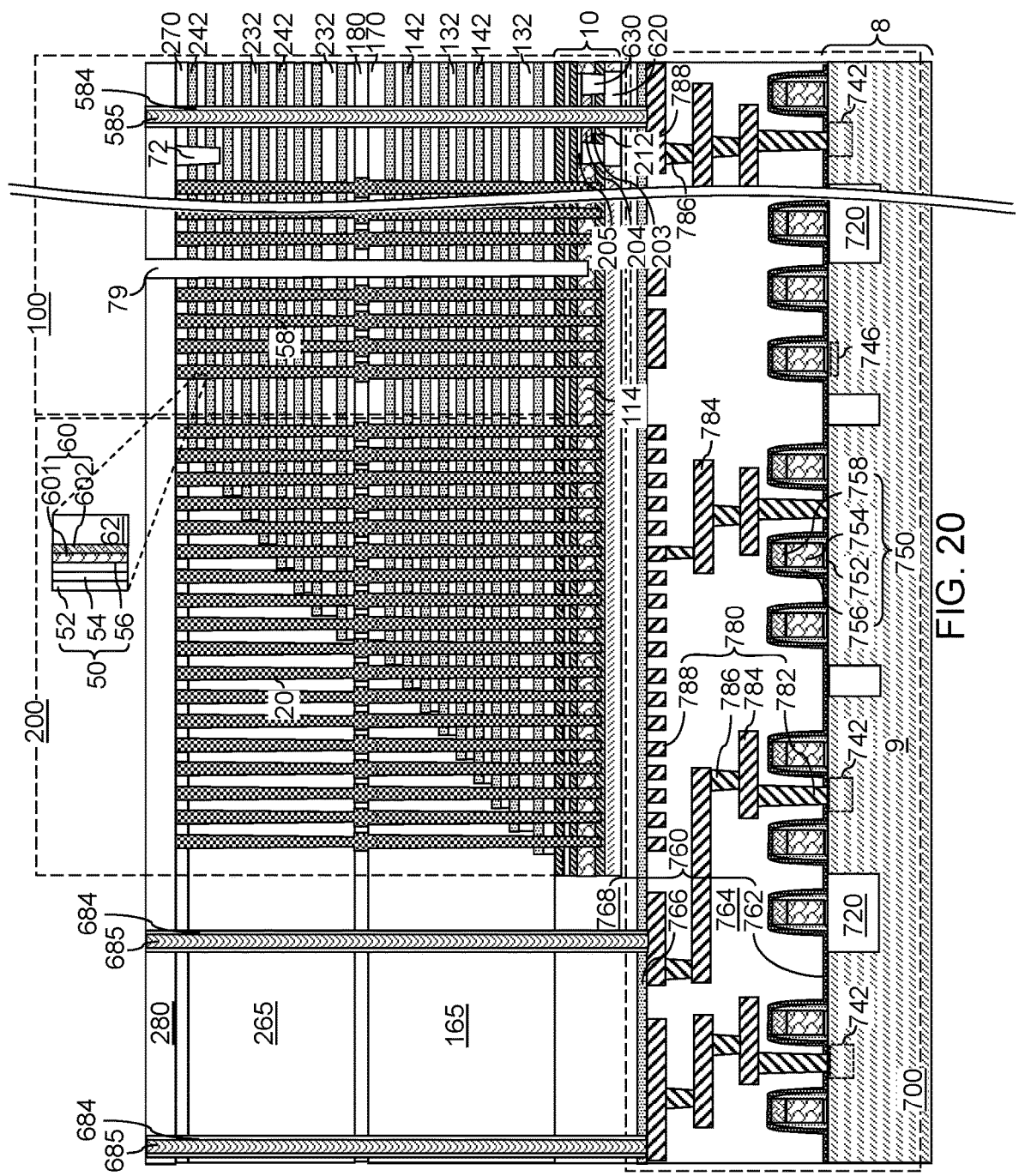
FIG. 20 is a vertical cross-sectional view of the first exemplary structure after formation of the source-level material layers according to the first embodiment of the present disclosure.

Referring to FIGS. 19E and 20, the backside trench spacers 74 may be removed selective to the semiconductor materials of the source contact layer 114, the sacrificial via fill structures (585, 685), the first and second insulating layers (132, 232), the first and second insulating cap layers (170, 270), the inter-tier dielectric layer 180, and the contact level dielectric layer 280. For example, if the backside trench spacers 74 include silicon nitride, a wet etch process using hot phosphoric acid may be used to remove the backside trench spacers 74. Sidewalls of the first and second alternating stacks (132, 142, 232, 242), the upper source-level material layer 116, the source-level insulating layer 117, and the optional source-select-level conductive layer 118 may be physically exposed after removal of the backside trench spacers 74.

A thermal oxidation process may be performed to convert physically exposed surface portions of various semiconductor materials into semiconductor oxide portions. Specifically, physically exposed surface portions of the source contact layer 114, the upper source-level material layer 116, and the source-select-level conductive layer 118 (if present) are converted into thermal semiconductor oxide material portions. As used herein, a "thermal semiconductor oxide" refers to a material that is formed by thermal oxidation of a semiconductor material. Unlike a semiconductor oxide material formed by chemical vapor deposition, thermal semiconductor oxide materials do not include carbon or hydrogen above a trace level unless the semiconductor material from which the semiconductor oxide material is derived includes carbon prior to a thermal oxidation process.

The thermal oxidation process forms a semiconductor oxide plate 122 at the bottom of each backside trench 79 and semiconductor oxide rails 124 on sidewalls of the source-select-level conductive layer 118. The semiconductor oxide plate 122 and the semiconductor oxide rails 124 are not illustrated in FIG. 20 for clarity. The semiconductor oxide plate 122 includes various thermal semiconductor oxide material portions formed by thermal conversion of surface portions of the source contact layer 114 and the upper source-level material layer 116.

The layer stack including the lower source-level material layer 112, the source contact layer 114, and the upper source-level material layer 116 constitutes a buried source layer (112, 114, 116), which function as a common source region that is connected each of the vertical semiconductor channels 60 and has a doping of the second conductivity type. The average dopant concentration in the buried source layer (112, 114, 116) may be in a range from $5.0 \times 10^{19}/\text{cm}^3$ to $2.0 \times 10^{21}/\text{cm}^3$, although lesser and greater dopant concentrations may also be used.

A dielectric spacer assembly may be provided around each first sacrificial via fill structure 585 within the source-level material layers 10. Each dielectric spacer assembly protects the first dielectric spacers 584 during the replacement of the in-process source-level material layers 10' with the source-level material layers 10. Each dielectric spacer assembly includes an upper dielectric liner 205, an annular dielectric isolation structure 630, a dielectric material block 620, and a lower dielectric liner 203. A source-level semiconductor plate 204 may be formed within each dielectric spacer assembly (205, 630, 620, 203). Each dielectric spacer assembly (205, 630, 620, 203) includes a set of dielectric material portions that limits expansion of the extent of the source cavity 109, thereby preventing electrical shorts around the region of the first sacrificial via fill structures 585.

Figure 21:
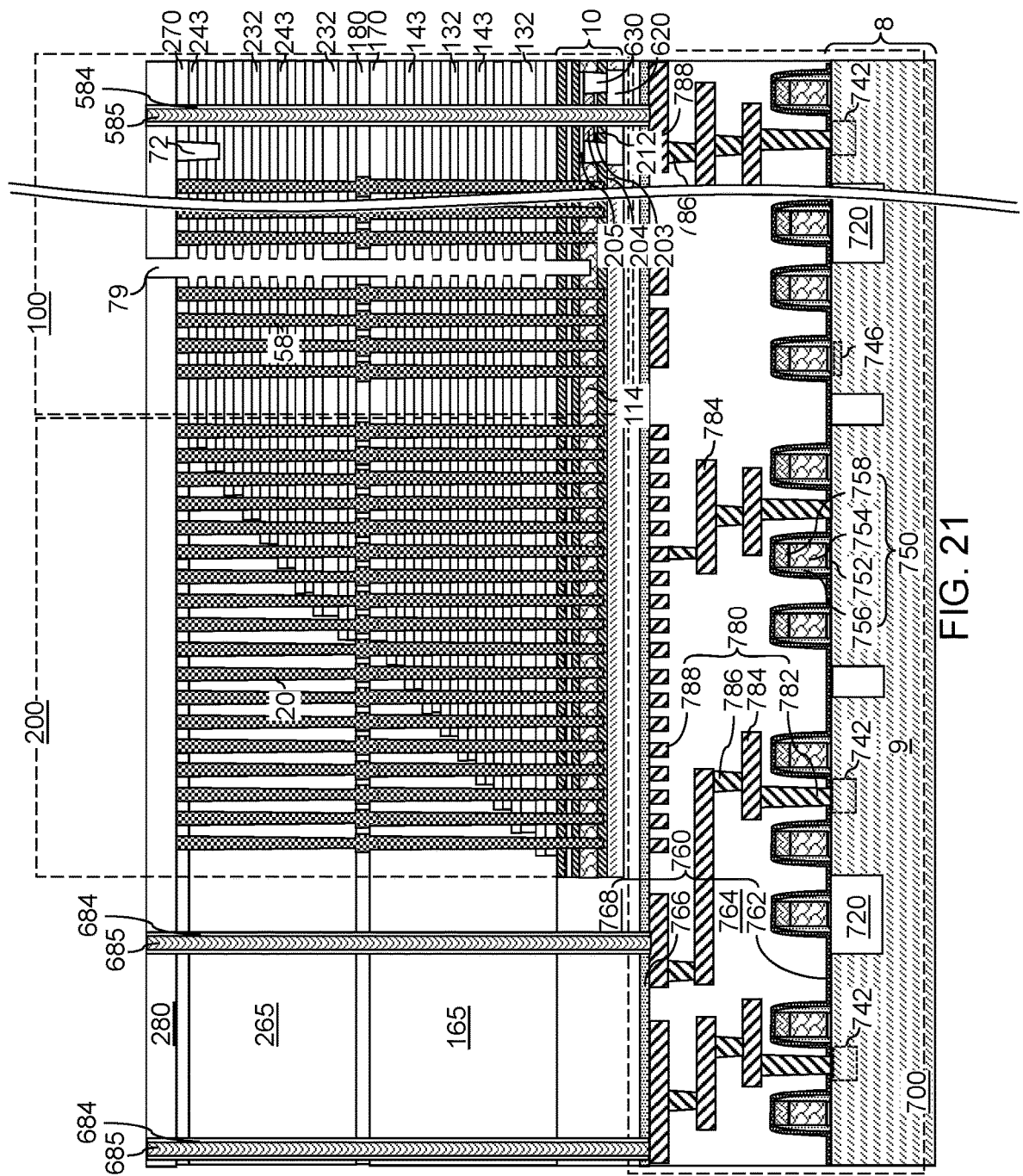
FIG. 21 is a vertical cross-sectional view of the first exemplary structure after formation of backside recesses according to the first embodiment of the present disclosure.

Referring to FIG. 21, an etchant that selectively etches the materials of the first and second sacrificial material layers (142, 242) with respect to the materials of the first and second insulating layers (132, 232), the first and second retro-stepped dielectric material portions (165, 265), and the material of the outermost layer of the memory films 50 may be introduced into the backside trenches 79, for example, using an isotropic etch process. For example, the first and second sacrificial material layers (142, 242) may include silicon nitride, the materials of the first and second insulating layers (132, 232), the first and second insulating cap layers (170, 270), the first and second retro-stepped dielectric material portions (165, 265), and the material of the outermost layer of the memory films 50 may include silicon oxide materials. First backside recesses 143 may be formed in volumes from which the first sacrificial material layers 142 are removed. Second backside recesses 243 may be formed in volumes from which the second sacrificial material layers 242 are removed.

The isotropic etch process may be a wet etch process using a wet etch solution, or may be a gas phase (dry) etch process in which the etchant is introduced in a vapor phase into the backside trenches 79. For example, if the first and second sacrificial material layers (142, 242) include silicon nitride, the etch process may be a wet etch process in which the first exemplary structure is immersed within a wet etch tank including phosphoric acid, which etches silicon nitride selective to silicon oxide, silicon, and various other materials used in the art.

Each of the first and second backside recesses (143, 243) may be a laterally extending cavity having a lateral dimension that is greater than the vertical extent of the cavity. In other words, the lateral dimension of each of the first and second backside recesses (143, 243) may be greater than the height of the respective backside recess (143, 243). A plurality of first backside recesses 143 may be formed in the volumes from which the material of the first sacrificial material layers 142 is removed. A plurality of second backside recesses 243 may be formed in the volumes from which the material of the second sacrificial material layers 242 is removed. Each of the first and second backside recesses (143, 243) may extend substantially parallel to the top surface of the substrate 8. A backside recess (143, 243) may be vertically bounded by a top surface of an underlying insulating layer (132 or 232) and a bottom surface of an overlying insulating layer (132 or 232). In one embodiment, each of the first and second backside recesses (243, 243) may have a uniform height throughout.

Figure 22:
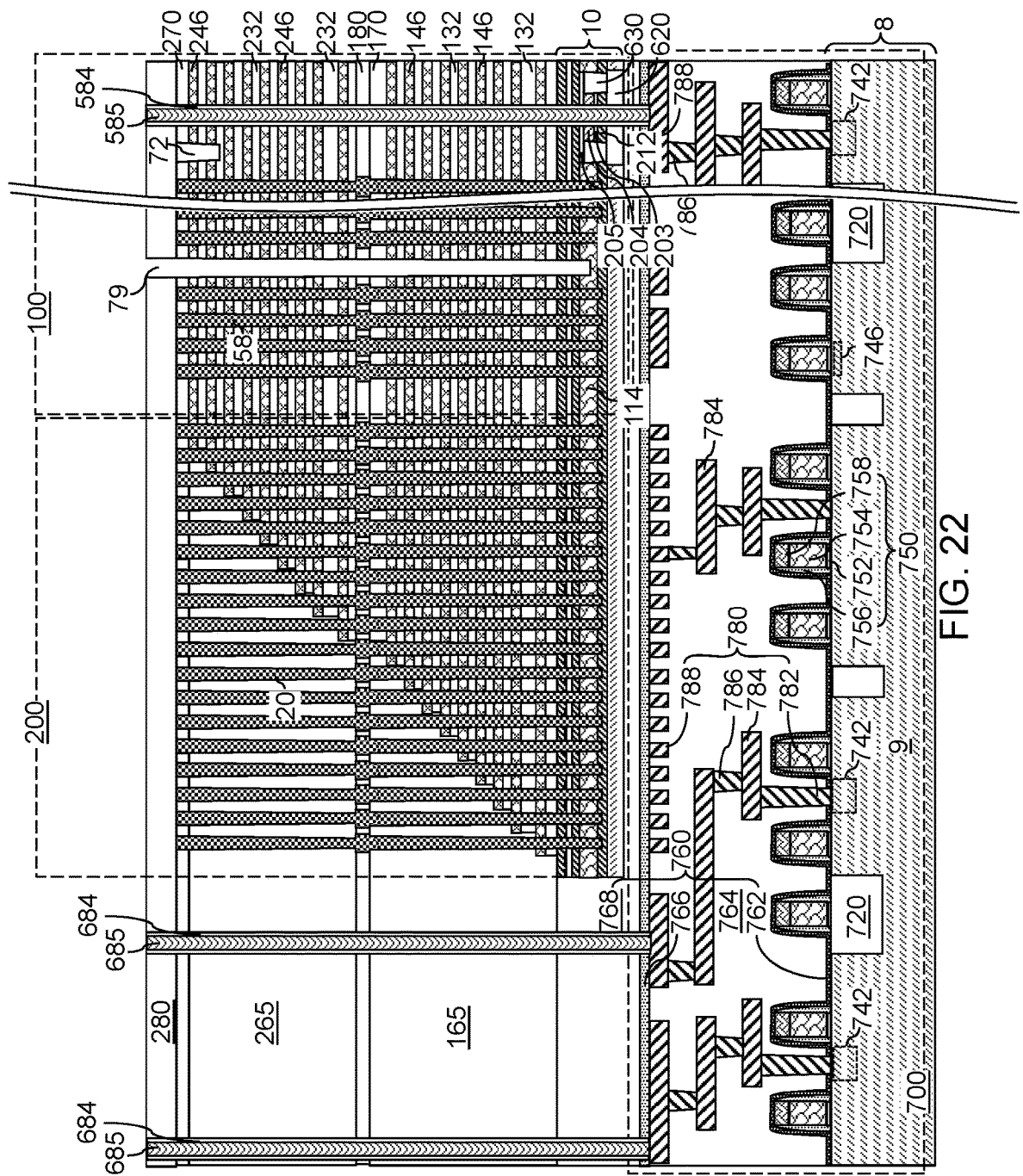
FIG. 22 is a vertical cross-sectional view of the first exemplary structure after formation of electrically conductive layers in the backside recesses according to the first embodiment of the present disclosure.
Figure 23A:
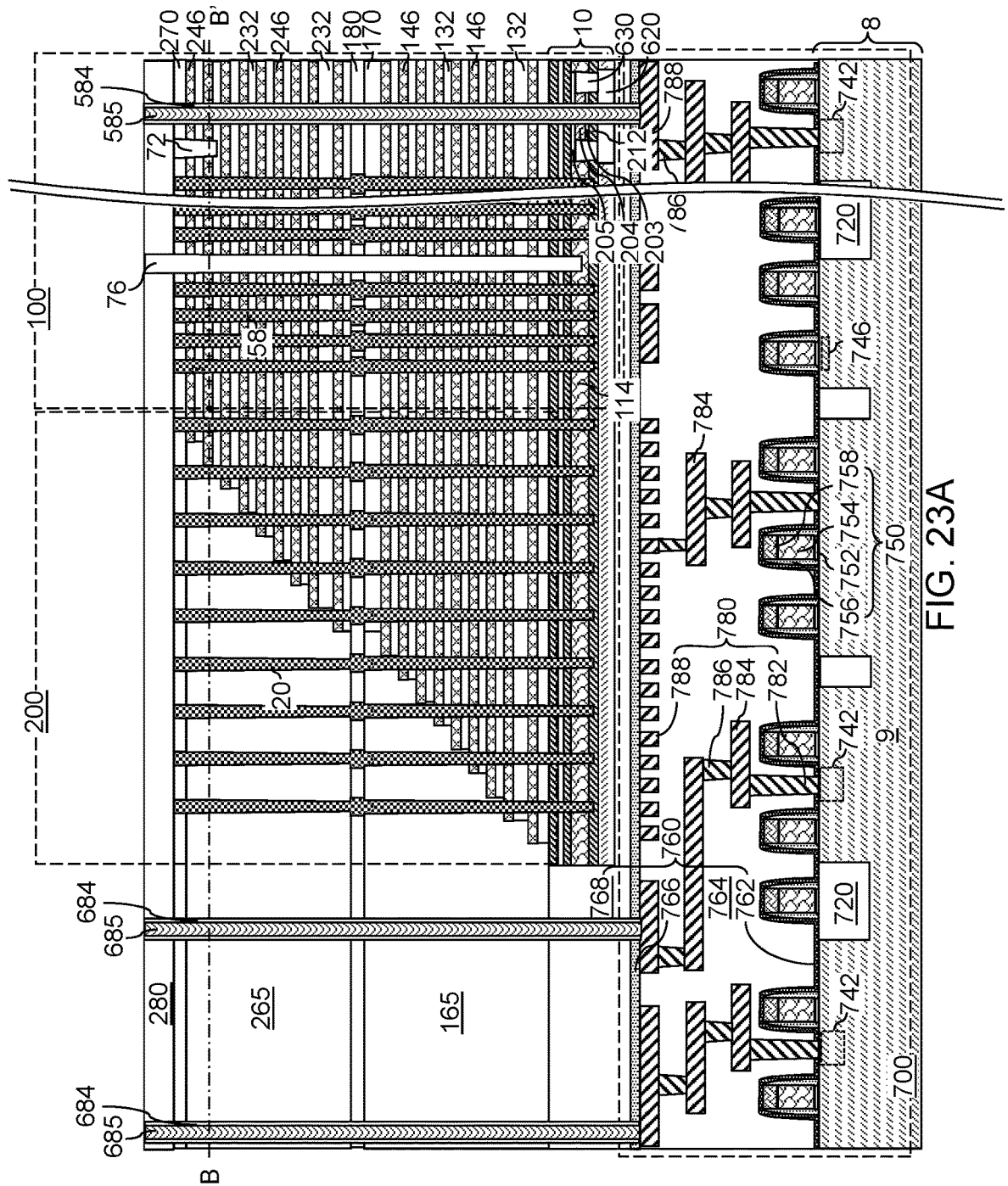
FIG. 23A is a vertical cross-sectional view of the first exemplary structure after formation of dielectric wall structures in the backside trenches according to the first embodiment of the present disclosure.
Figure 23B:
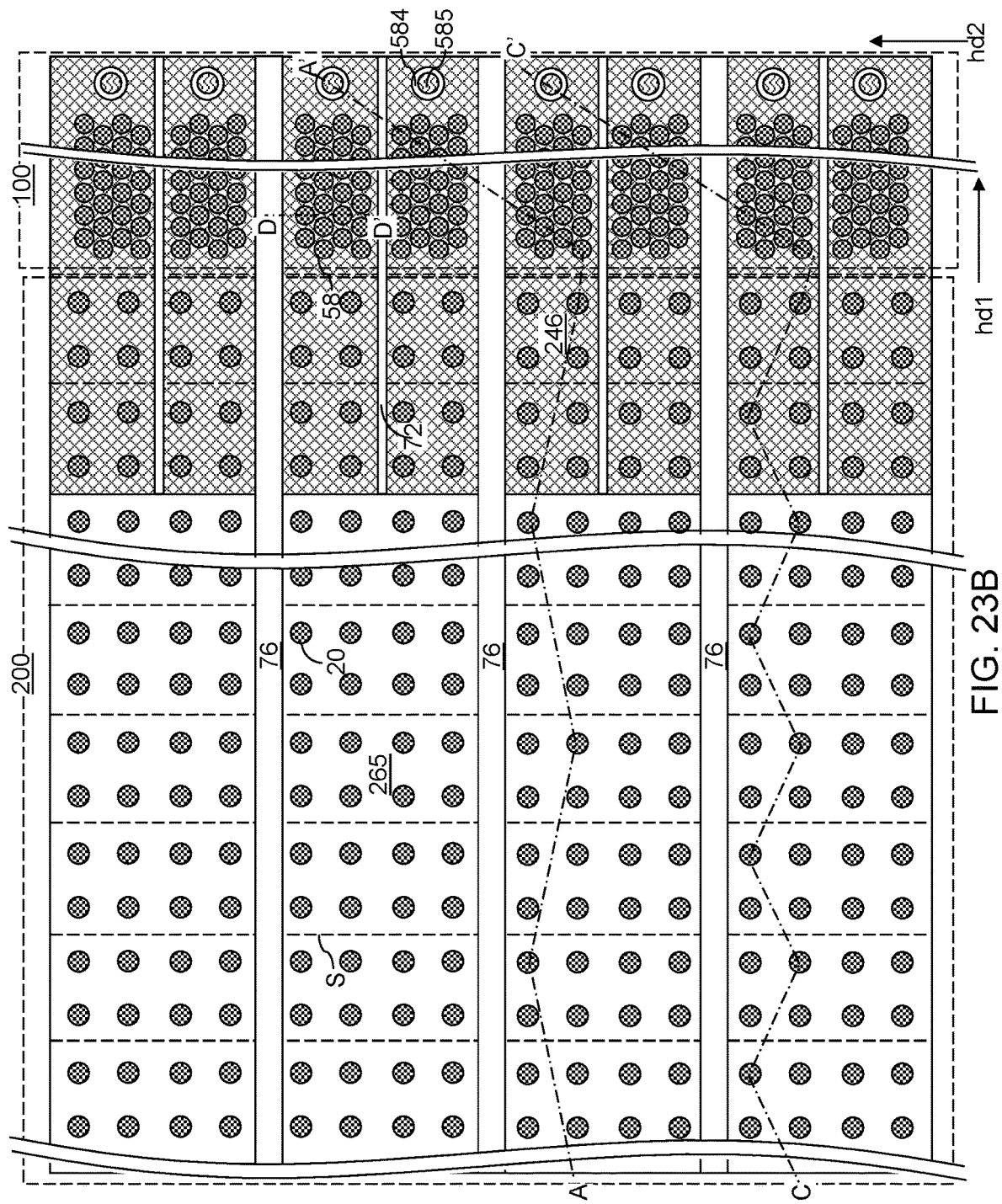
FIG. 23B is a horizontal cross-sectional of the first exemplary structure along the vertical plane B-B' of FIG. 23A. The zig-zag vertical plane A-A' corresponds to the plane of the vertical cross-sectional view of FIG. 23A.
Figure 23C:
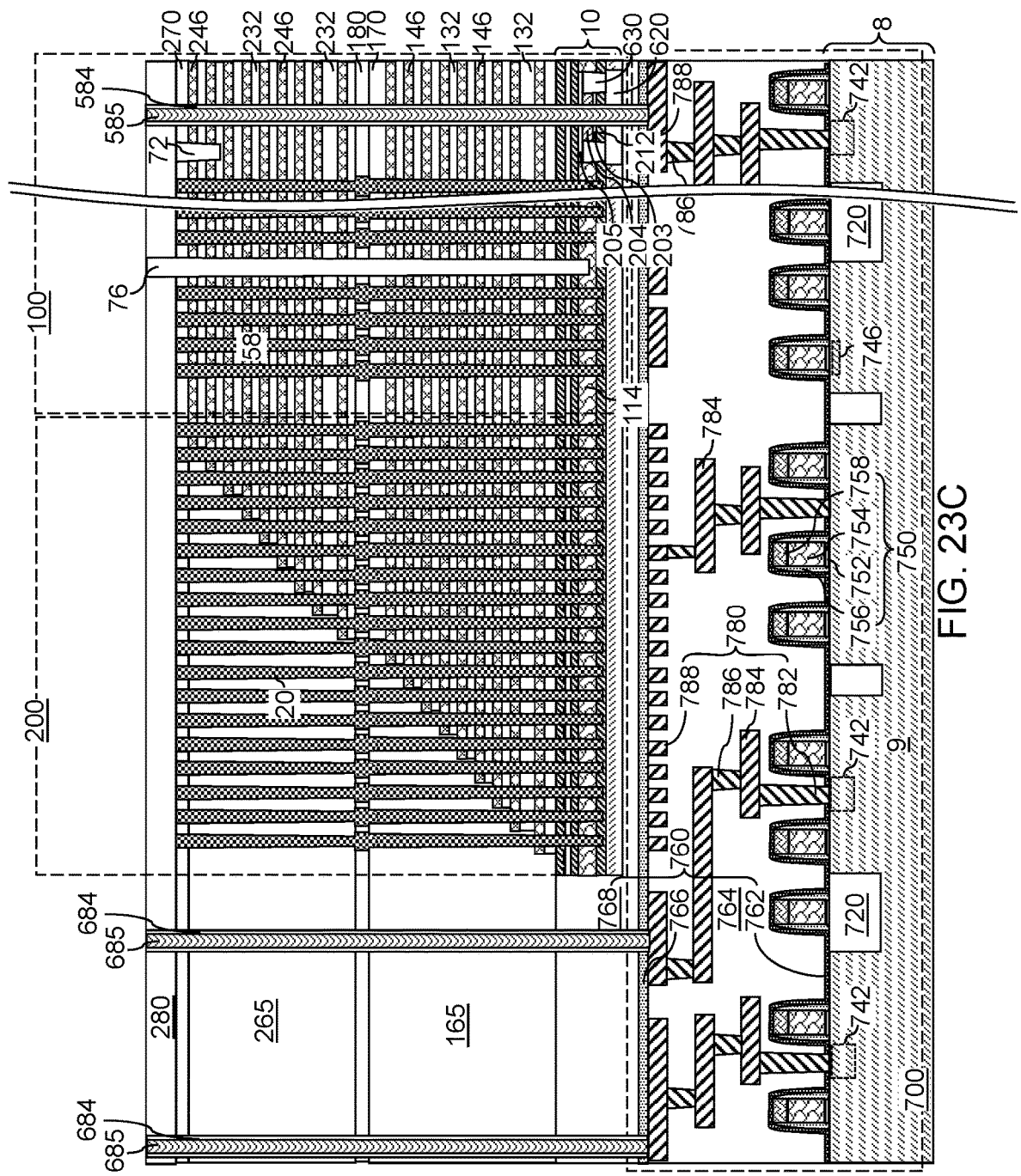
FIG. 23C is a vertical cross-sectional view of the first exemplary structure along the zig-zag vertical plane C-C' of FIG. 23B.

Referring to FIG. 22, a backside blocking dielectric layer (not shown) may be optionally deposited in the backside recesses and the backside trenches 79 and over the contact level dielectric layer 280. At least one conductive material may be deposited in the plurality of backside recesses (243, 243), on the sidewalls of the backside trench 79, and over the contact level dielectric layer 280. The at least one conductive material may include at least one metallic material, i.e., an electrically conductive material that includes at least one metallic element.

A plurality of first electrically conductive layers 146 may be formed in the plurality of first backside recesses 143, a plurality of second electrically conductive layers 246 may be formed in the plurality of second backside recesses 243, and a continuous metallic material layer (not shown) may be formed on the sidewalls of each backside trench 79 and over the contact level dielectric layer 280. Thus, the first and second sacrificial material layers (142, 242) may be replaced with the first and second conductive material layers (146, 246), respectively. Specifically, each first sacrificial material layer 142 may be replaced with an optional portion of the backside blocking dielectric layer and a first electrically conductive layer 146, and each second sacrificial material layer 242 may be replaced with an optional portion of the backside blocking dielectric layer and a second electrically conductive layer 246. A backside cavity is present in the portion of each backside trench 79 that is not filled with the continuous metallic material layer.

The metallic material may be deposited by a conformal deposition method, which may be, for example, chemical vapor deposition (CVD), atomic layer deposition (ALD), electroless plating, electroplating, or a combination thereof. The metallic material may be an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof. Non-limiting exemplary metallic materials that may be deposited in the backside recesses include tungsten, tungsten nitride, titanium, titanium nitride, tantalum, tantalum nitride, cobalt, and ruthenium. In one embodiment, the metallic material may comprise a metal such as tungsten and/or metal nitride. In one embodiment, the metallic material for filling the backside recesses may be a combination of titanium nitride layer and a tungsten fill material. In one embodiment, the metallic material may be deposited by chemical vapor deposition or atomic layer deposition.

The deposited metallic material of the continuous metallic material layer may be etched back from the sidewalls of each backside trench 79 and from above the contact level dielectric layer 280, for example, by an anisotropic or isotropic etch. Each remaining portion of the deposited metallic material in the first backside recesses constitutes a first electrically conductive layer 146. Each remaining portion of the deposited metallic material in the second backside recesses constitutes a second electrically conductive layer 246. Each electrically conductive layer (146, 246) may be a conductive line structure.

A subset of the second electrically conductive layers 246 located at the levels of the drain-select-level isolation structures 72 constitutes drain select gate electrodes. A subset of the electrically conductive layer (146, 246) located underneath the drain select gate electrodes may function as combinations of a control gate and a word line located at the same level. The control gate electrodes within each electrically conductive layer (146, 246) are the control gate electrodes for a vertical memory device including the memory stack structure 55. The source-select-level conductive layer 118 functions as a source select gate electrode.

Each of the memory stack structures 55 comprises a vertical stack of memory elements located at each level of the electrically conductive layers (146, 246). A subset of the electrically conductive layers (146, 246) may comprise word lines for the memory elements. The semiconductor devices in the underlying peripheral device region 700 may comprise word line switch devices configured to control a bias voltage to respective word lines. The memory-level assembly includes all structures located above the topmost surface of the lower-level metal interconnect structures 780, and is located over, and is vertically spaced from, the substrate semiconductor layer 9. The memory-level assembly includes at least one alternating stack (132, 146, 232, 246) and memory stack structures 55 vertically extending through the at least one alternating stack (132, 146, 232, 246). Each of the at least one an alternating stack (132, 146, 232, 246) includes alternating layers of respective insulating layers (132 or 232) and respective electrically conductive layers (146 or 246). The at least one alternating stack (132, 146, 232, 246) comprises staircase regions that include terraces in which each underlying electrically conductive layer (146, 246) extends farther along the first horizontal direction hd1 than any overlying electrically conductive layer (146, 246) in the memory-level assembly.

Referring to FIGS. 23A-23D, an insulating material may be deposited in the backside trenches 79 by a conformal deposition process. Excess portions of the insulating material deposited over the top surface of the contact level dielectric layer 280 may be removed by a planarization process such as a recess etch or a chemical mechanical planarization (CMP) process. Each remaining portion of the insulating material in the backside trenches 79 constitutes a dielectric wall structure 76. The dielectric wall structures 76 include an insulating material such as silicon oxide, silicon nitride, and/or a dielectric metal oxide. Each dielectric wall structure 76 may vertically extend through first alternating stacks (132, 146) of first insulating layers 132 and first electrically conductive layers 146 and second alternating stacks (232, 246) of second insulating layers 232 and second electrically conductive layers 246, and laterally extends along the first horizontal direction hd1 and are laterally spaced apart from one another along the second horizontal direction hd2.

Figure 24:
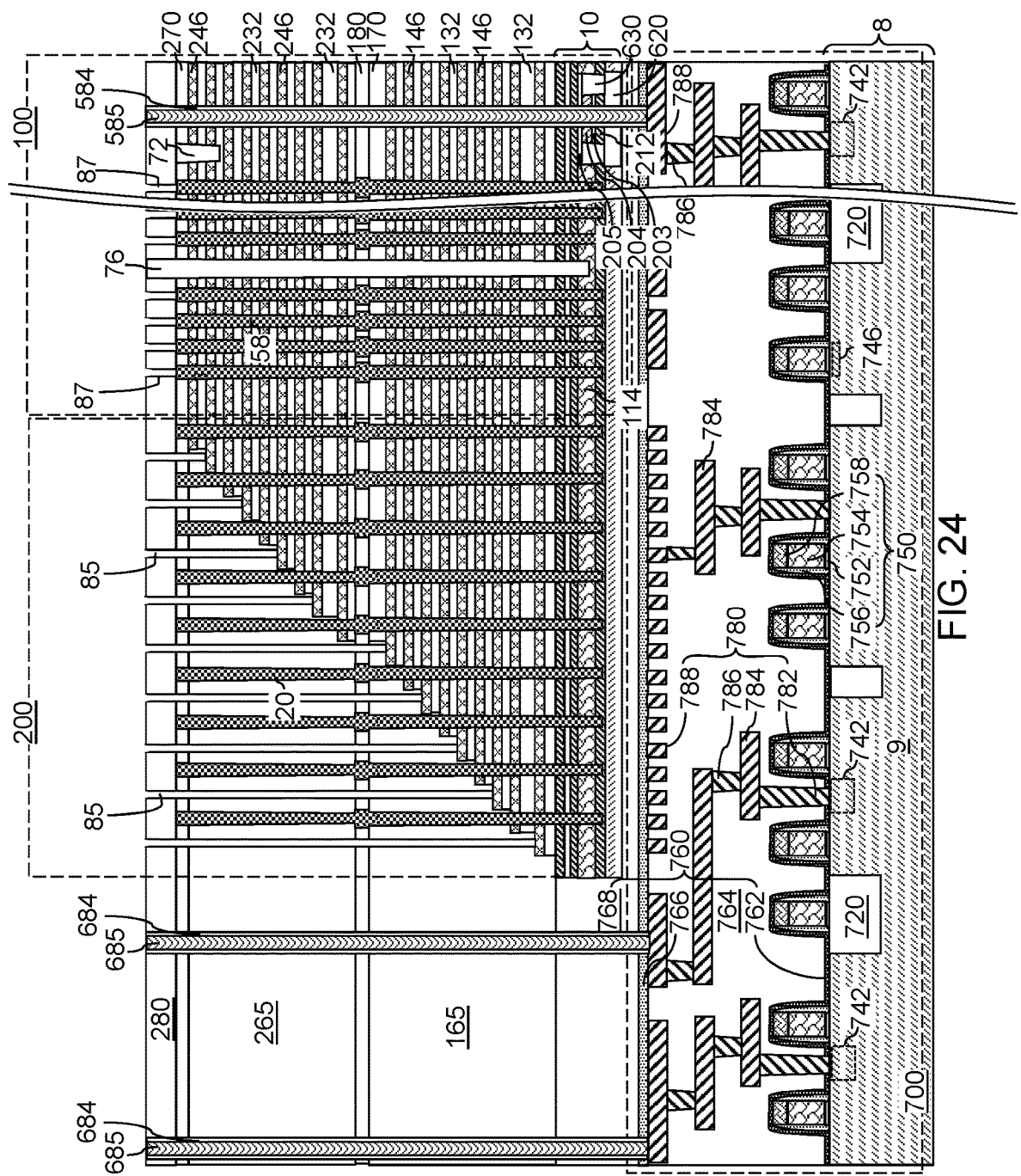
FIG. 24 is a vertical cross-sectional view of the first exemplary structure after formation of drain contact via cavities and staircase-region contact via cavities according to the first embodiment of the present disclosure.

Referring to FIG. 24, a photoresist layer (not shown) may be applied over the contact level dielectric layer 280, and may be lithographically patterned to form various contact via openings. For example, openings for forming drain contact via structures may be formed in the memory array region 100, and openings for forming staircase region contact via structures may be formed in the staircase region 200. An anisotropic etch process is performed to transfer the pattern in the photoresist layer through the second and contact level dielectric layers 280 and underlying dielectric material portions. The drain regions 63 and the electrically conductive layers (146, 246) may be used as etch stop structures. Drain contact via cavities 87 may be formed over each drain region 63, and staircase-region contact via cavities 85 may be formed over each electrically conductive layer (146, 246) at the stepped surfaces underlying the first and second retro-stepped dielectric material portions (165, 265). The photoresist layer may be subsequently removed, for example, by ashing.

Figure 25:
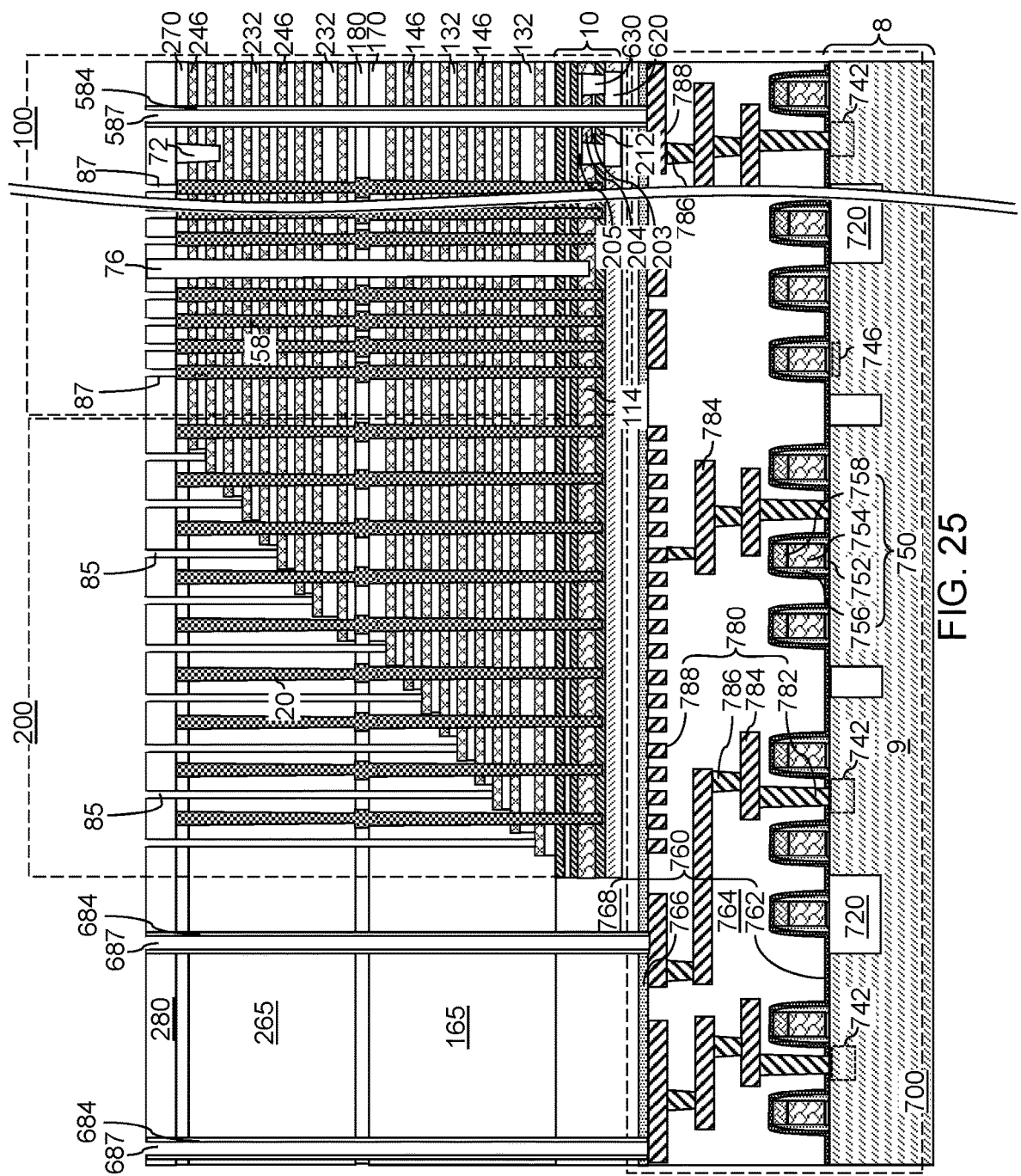
FIG. 25 is a vertical cross-sectional view of the first exemplary structure after formation of via cavities by removal of sacrificial via fill structures according to the first embodiment of the present disclosure.

Referring to FIG. 25, the sacrificial via fill structures (585, 685) may be removed selective to the materials of the contact level dielectric layer 280, the dielectric spacers (584, 684), and the landing-pad-level metal line structures 788. Through-memory-level via cavities (587, 687), i.e., voids, may be formed in the volumes from which the sacrificial via fill structures (585, 685) are removed.

Figure 26A:
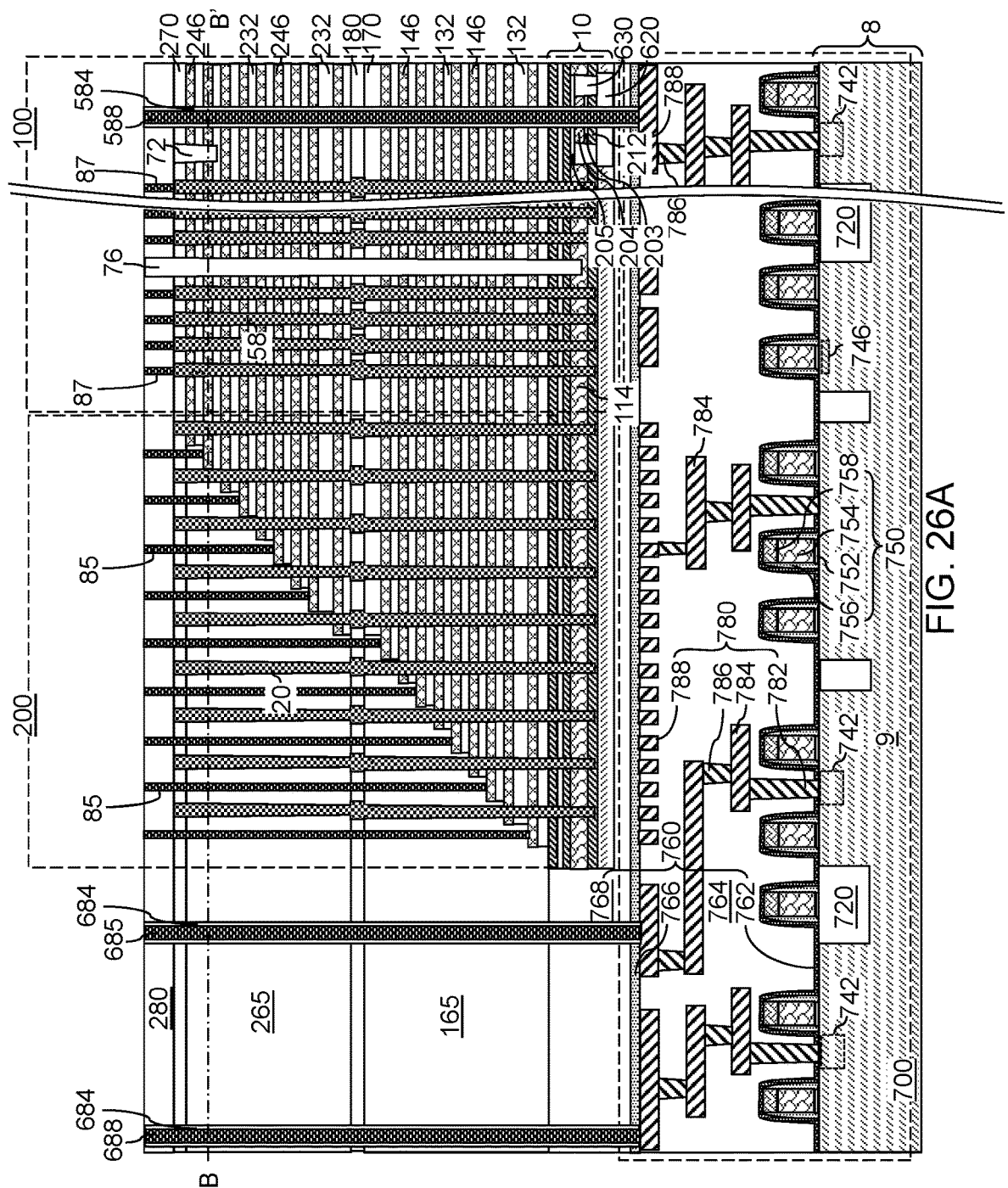
FIG. 26A is a vertical cross-sectional view of the first exemplary structure after formation of drain contact via structures, staircase-region contact via structures, and through-memory-level contact via structure according to the first embodiment of the present disclosure.
Figure 26B:
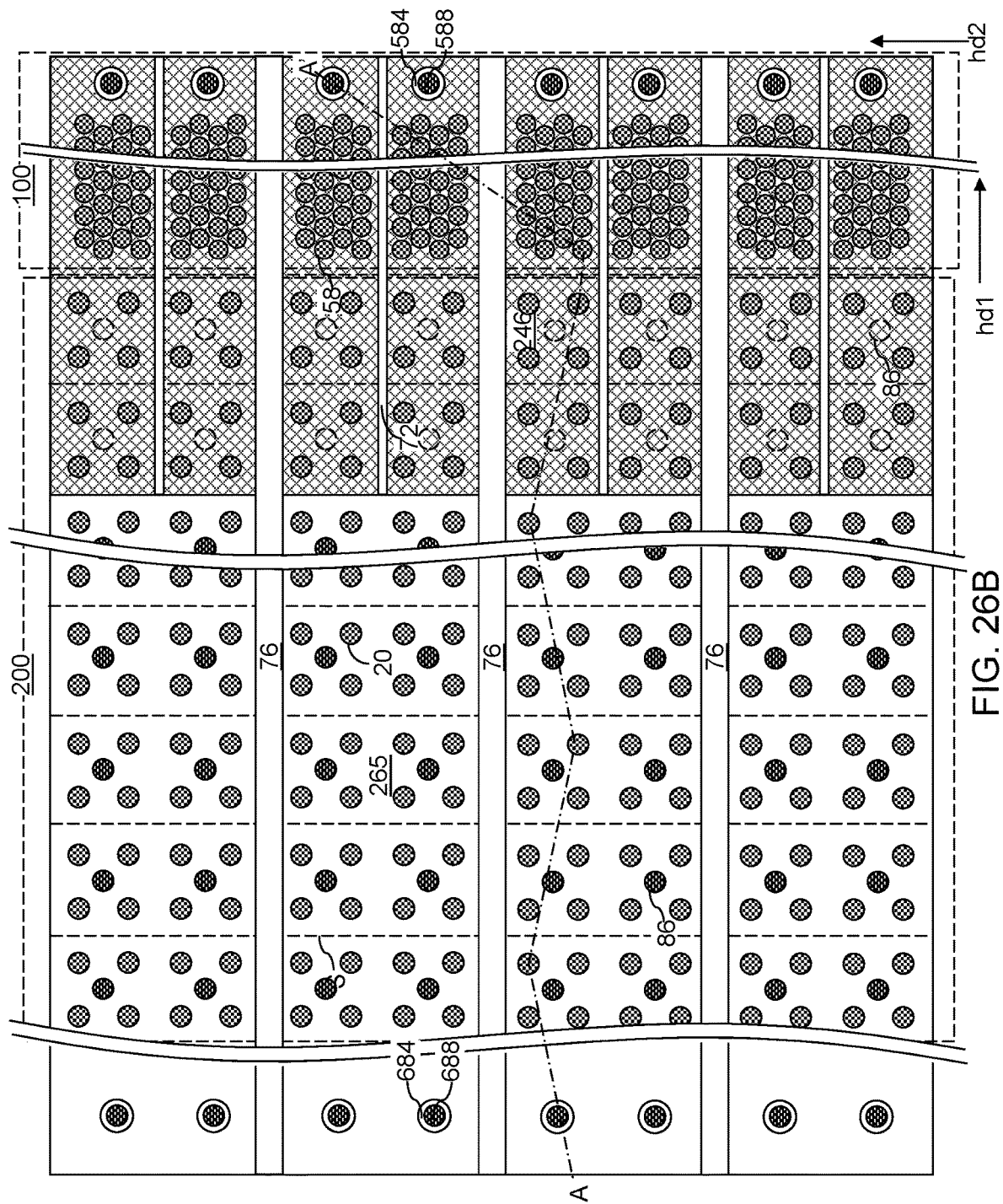
FIG. 26B is a horizontal cross-sectional view of the first exemplary structure of FIG. 26A. The zig-zag vertical plane A-A' corresponds to the plane of the vertical cross-sectional view of FIG. 26A.

Referring to FIGS. 26A and 26B, at least one conductive material may be deposited in the through-memory-level via cavities (587, 687), the staircase-region contact via cavities 85, and the drain contact via cavities 87. The at least one conductive material may include at least one metallic material. Excess portions of the at least one conductive material may be removed from above the horizontal plane including the top surface of the contact level dielectric layer 280 by a planarization process. The planarization process may use a recess etch process and/or a chemical mechanical planarization process. Remaining portions of the at least one conductive material in the drain contact via cavities 87 constitute drain contact via structures 58. Remaining portions of the at least one conductive material in the staircase-region contact via cavities 85 constitute staircase-region contact via structures 86. Remaining portions of the at least one conductive material in the through-memory-level via cavities (587, 687) constitute through-memory-level contact via structures (588, 688). The through-memory-level contact via structures (588, 688) include first through-memory-level contact via structures 588 that are formed within a respective one of the first dielectric spacers 584 in the memory array region 100, and second through-memory-level contact via structures 688 that are formed within a respective one of the second dielectric spacers 684.

Figure 27A:
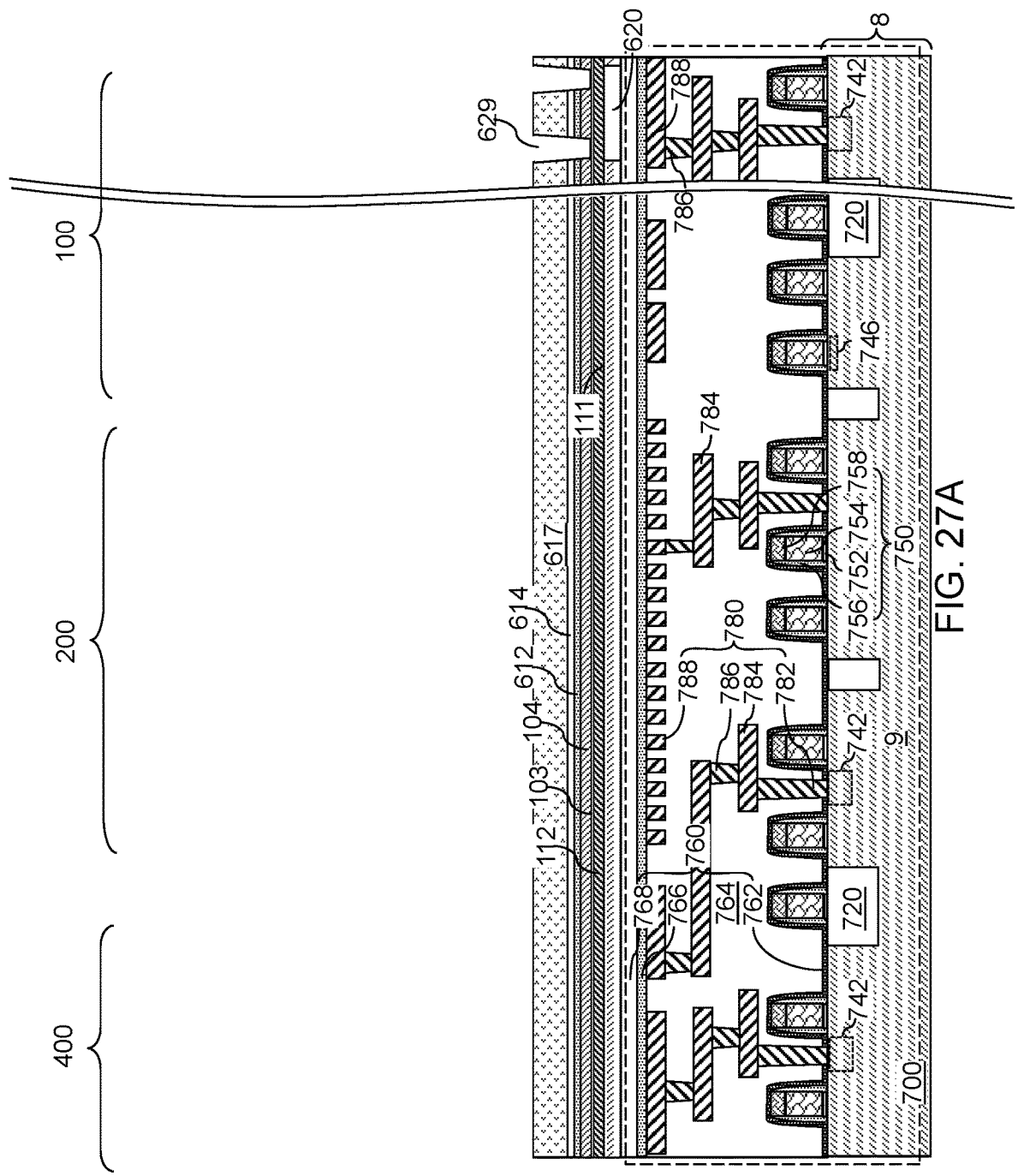
FIG. 27A is a vertical cross-sectional view of a second exemplary structure after formation of a lower source-level material layer, a lower dielectric liner layer, a source-level sacrificial layer, a first hard mask layer, a second hard mask layer, a photoresist layer, and annular trenches according to a second embodiment of the present disclosure.
Figure 27B:
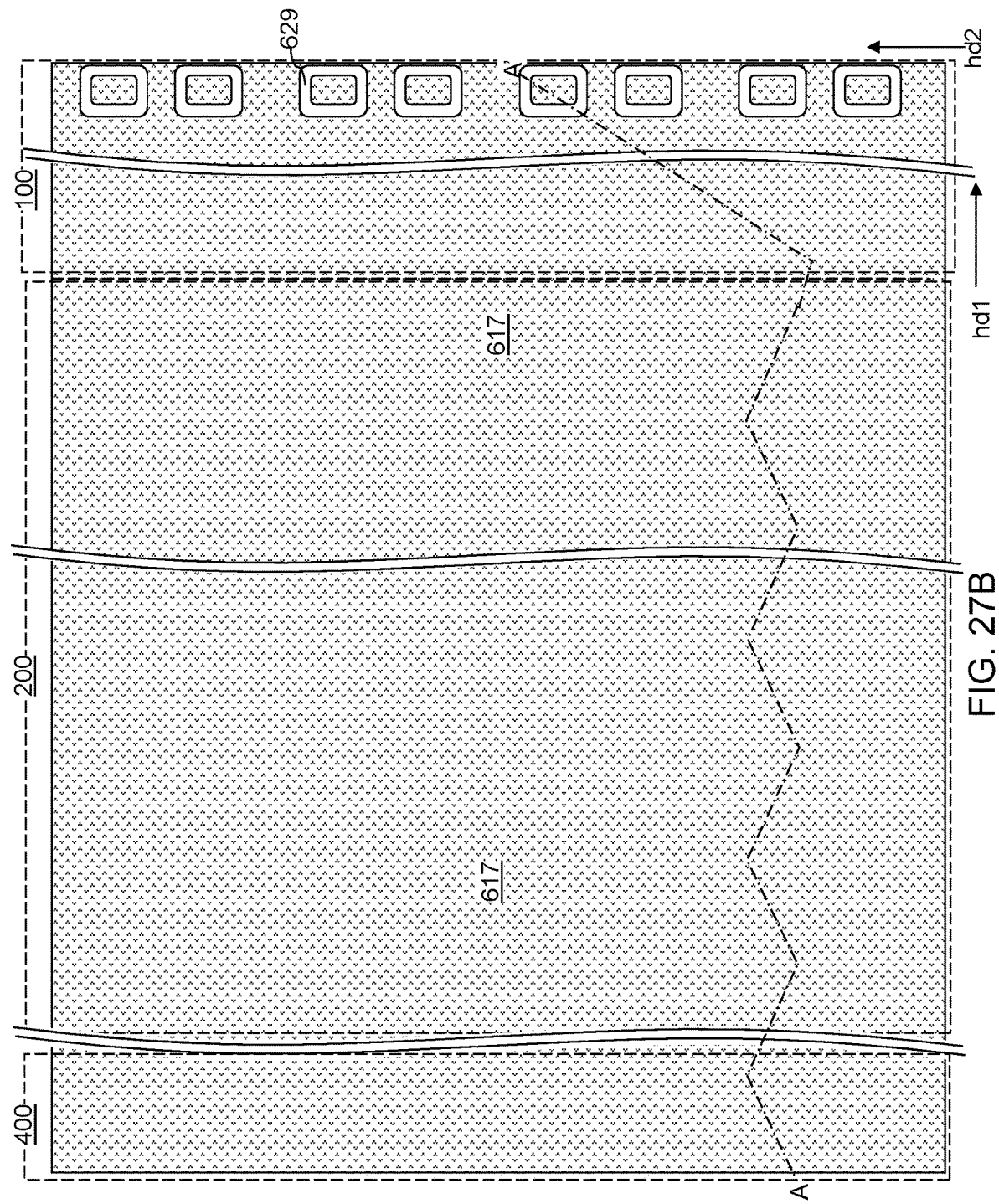
FIG. 27B is a top-down view of the first exemplary structure of FIG. 27A. The zig-zag vertical plane A-A' is the plane of the vertical cross-sectional view of FIG. 27A.

Referring to FIGS. 27A and 27B, a second exemplary structure according to a second embodiment of the present disclosure may be derived from the first exemplary structure of FIGS. 2A and 2B by reducing the depth of the annular trenches 629. Specifically, the chemistry of the steps of the anisotropic etch process may be selected such that the second hard mask layer 614, the first hard mask layer 612, and the source-level sacrificial layer 104 are sequentially etched. The chemistry of the step for etching the source-level sacrificial layer 104 may be selective to the material of the lower dielectric liner layer 103. Thus, an annular top surface of the lower dielectric liner layer 103 may be physically exposed at the bottom of each annular trench 629.

Figure 28B:
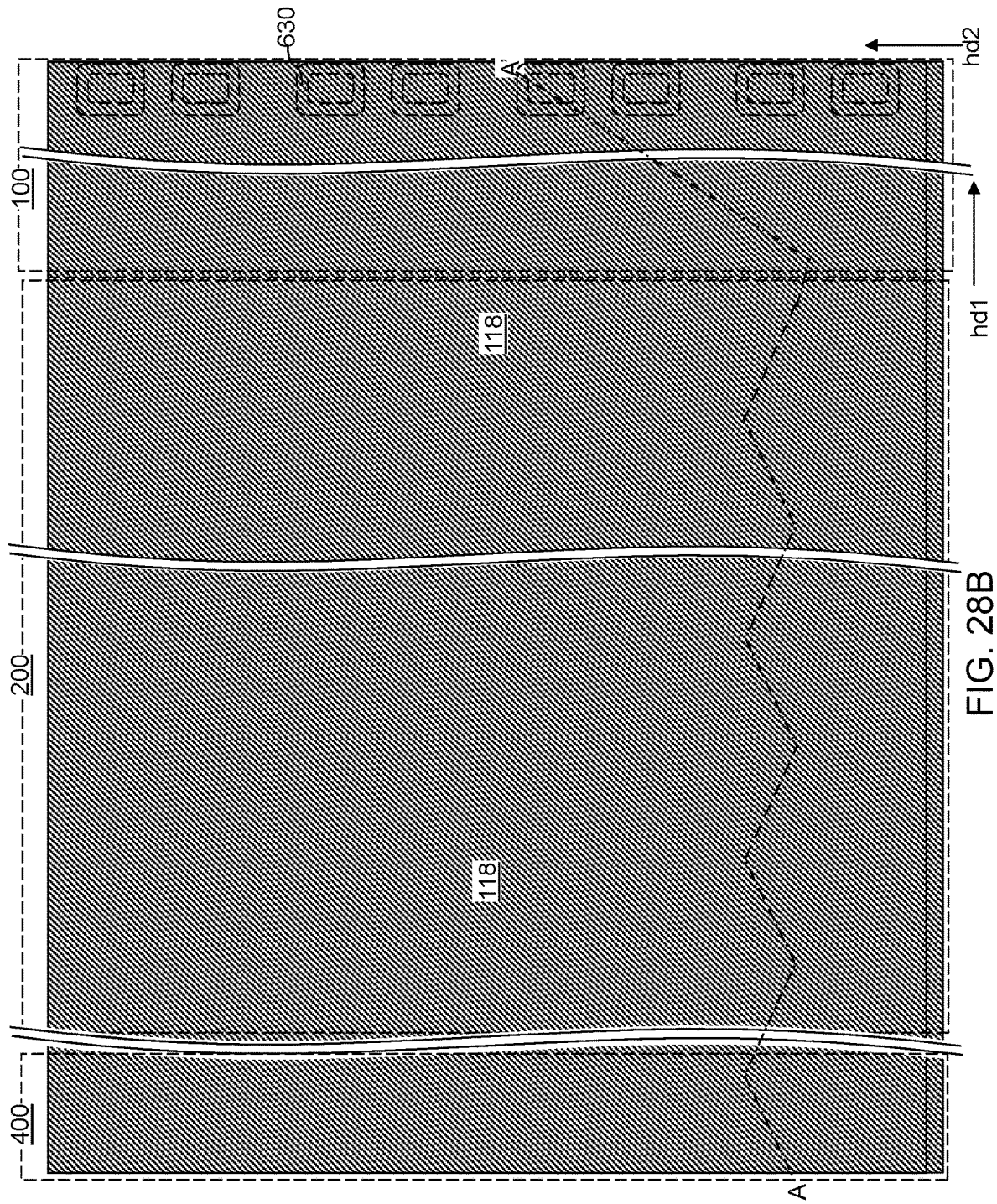
FIG. 28B is a top-down view of the first exemplary structure of FIG. 28A. The zig-zag vertical plane A-A' is the plane of the vertical cross-sectional view of FIG. 28A.

Referring to FIGS. 28A and 28B, the processing steps illustrated and described above with reference to FIGS. 3A-3C may be performed to form an annular dielectric isolation structure 630 within each annular trench 629. A layer stack including an upper dielectric liner layer 105, an upper source-level material layer 116, a source-level insulating layer 117, and an optional source-select-level conductive layer 118 may be sequentially deposited in the same manner as in the first embodiment.

Figure 29:
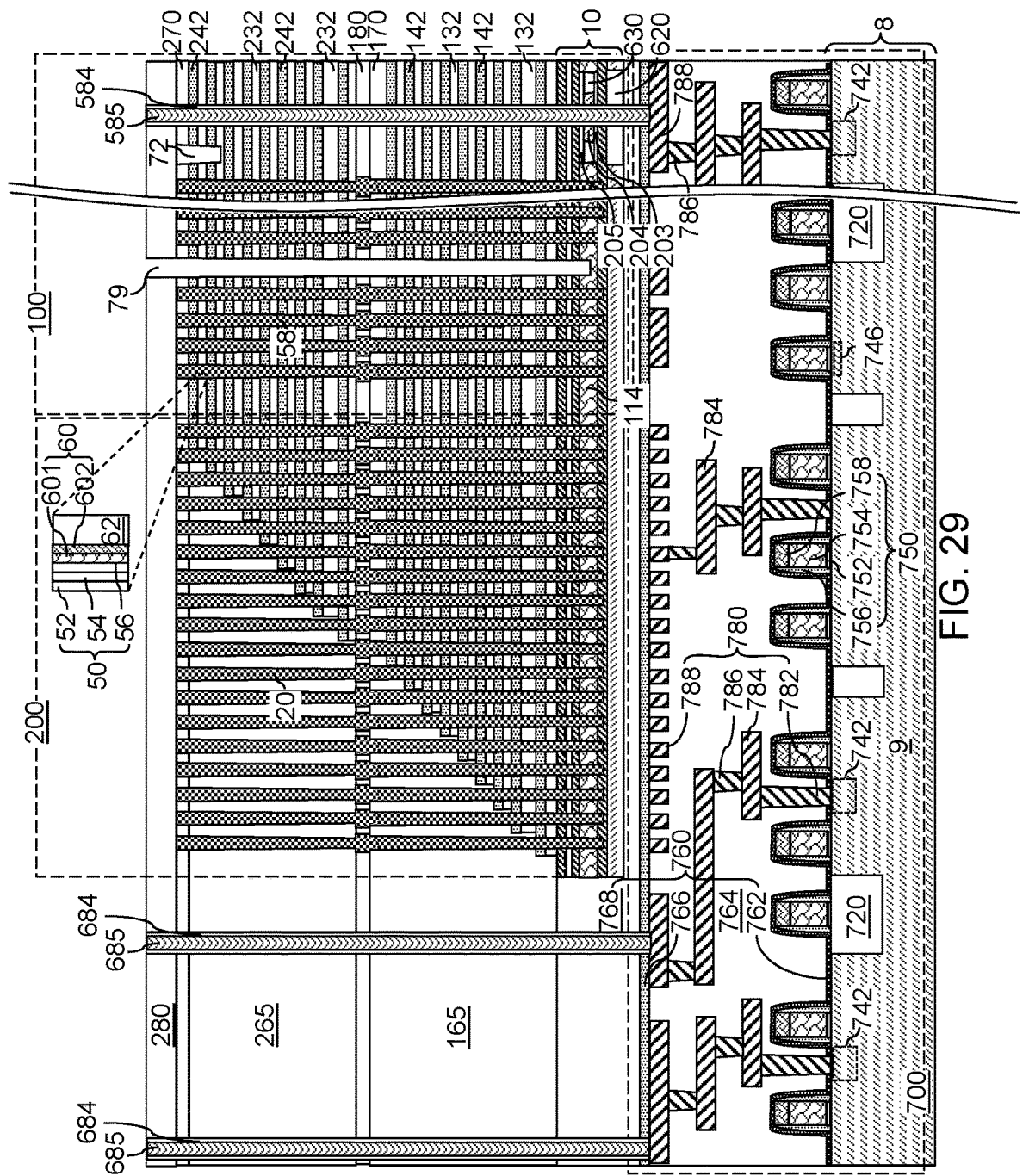
FIG. 29 is a vertical cross-sectional view of the second exemplary structure after the processing steps of FIG. 20 according to the second embodiment of the present disclosure.

Referring to FIG. 29, the processing steps of FIGS. 4A-20 may be subsequently performed. Dielectric spacer assemblies (205, 630, 203) may be formed around each first sacrificial via fill structure 585. Each dielectric spacer assembly (205, 630, 203) includes a set of dielectric material portions that limits expansion of the extent of the source cavity 109, thereby preventing electrical shorts around the region of the first sacrificial via fill structures 585. Each dielectric spacer assembly (205, 630, 203) includes an upper dielectric liner 205, an annular dielectric isolation structure 630, and a lower dielectric liner 203. A source-level semiconductor plate 204 is formed within each dielectric spacer assembly (205, 630, 203).

Figure 30:
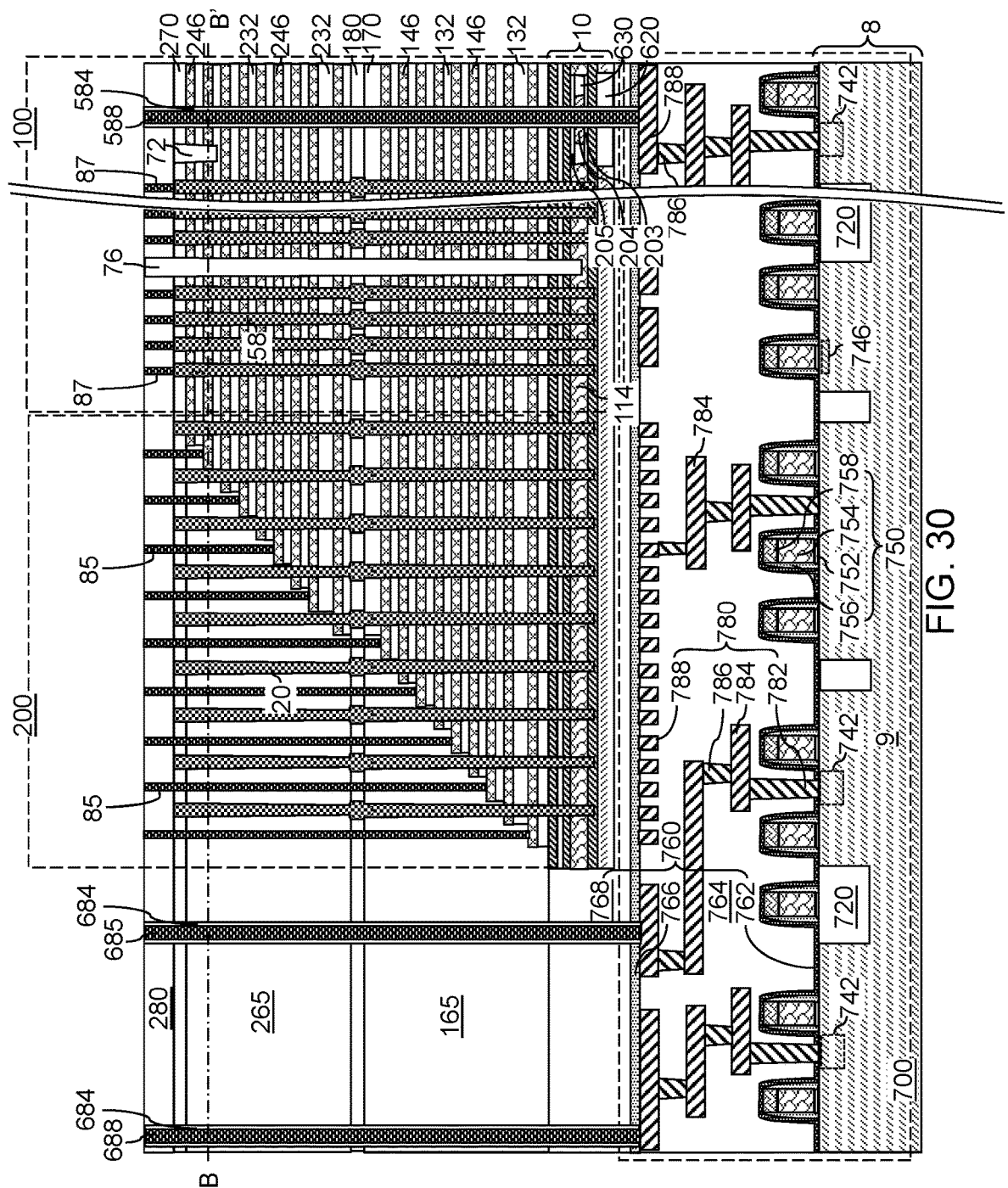
FIG. 30 is a vertical cross-sectional view of the second exemplary structure after the processing steps of FIGS. 26A and 26B according to the second embodiment of the present disclosure.

Referring to FIG. 30, the processing steps of FIGS. 21-26B may be performed as in the first embodiment.

The various embodiments disclosed herein provide a method of manufacture that prevents a short circuit between the source-select-level conductive layer 118 and a source contact layer that may be subsequently formed in the source cavity 109. Referring to all drawings and according to various embodiments of the present disclosure, a three-dimensional memory device is provided, which comprises: source-level material layers (111, 112,114, 116, 117, 118) located over a substrate 8 and comprising a lower source-level material layer 112, an upper source-level material layer 116, and a source contact layer 114 located therebetween; an alternating stack of insulating layers (132, 232) and electrically conductive layers (146, 246) located over the source-level material layers (111, 112,114, 116, 117, 118); a memory stack structure 55 extending through the alternating stack {(132, 146), (232, 246)} and comprising a memory film 50 and a vertical semiconductor channel 60, wherein a sidewall of the vertical semiconductor channel 60 contacts the source contact layer 114; and a through-memory-level contact via structure 588 vertically extending through the alternating stack {(132, 146), (232, 246)} and the source-level material layers (111, 112,114, 116, 117, 118) and is laterally surrounded by a dielectric spacer 584; wherein the upper source-level material layer 116 contacts the dielectric spacer 584, and the source contact layer 114 is laterally spaced apart from, and does not contact, the dielectric spacer 584.

In one embodiment, the three-dimensional memory device comprises an annular dielectric isolation structure 630 located within an opening in the source contact layer 114 and between the upper source-level material layer 116 and the lower source-level material layer 112, and laterally surrounding the dielectric spacer 584.

In one embodiment, the three-dimensional memory device comprises a dielectric material block 620 contacting a portion of a bottom surface of the lower source-level material layer 112, wherein the through-memory-level contact via structure 588 and the dielectric spacer 584 vertically extend through am opening through the dielectric material block 620.

In one embodiment, the three-dimensional memory device comprises an upper annular dielectric liner 205 contacting a top surface of the annular dielectric isolation structure 630 and including an opening that contacts a periphery of an outer sidewall of the dielectric spacer 584.

In one embodiment, the three-dimensional memory device comprises a source-level semiconductor plate 204 laterally surrounding the dielectric liner 584, contacting a bottom surface of the upper annular dielectric liner 205, and overlying the dielectric material block 620.

In one embodiment, an annular bottom surface of the annular dielectric isolation structure 630 contacts a top surface of the dielectric material block 620 as illustrated in the first exemplary structure. In one embodiment, the three-dimensional memory device comprises a doped semiconductor plate located between the lower annular dielectric liner 203 and the dielectric material block 620, laterally surrounding the through-memory-level contact via structure and the dielectric spacer, and laterally surrounded by the annular dielectric isolation structure. In one embodiment, the three-dimensional memory device comprises a lower annular dielectric liner 203 contacting an inner sidewall of the annular dielectric isolation structure 630, including an opening through which the through-memory-level contact via structure 588 and the dielectric spacer 584 vertically extend, and overlying, and vertically spaced from, the dielectric material block 620. In one embodiment, the three-dimensional memory device comprises a doped semiconductor plate 212 located between the lower annular dielectric liner 203 and the dielectric material block 620, laterally surrounding the through-memory-level contact via structure 588 and the dielectric spacer 584, and laterally surrounded by the annular dielectric isolation structure 630.

In one embodiment, an annular bottom surface of the annular dielectric isolation structure 630 is located above, and is vertically spaced from, a top surface of the dielectric material block 620 as illustrated in the second exemplary structure. In one embodiment, the three-dimensional memory device comprises a lower annular dielectric liner 203 contacting a bottom surface of the annular dielectric isolation structure 630, including an opening through which the through-memory-level contact via structure 588 and the dielectric spacer 584 vertically extend, and overlying, and vertically spaced from, the dielectric material block 620. In one embodiment, the lower source-level material layer 112 contacts a bottom surface of the lower annular dielectric liner 203 and a top surface of the dielectric material block 620.

In one embodiment, the dielectric material block 620 is formed within a doped semiconductor material underlayer 111 that laterally surrounds, and contacts, the dielectric material block 620.

In one embodiment, the source-level material layers (111, 112,114, 116, 117, 118) comprise doped semiconductor layers (such as the buried source layer (112, 114, 116); the source contact layer 114 contacts the sidewall of the vertical semiconductor channel 60; the three-dimensional memory device comprises a NAND memory device; and the electrically conductive layers (146, 246) comprise word lines of the NAND memory device.

In one embodiment, the source contact layer 114 is spaced apart from the dielectric spacer 584 by a dielectric spacer assembly {(205, 630, 620, 203) or (205, 630, 203)}. The dielectric spacer assembly {(205, 630, 620, 203) or (205, 630, 203)} comprises: a lower annular dielectric liner 203 contacting a surface of the lower source-level material layer 112; an upper annular dielectric liner 205 contacting a bottom surface of the upper source-level material layer 116; the annular dielectric isolation structure 630 contacting the lower annular dielectric liner 203 and the upper dielectric liner 205.

In one embodiment, the three-dimensional memory device comprises a monolithic three-dimensional NAND memory device; the electrically conductive layers (146, 246) comprise, or are electrically connected to, a respective word line of the monolithic three-dimensional NAND memory device; the substrate 8 comprises a silicon substrate; the monolithic three-dimensional NAND memory device comprises an array of monolithic three-dimensional NAND strings over the silicon substrate; and at least one memory cell in a first device level of the array of monolithic three-dimensional NAND strings is located over another memory cell in a second device level of the array of monolithic three-dimensional NAND strings. The silicon substrate contains an integrated circuit comprising a driver circuit for the memory device located thereon; the electrically conductive layers (146, 246) comprise a plurality of control gate electrodes having a strip shape extending substantially parallel to the top surface of the substrate 8; and the array of monolithic three-dimensional NAND strings comprises the vertical semiconductor channels 60 and a plurality of charge storage elements (comprise portions of the charge storage layers 54 that are located at levels of the electrically conductive layers (146, 246)), each charge storage element located adjacent to a respective one of the vertical semiconductor channels 60.

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment using a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device, comprising:
    source-level material layers located over a substrate and comprising a lower source-level material layer, an upper source-level material layer and a source contact layer located therebetween;
    an alternating stack of insulating layers and electrically conductive layers located over the source-level material layers;
    a memory stack structure extending through the alternating stack and comprising a memory film and a vertical semiconductor channel, wherein a sidewall of the vertical semiconductor channel contacts the source contact layer; and
    a through-memory-level contact via structure vertically extending through the alternating stack and the source-level material layers and is laterally surrounded by a dielectric spacer;
    wherein the upper source-level material layer contacts the dielectric spacer, and the source contact layer is laterally spaced apart from, and does not contact, the dielectric spacer.

2. The three-dimensional memory device of claim 1, further comprising an annular dielectric isolation structure located within an opening in the source contact layer and between the upper source-level material layer and the lower source-level material layer, and laterally surrounding the dielectric spacer.

3. The three-dimensional memory device of claim 2, further comprising a dielectric material block contacting a portion of a bottom surface of the lower source-level material layer, wherein the through-memory-level contact via structure and the dielectric spacer vertically extend through an opening through the dielectric material block.

4. The three-dimensional memory device of claim 3, further comprising an upper annular dielectric liner contacting a top surface of the annular dielectric isolation structure and including an opening that contacts a periphery of an outer sidewall of the dielectric spacer.

5. The three-dimensional memory device of claim 4, further comprising a source-level semiconductor plate laterally surrounding the upper annular dielectric liner, contacting a bottom surface of the upper annular dielectric liner, and overlying the dielectric material block.

6. The three-dimensional memory device of claim 4, wherein an annular bottom surface of the annular dielectric isolation structure contacts a top surface of the dielectric material block.

7. The three-dimensional memory device of claim 6, further comprising a lower annular dielectric liner contacting an inner sidewall of the annular dielectric isolation structure, including an opening through which the through-memory-level contact via structure and the dielectric spacer vertically extend, and overlying, and vertically spaced from, the dielectric material block.

8. The three-dimensional memory device of claim 7, further comprising a doped semiconductor plate located between the lower annular dielectric liner and the dielectric material block, laterally surrounding the through-memory-level contact via structure and the dielectric spacer, and laterally surrounded by the annular dielectric isolation structure.

9. The three-dimensional memory device of claim 4, wherein an annular bottom surface of the annular dielectric isolation structure is located above, and is vertically spaced from, a top surface of the dielectric material block.

10. The three-dimensional memory device of claim 9, further comprising a lower annular dielectric liner contacting a bottom surface of the annular dielectric isolation structure, including an opening through which the through-memory-level contact via structure and the dielectric spacer vertically extend, and overlying, and vertically spaced from, the dielectric material block.

11. The three-dimensional memory device of claim 10, wherein the lower source-level material layer contacts a bottom surface of the lower annular dielectric liner and a top surface of the dielectric material block.

12. The three-dimensional memory device of claim 3, wherein the dielectric material block is formed within a doped semiconductor material underlayer that laterally surrounds, and contacts, the dielectric material block.

13. The three-dimensional memory device of claim 2, wherein:
    the source contact layer is spaced apart from the dielectric spacer by a dielectric spacer assembly; and
    the dielectric spacer assembly comprises:
    a lower annular dielectric liner contacting a surface of the lower source-level material layer;
    an upper annular dielectric liner contacting a bottom surface of the upper source-level material layer; and
    the annular dielectric isolation structure contacting the lower annular dielectric liner and the upper dielectric liner.

14. The three-dimensional memory device of claim 1, wherein:
    the source-level material layers comprise doped semiconductor layers;
    the source contact layer contacts the sidewall of the vertical semiconductor channel;
    the three-dimensional memory device comprises a NAND memory device; and
    the electrically conductive layers comprise word lines of the NAND memory device.

* * * * *